(12) United States Patent
Takahashi et al.

(10) Patent No.: US 9,119,305 B2
(45) Date of Patent: *Aug. 25, 2015

(54) TRANSPARENT CONDUCTIVE ELEMENT, INPUT DEVICE, ELECTRONIC DEVICE, AND MASTER FOR FABRICATION OF TRANSPARENT CONDUCTIVE ELEMENT

(71) Applicant: DEXERIALS CORPORATION, Tokyo (JP)

(72) Inventors: Hidetoshi Takahashi, Tokyo (JP); Mikihisa Mizuno, Tokyo (JP); Masayuki Ishiwata, Tokyo (JP)

(73) Assignee: DEXERIALS CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/257,436

(22) Filed: Apr. 21, 2014

(65) Prior Publication Data

US 2014/0285737 A1    Sep. 25, 2014

Related U.S. Application Data

(63) Continuation of application No. 13/876,243, filed as application No. PCT/JP2011/066293 on Jul. 12, 2011, now Pat. No. 8,741,424.

(30) Foreign Application Priority Data

Feb. 7, 2011    (JP) .................................. 2011-024467

(51) Int. Cl.
*B32B 3/00* (2006.01)
*H05K 1/02* (2006.01)

(Continued)

(52) U.S. Cl.
CPC ............ *H05K 1/0296* (2013.01); *B29C 59/002* (2013.01); *G02F 1/13338* (2013.01);
(Continued)

(58) Field of Classification Search
CPC ..... G06F 3/041; G06F 3/416; G06F 1/13338; Y10T 428/24802; Y10T 428/4851; Y10T 428/24917
See application file for complete search history.

(56) References Cited

U.S. PATENT DOCUMENTS

| 2004/0188150 A1 | 9/2004 | Richard et al. |
| 2008/0138589 A1 | 6/2008 | Wakabayashi et al. |
| 2009/0219258 A1 | 9/2009 | Geaghan et al. |

FOREIGN PATENT DOCUMENTS

| EP | 1 892 609 | 2/2008 |
| JP | A 2008-98169 | 4/2008 |

(Continued)

OTHER PUBLICATIONS

May 16, 2014 Office Action issued in European Patent Application No. 11 858 427.5.
Aug. 9, 2011 Search Report issued in International Patent Application No. PCT/JP2011/066293 (with translation).
Aug. 13, 2013 International Preliminary Report on Patentability issued in International Patent Application No. PCT/JP2011/066293 (with translation).
Sep. 19, 2013 Search Report issued in European Patent Application No. 11858427.5.

*Primary Examiner* — Elizabeth Mulvaney
(74) *Attorney, Agent, or Firm* — Oliff PLC

(57) ABSTRACT

A transparent conductive element includes a base having a first surface and a second surface, and a transparent electrode pattern part and a transparent insulating pattern part formed on at least one of the first surface and the second surface. The transparent electrode pattern part and the transparent insulating pattern part are laid alternately on a base surface. Plural pore portions are randomly formed apart in the transparent electrode pattern part and plural island portions are randomly formed apart in the transparent insulating pattern part.

28 Claims, 48 Drawing Sheets

(51) Int. Cl.
B29C 59/00 (2006.01)
H01B 7/02 (2006.01)
G06F 3/044 (2006.01)
G02F 1/1333 (2006.01)
H03K 17/96 (2006.01)
G06F 3/041 (2006.01)

(52) U.S. Cl.
CPC .............. *G06F3/044* (2013.01); *G06F 3/0412* (2013.01); *H01B 7/02* (2013.01); *H03K 17/962* (2013.01); *G06F 2203/04103* (2013.01); *G06F 2203/04111* (2013.01); *Y10T 428/24802* (2015.01); *Y10T 428/24851* (2015.01); *Y10T 428/24893* (2015.01); *Y10T 428/24909* (2015.01); *Y10T 428/24917* (2015.01)

(56) References Cited

FOREIGN PATENT DOCUMENTS

| | | |
|---|---|---|
| JP | A 2008-310550 | 12/2008 |
| JP | A 2010-15861 | 1/2010 |
| JP | A 2010-23282 | 2/2010 |
| JP | A 2010-27294 | 2/2010 |
| JP | A 2010-253813 | 11/2010 |
| WO | WO 2006/126604 A1 | 11/2006 |
| WO | WO 2010/099132 A2 | 9/2010 |

FIG. 3
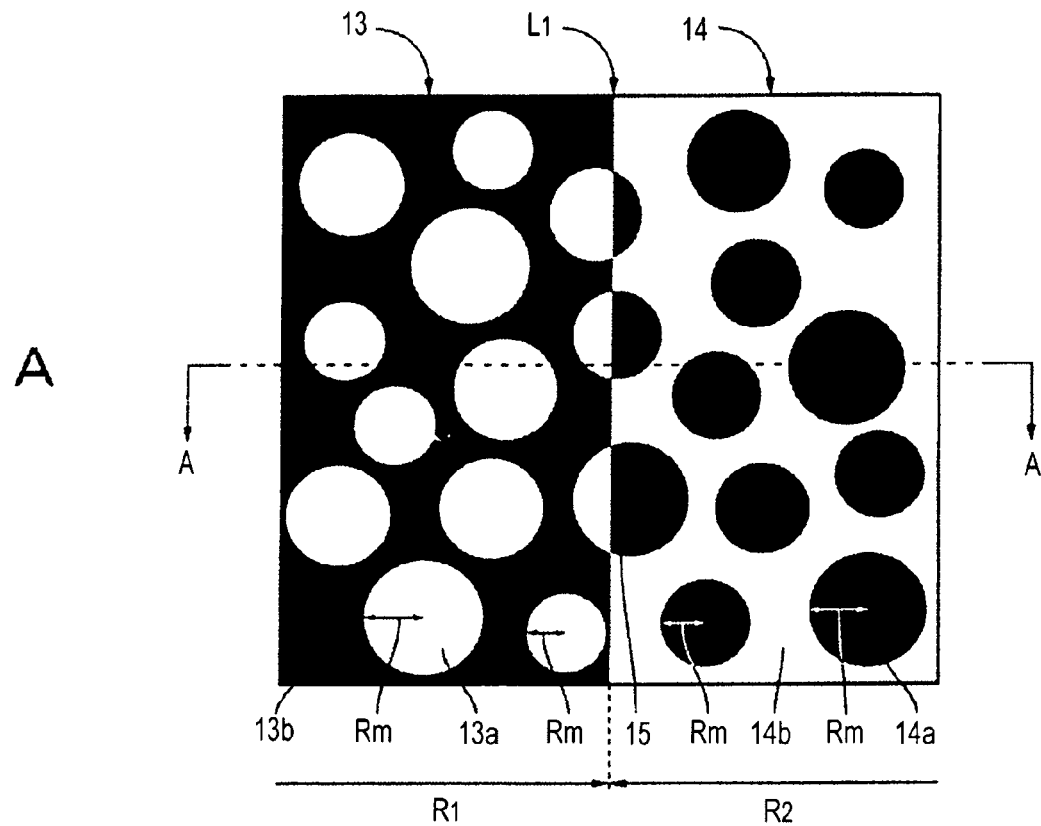
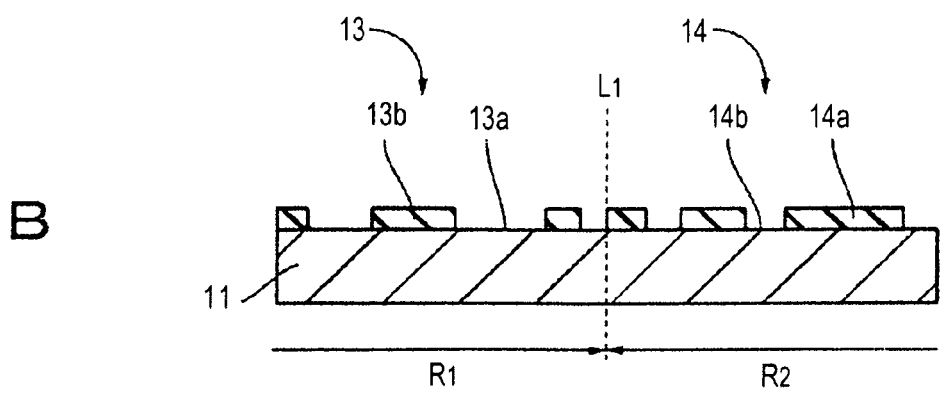

FIG. 5
A 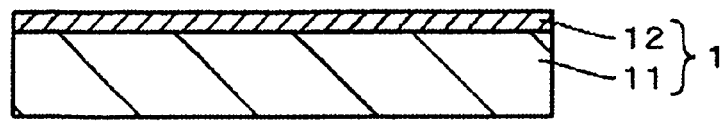
B 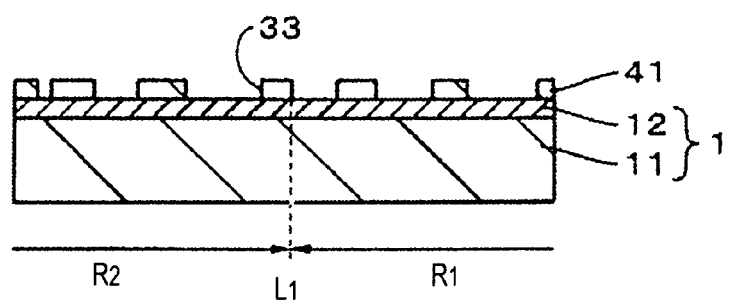
C 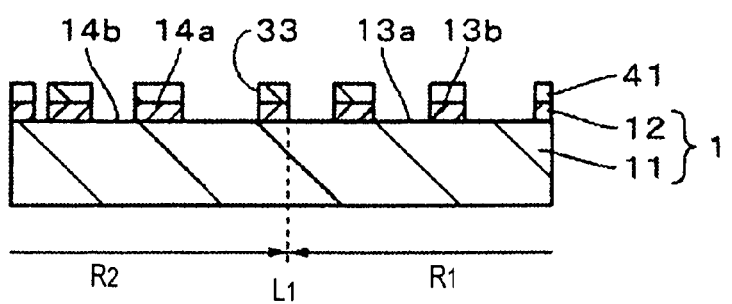
D 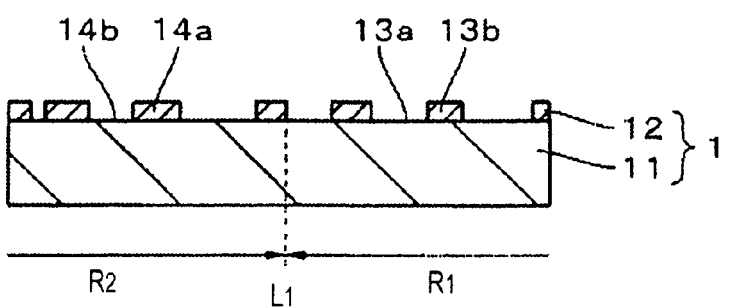

$$\cos\theta = \frac{1}{2(r_i+r_k)\sqrt{(x_i+x_j)^2+(y_i+y_j)^2}}(r_i^2+r_j^2 + 2(r_i - r_j)r_k + \sqrt{(x_i-x_j)^2 + (y_i-y_j)^{2^2}})$$

$$x_k = x_i - \frac{r_i+r_k}{\sqrt{(x_i-x_j)^2+(y_i-y_j)^2}}\{(x_i - x_j)\cos\theta_i - (y_i - y_j)\sin\theta_i\}$$

$$y_k = y_i - \frac{r_i+r_k}{\sqrt{(x_i-x_j)^2+(y_i-y_j)^2}}\{(y_i - y_j)\cos\theta_i - (x_i - x_j)\sin\theta_i\}$$

FIG. 11
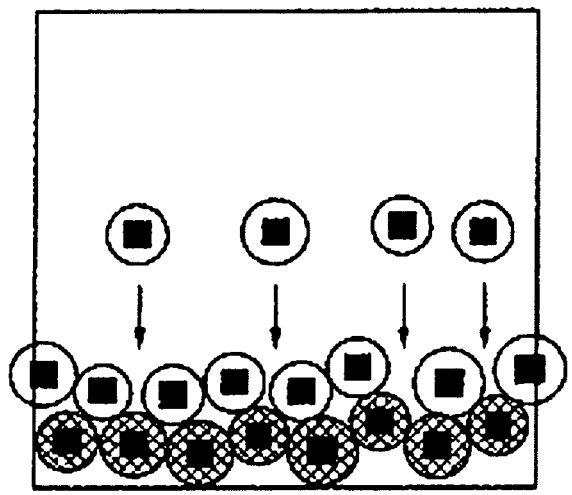
A
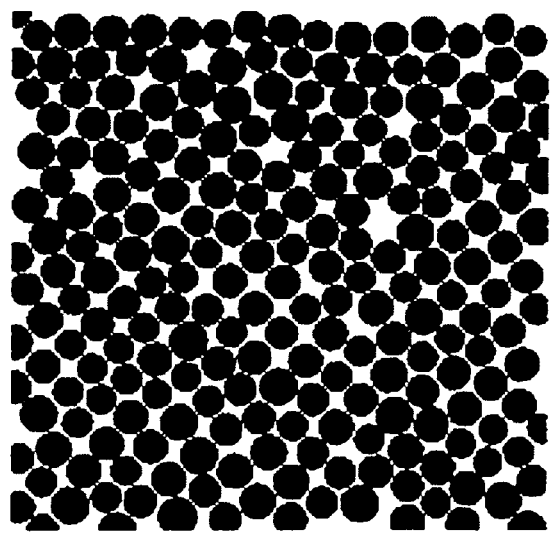
B
Area ratio of circles: 80%

FIG. 12
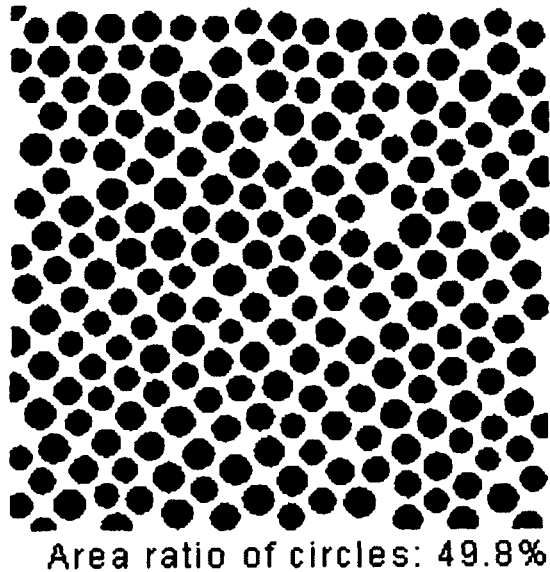
A
Area ratio of circles: 49.8%
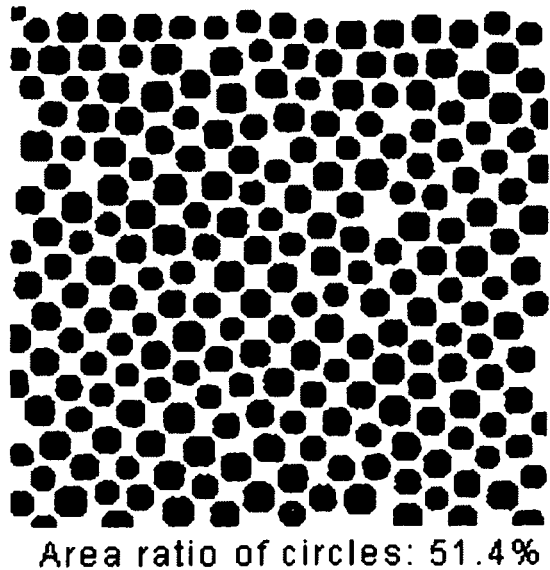
B
Area ratio of circles: 51.4%

FIG. 13
A
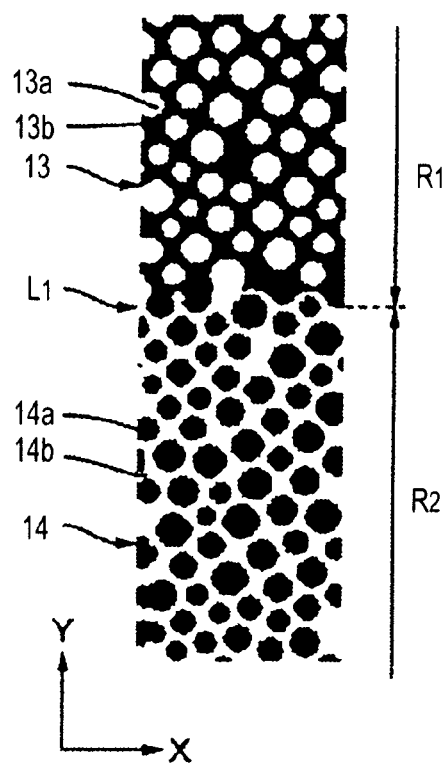
B
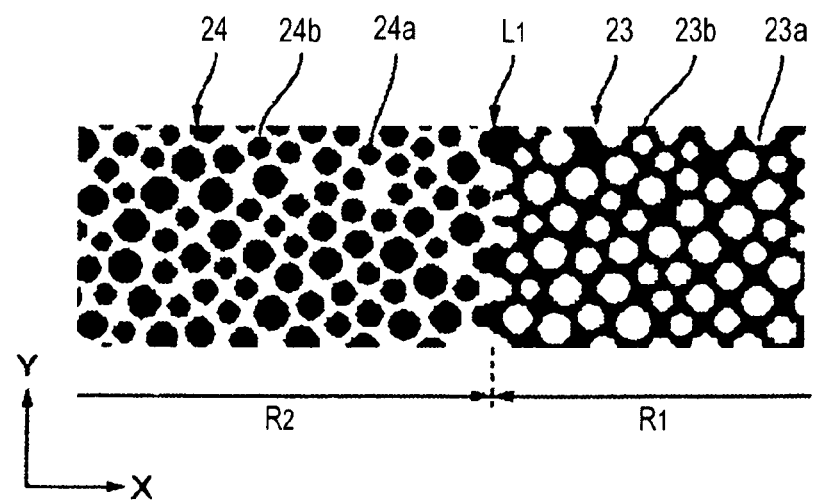

FIG. 15
A
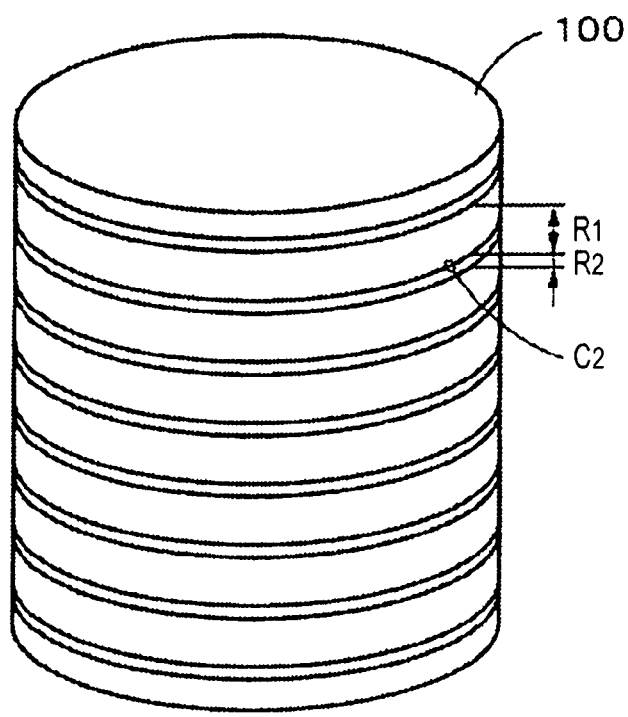
B
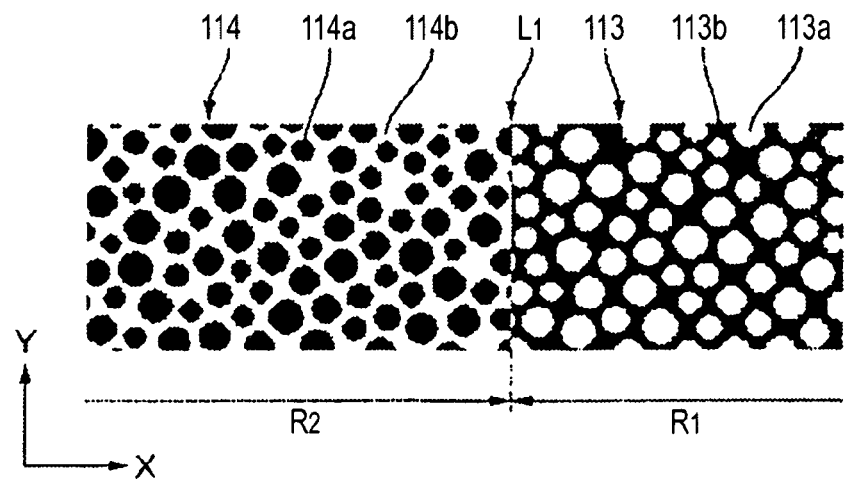

FIG. 18
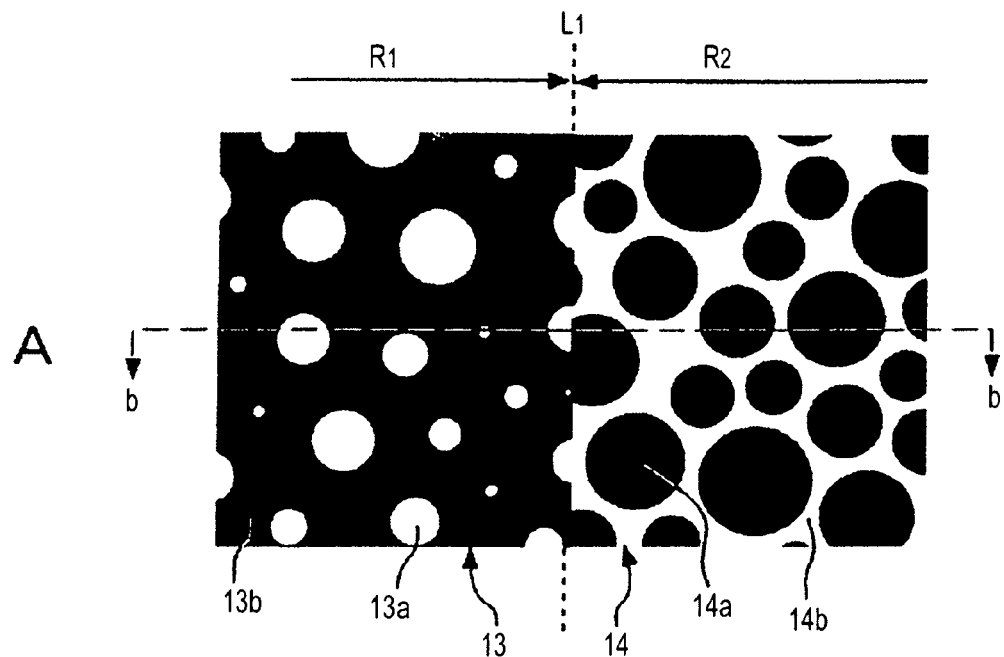
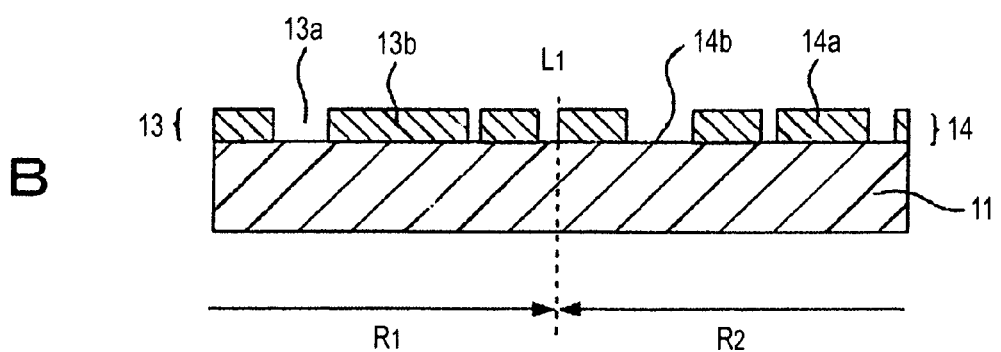

FIG. 23
A 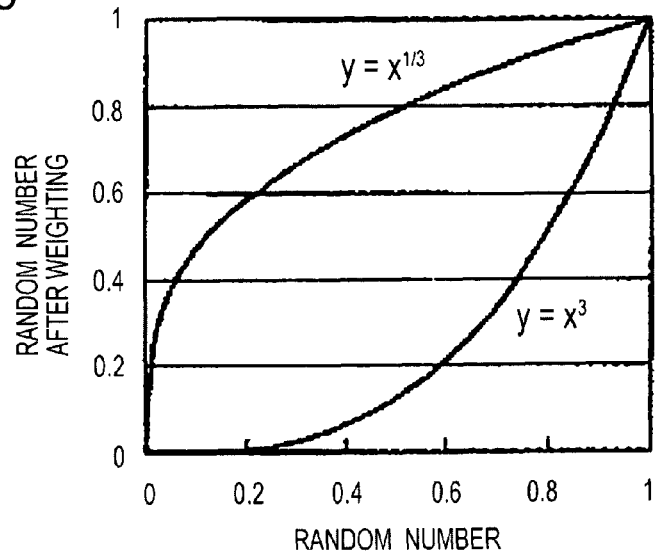
B 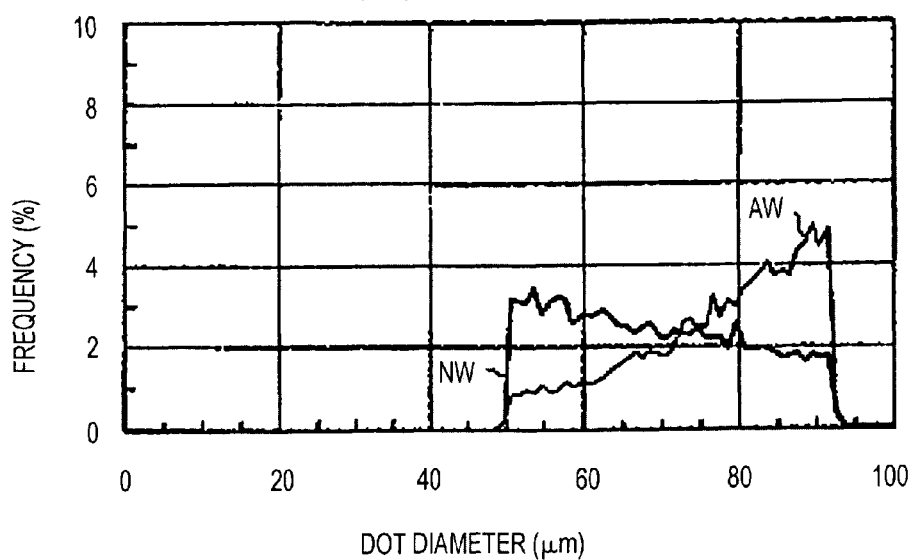

FIG. 24
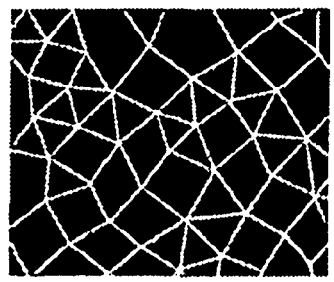
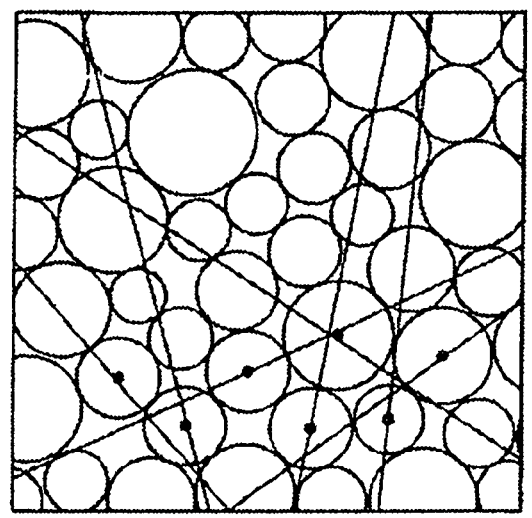
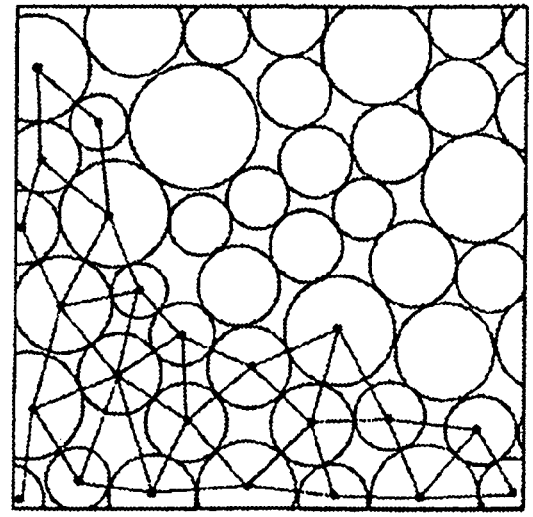

FIG. 25
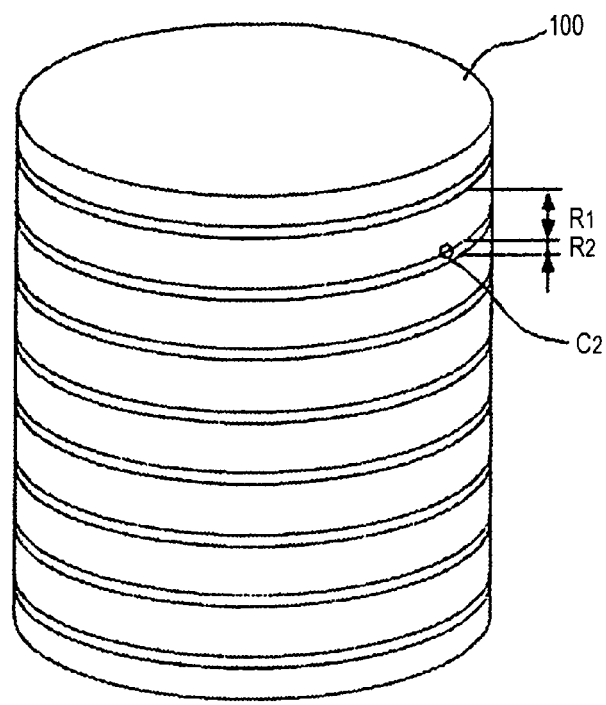
A
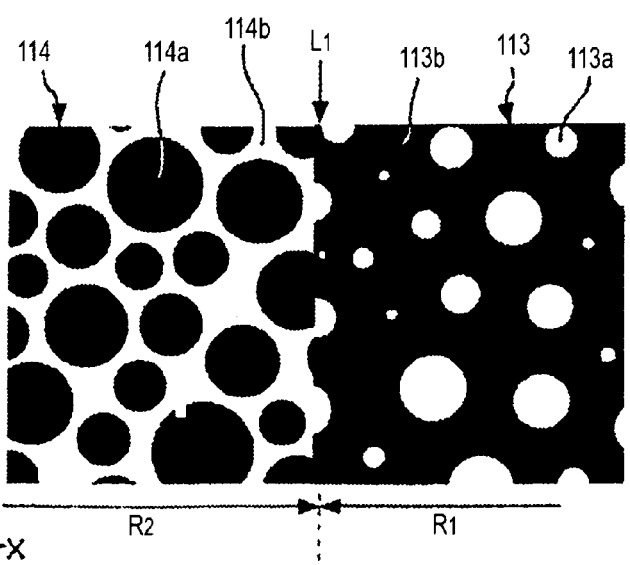
B

FIG. 29
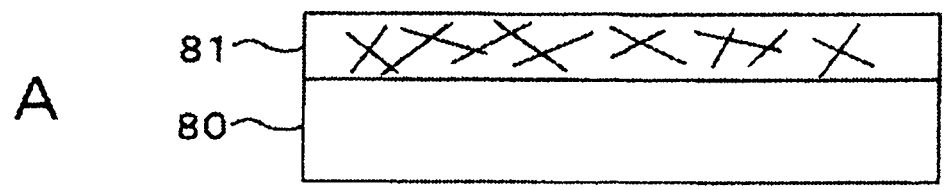
A
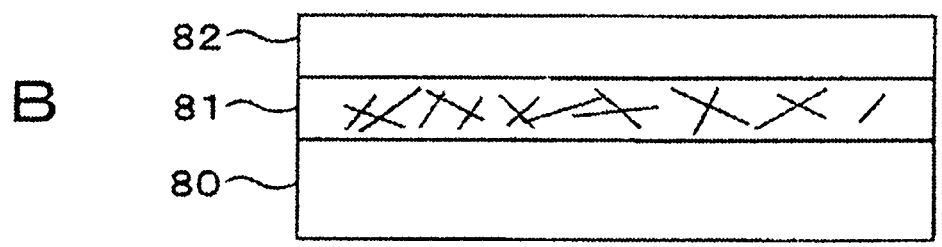
B
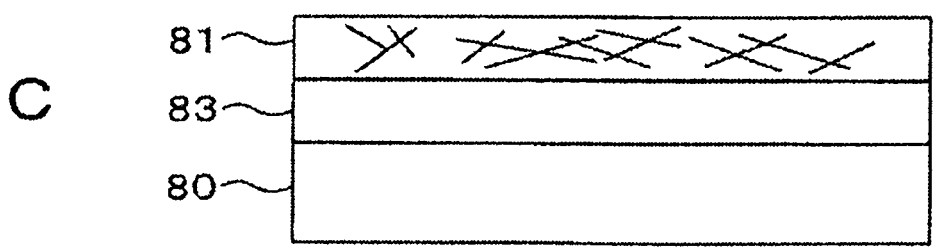
C

FIG. 32
A
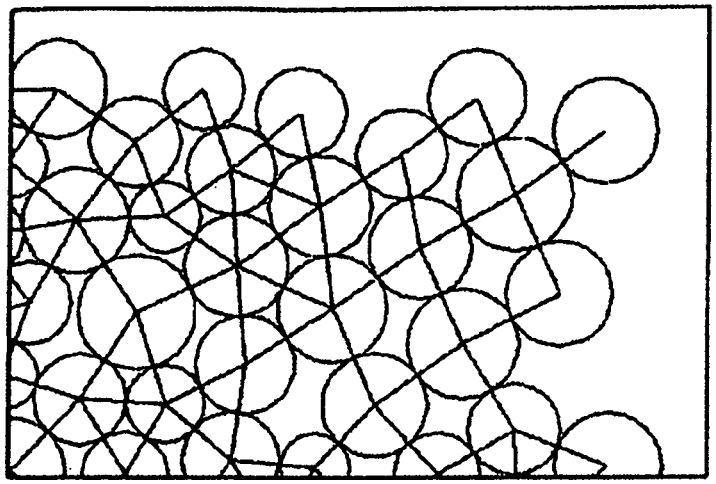
B
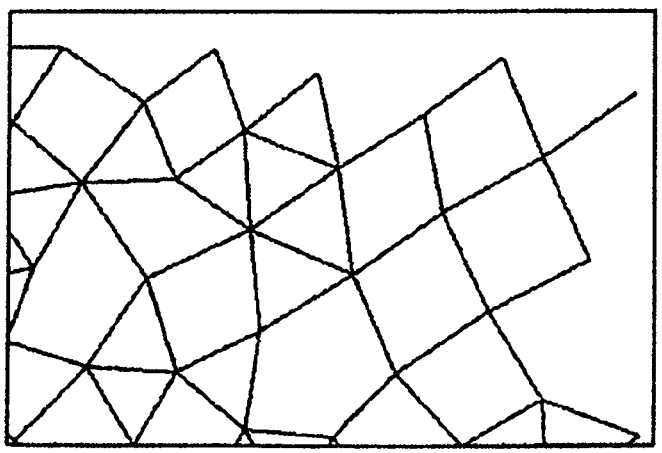
C
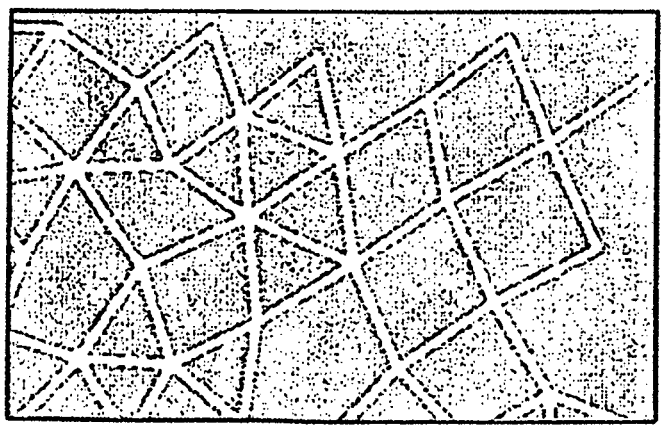

FIG. 34
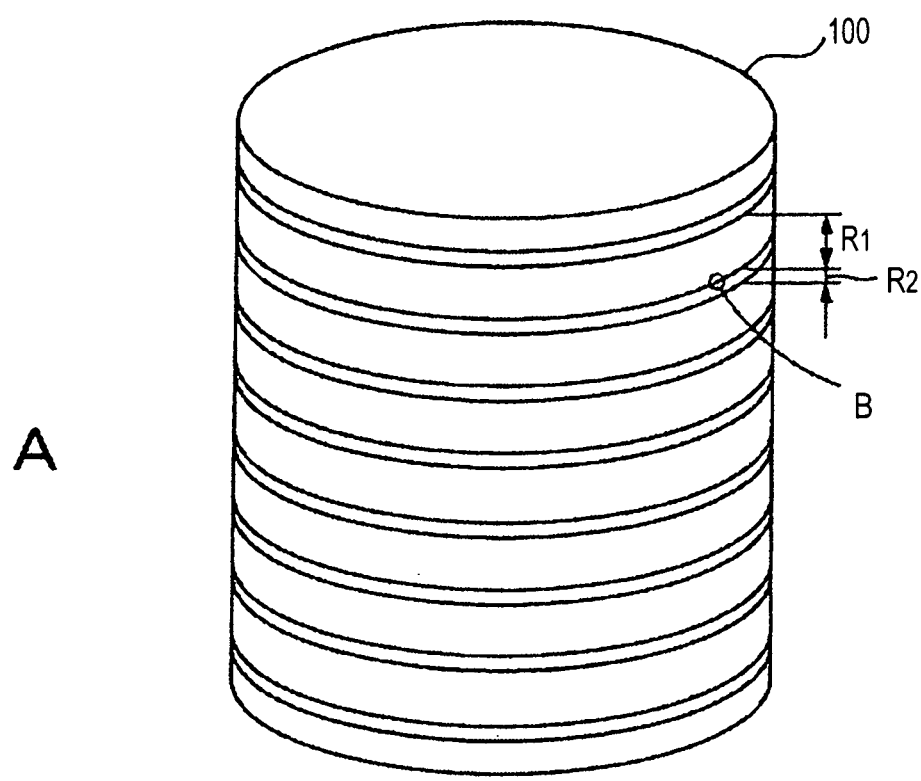
A
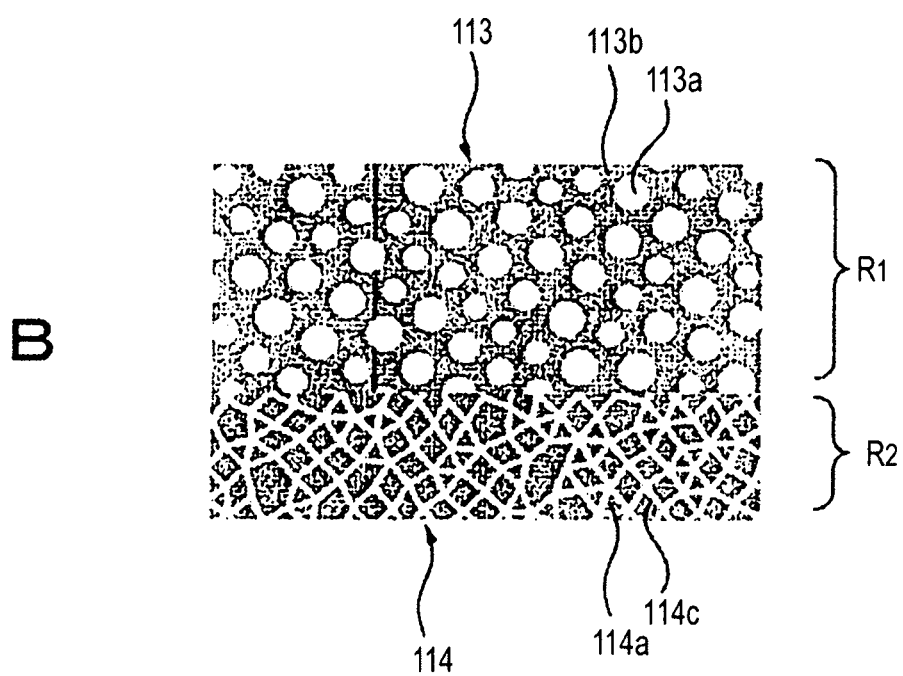
B

FIG. 36
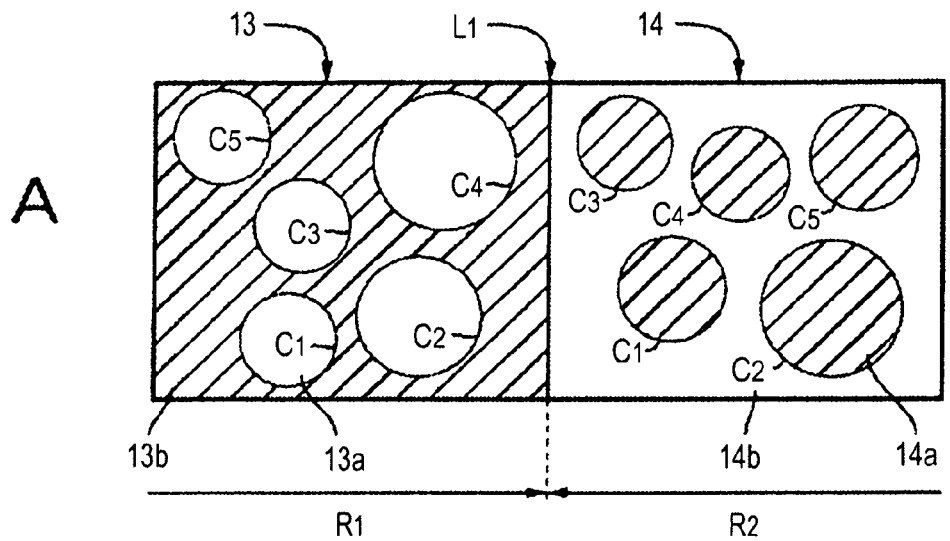
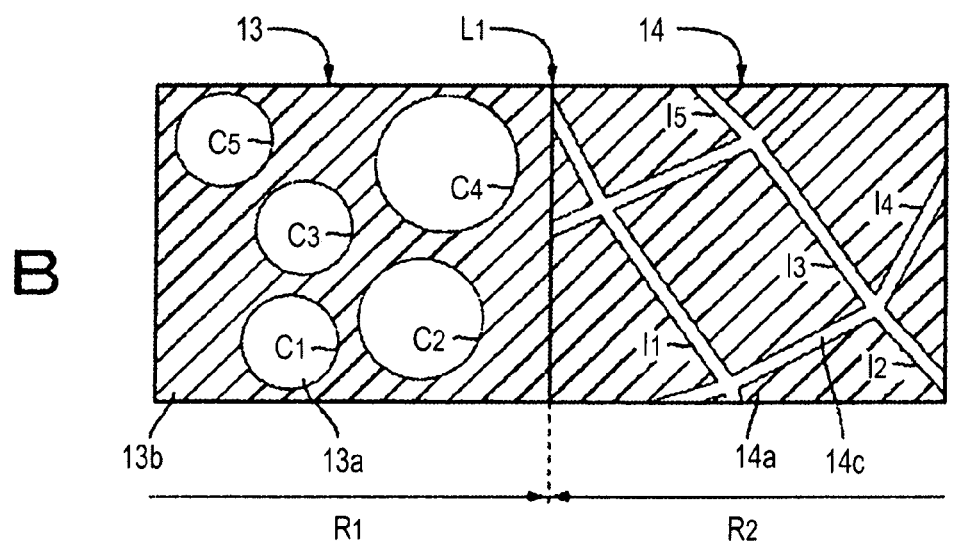

FIG. 38
A
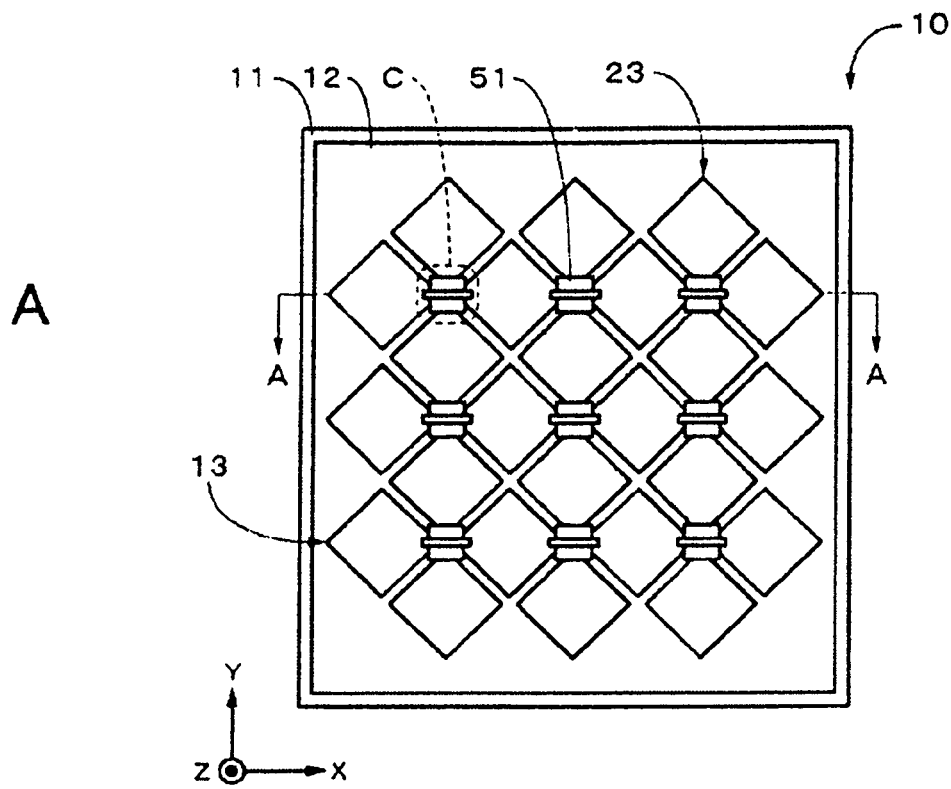
B
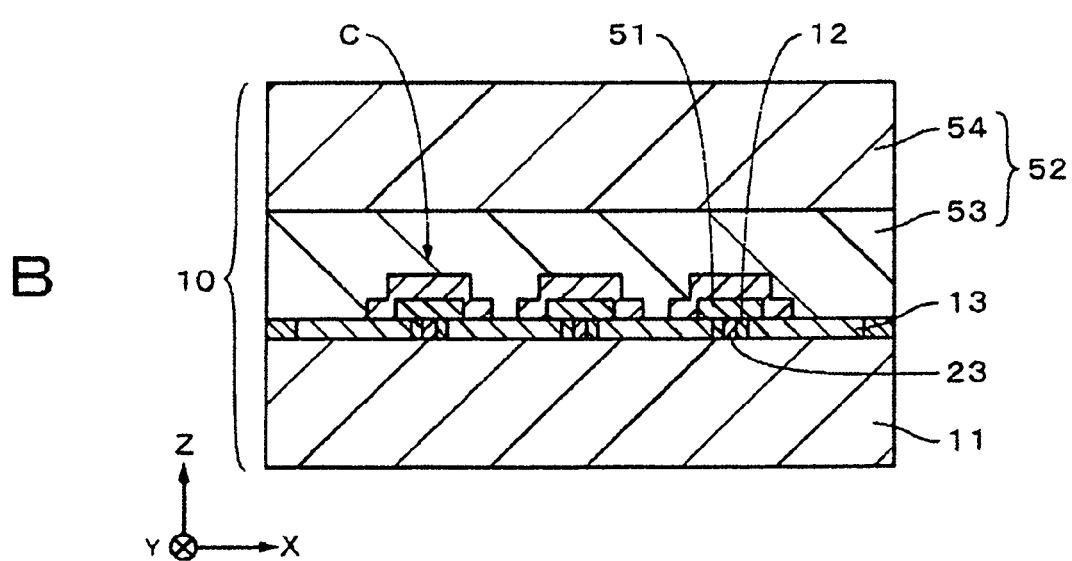

FIG. 39
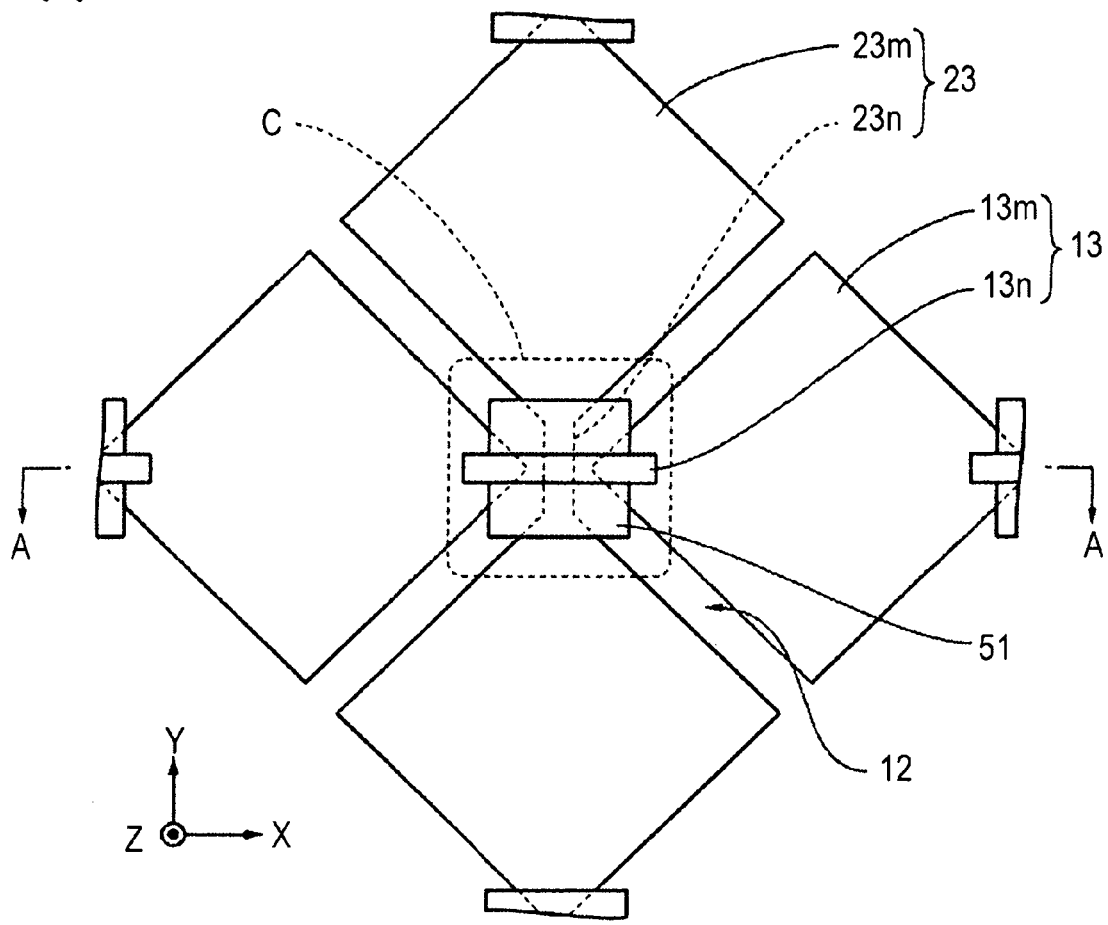
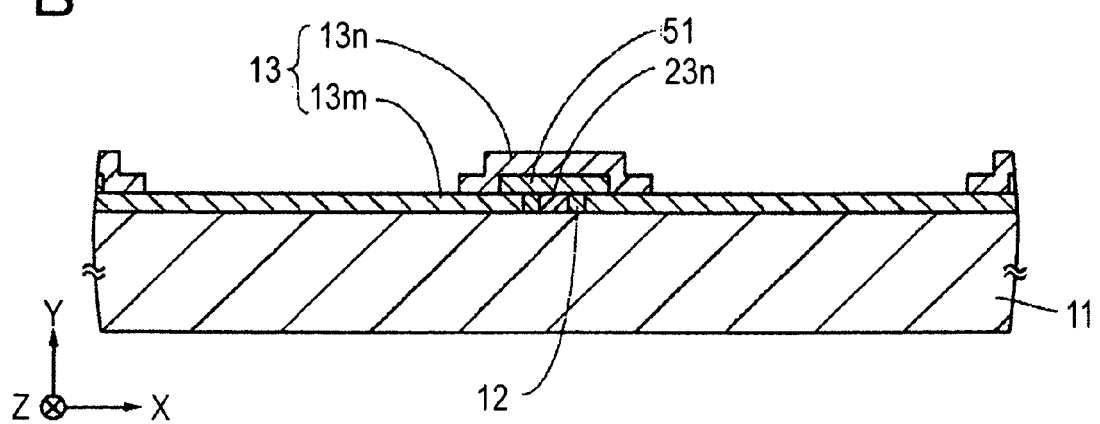

FIG. 45
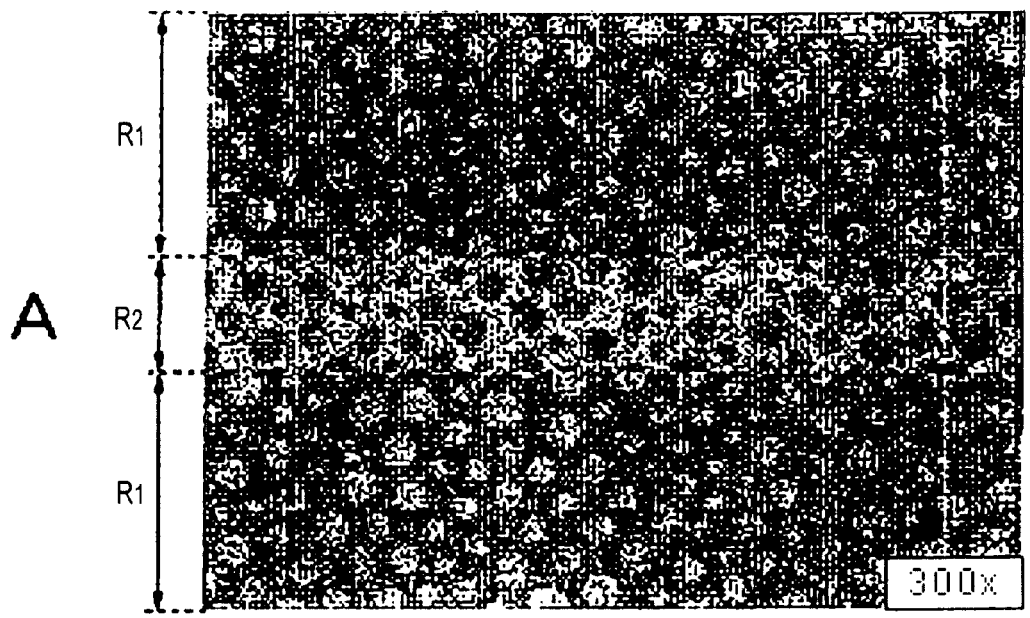
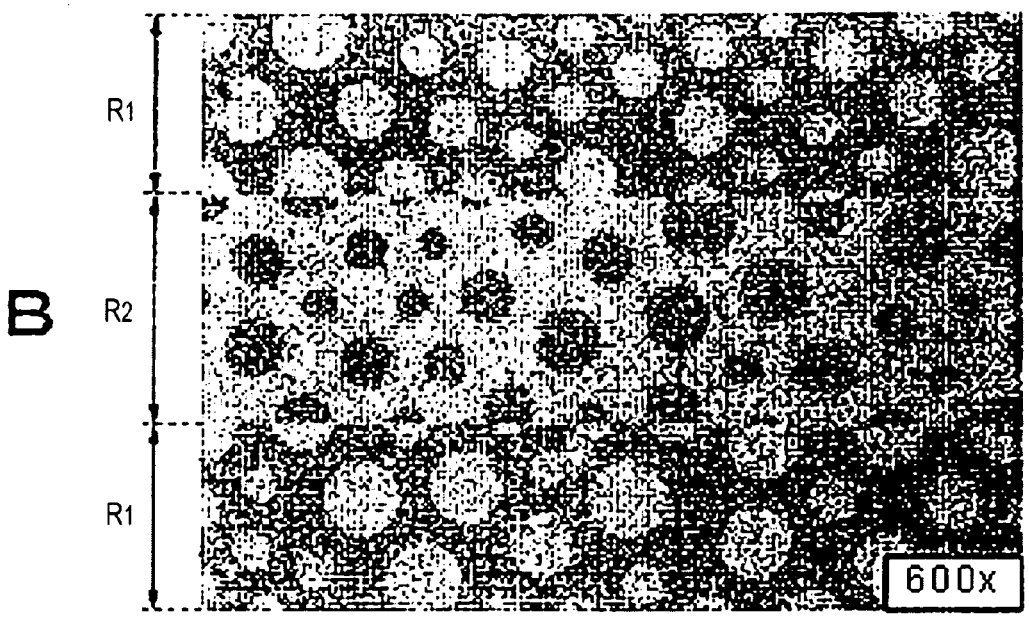

FIG. 48
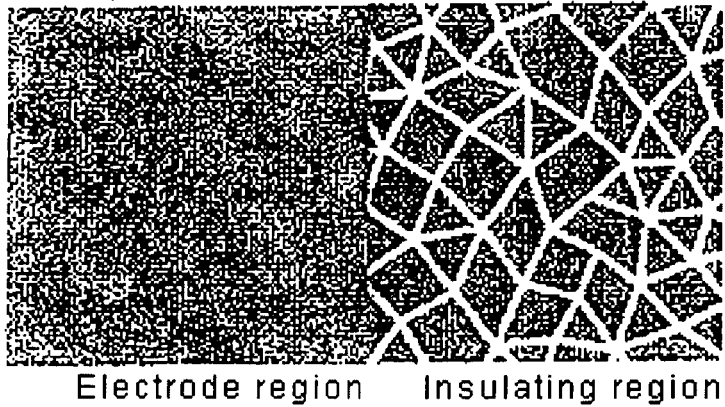
A  Example 3-1
Electrode region    Insulating region
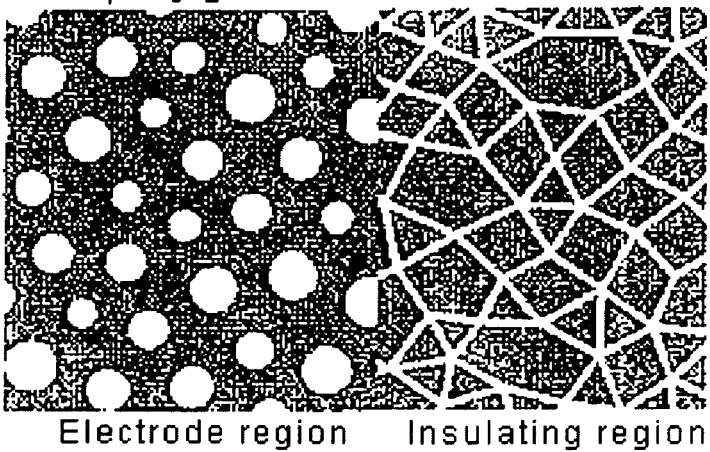
B  Example 3-2
Electrode region    Insulating region
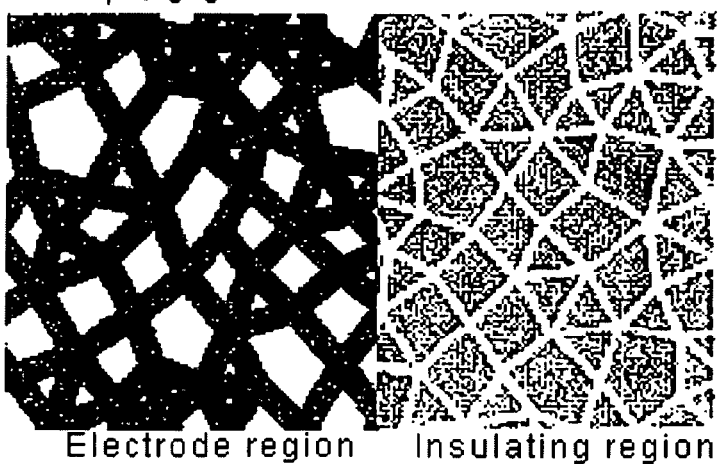
C  Example 3-3
Electrode region    Insulating region

TRANSPARENT CONDUCTIVE ELEMENT, INPUT DEVICE, ELECTRONIC DEVICE, AND MASTER FOR FABRICATION OF TRANSPARENT CONDUCTIVE ELEMENT

This is a Continuation of application Ser. No. 13/876,243, filed Apr. 9, 2013, which is a National Stage Application of PCT/JP2011/066293, filed Jul. 12, 2011, which claims priority to Japanese Patent Application No. 2011-024467, filed Feb. 7, 2011. The prior applications are hereby incorporated by reference herein in their entirety.

TECHNICAL FIELD

The present technique relates to a transparent conductive element, an input device and an electronic device using the transparent conductive element, and a master for fabrication of a transparent conductive element used in manufacturing the transparent conductive element. More specifically, the present technique relates to a transparent conductive element capable of enhancing visibility.

BACKGROUND ART

A transparent conductive film having a base made of a transparent plastic film and a transparent thin film of a small resistance stacked on the base is being used widely for applications in the electric and electronic fields taking advantage of the conductivity of the transparent conductive film such as flat-panel displays including liquid crystal displays and electroluminescent (sometimes abbreviated as EL) displays, and transparent electrodes for resistive touch panels.

In recent years, there have been increasing cases where capacitive touch panels are mounted on mobile devices such as mobile phones and potable audio terminals. These capacitive touch panels use a transparent conductive film with a patterned transparent conductive layer provided on a surface of a base. However, if the conventional transparent conductive film is used, the patterning is exaggerated since optical characteristics change widely between part with the transparent conductive layer and part from which the transparent conductive layer has been removed. As a result, a problem of visibility reduction occurs if such a transparent conductive film is arranged on the front side of a display device such as a liquid crystal display.

To cope with this, the following technique has been suggested (Patent Literatures 1 and 2, for example). In this technique, a stacked film with a stack of dielectric layers having different indexes of refraction is provided between a transparent conductive thin film layer and a base film, and the visibility of a transparent conductive film is improved by taking advantage of optical interference between these stacked films.

CITATION LIST

Patent Literature

[Patent Literature 1] Japanese Patent Application Laid-Open No. 2010-23282
[Patent Literature 2] Japanese Patent Application Laid-Open No. 2010-27294

SUMMARY OF THE INVENTION

Technical Problem

In the aforementioned technique, however, the optical control function of the stacked film has wavelength dependence, so that it is difficult to enhance the visibility of the transparent conductive film satisfactorily. Thus, technique in place of the aforementioned stacked film to enhance the visibility of the transparent conductive film has been desired in recent years.

Thus, it is an object of the present technique to provide a transparent conductive element having excellent visibility, an information input device and an electronic device using the transparent conductive element, and a master for fabrication of a transparent conductive element used in manufacturing the transparent conductive element.

Solution to Problem

In order to solve the aforementioned problems, a first technique is directed to a transparent conductive element, including
a base having a surface, and
a transparent conductive part and a transparent insulating part alternately arranged on the surface,
the transparent conductive part being a transparent conductive layer with plural pore portions randomly arranged,
the transparent insulating part being a transparent conductive layer composed of plural island portions randomly arranged,
a boundary between the transparent conductive part and the transparent insulating part having a random shape.

A second technique is directed to a transparent conductive element, including
a base having a first surface and a second surface, and
a transparent electrode pattern part and a transparent insulating pattern part formed on at least one of the first and second surfaces,
the transparent electrode pattern part and the transparent insulating pattern part being laid alternately on at least one of the first and second surfaces,
the transparent electrode pattern part being a transparent conductive layer with plural pore portions randomly formed apart,
the transparent insulating pattern part being a transparent conductive layer composed of plural island portions randomly formed apart,
a boundary between the transparent electrode pattern part and the transparent insulating pattern part having a random shape.

A third technique is directed to an input device, including
a first transparent conductive element, and
a second transparent conductive element provided on a surface of the first transparent conductive element,
at least one of the first transparent conductive element and the second transparent conductive element including
a base having a surface, and
a transparent conductive part and a transparent insulating part alternately arranged on the surface,
the transparent conductive part being a transparent conductive layer provided with plural pore portions randomly arranged,
the transparent insulating part being a transparent conductive layer composed of plural island portions randomly arranged,
a boundary between the transparent conductive part and the transparent insulating part having a random shape.

A fourth technique is directed to an electronic device, including a transparent conductive element,
the transparent conductive element including
a base having a surface, and
a transparent conductive part and a transparent insulating part alternately arranged on the surface, the transparent conductive part being a transparent conductive layer provided with plural pore portions randomly arranged, the transparent insulating part being a transparent conductive layer composed of plural island portions randomly arranged, a boundary between the transparent conductive part and the transparent insulating part having a random shape.

A fifth technique is directed to a master for fabrication of a transparent conductive element, the master including a surface in which a transparent conductive part forming region and a transparent insulating part forming region are alternately arranged, the transparent conductive part forming region being provided with plural pore portions randomly arranged in the shape of recesses, the transparent insulating part forming region being provided with plural island portions randomly arranged in the shape of projections, a boundary between the transparent conductive part forming region and the transparent insulating part forming region having a random shape.

In the present technique, it is preferable that a ratio in average boundary length (L1/L2) between an average boundary length L1 of the transparent conductive part and an average boundary length L2 of the transparent insulating part be in a range of from 0.75 to 1.25.

In the present technique, it is preferable that the absolute value of a difference in reflection L value between the transparent conductive part and the transparent insulating part be less than 0.3.

In the present technique, it is preferable that the pore portions and the island portions have a dot shape. It is preferable that the dot shape be of at least one type selected from the group consisting of a circular shape, an oval shape, a shape formed by partially cutting off a circular shape, a shape formed by partially cutting off an oval shape, a polygonal shape, a polygonal shape with rounded off corners, and an indefinite shape.

In the present technique, it is preferable that a conductive portion between the pore portions and a void portion between the island portions have a mesh shape.

In the present technique, it is preferable that the pore portions have a dot shape, and that the void portion between the island portions have a mesh shape.

In the present technique, it is preferable that the conductive portion between the pore portions have a mesh shape, and that the island portions have a dot shape.

In the present technique, it is preferable that the transparent conductive part and the transparent insulating part have respective random patterns different from each other.

In the present technique, it is preferable that plural inverting portions be randomly formed at a boundary between the transparent conductive part and the transparent insulating part, the inverting portions including the pore portions and the island portions taking the place of the pore portions at the boundary.

In the present technique, it is preferable that the coverage factor of the transparent conductive layer in the transparent conductive part and the transparent insulating part be 65% or more and 100% or less.

In the present technique, it is preferable that the transparent conductive element further include a transparent conductive part and a transparent insulating part alternately arranged on a rear surface opposite to the surface, and that a difference in the sum of the coverage factor of the transparent conductive layer in the surface and that of the transparent conductive layer in the rear surface be in a range of from 0% to 60%.

In the present technique, it is preferable that the transparent conductive part include a plurality of regions, and that, when the widths and the lengths of the regions are W and L respectively, the coverage factor of the transparent conductive layer be set to be larger in a region with a greater ratio (L/W). It is preferable that the plurality of regions include a first region and a second region, and that the coverage factor of the transparent conductive layer be set to be larger in a region of these two regions with a greater ratio (L/W).

In the present technique, it is preferable that the transparent conductive part be a transparent electrode pattern part.

A sixth technique is directed to a transparent conductive element, including a base having a first surface and a second surface, and a transparent electrode pattern part and a transparent insulating pattern part formed on at least one of the first surface and the second surface, the transparent electrode pattern part and the transparent insulating pattern part being laid alternately on at least one of the first surface and the second surface, plural pore portions being randomly formed apart in the transparent electrode pattern parts, plural island portions being randomly formed apart in the transparent insulating pattern parts.

A seventh technique is directed to an information input device, including a first transparent conductive element, and a second transparent conductive element provided on a surface of the first transparent conductive element, at least one of the first and second transparent conductive elements including a base having a surface, and a transparent electrode pattern part and a transparent insulating pattern part formed on the surface, the transparent electrode pattern part and the transparent insulating pattern part being laid alternately on the surface of the base, plural pore portions being randomly formed apart in the transparent electrode pattern parts, plural island portions being randomly formed apart in the transparent insulating pattern parts.

An eighth technique is directed to an information input device, including a transparent conductive element, the transparent conductive element including a base having a first surface and a second surface, and transparent electrode pattern parts and transparent insulating pattern parts formed on the first surface and the second surfaces, the transparent electrode pattern parts and the transparent insulating pattern parts being laid alternately on the first surface and the second surface, plural pore portions being randomly formed apart in the transparent electrode pattern parts, plural island portions being randomly formed apart in the transparent insulating pattern parts.

A ninth technique is directed to a master for fabrication of a transparent conductive element, the master including a surface in which a transparent electrode pattern part forming region and a transparent insulating pattern part forming region are laid alternately, plural pore portions in the shape of recesses being randomly formed apart in the transparent electrode pattern part forming regions, plural island portions in the shape of projections being randomly formed apart in the transparent insulating pattern part forming regions.

A tenth technique is directed to a method of manufacturing a transparent conductive element, including a step of printing a conductive coating material on a surface of a base, and a step of forming a transparent electrode pattern part and a transparent insulating pattern part on the surface of the base by drying and/or heating the conductive coating material, the transparent electrode pattern part and the transparent insulating pattern part being laid alternately on the surface of the base, plural pore portions being randomly formed apart in the transparent electrode pattern parts, plural island portions being randomly formed apart in the transparent insulating pattern parts.

An eleventh technique is directed to a method of manufacturing a transparent conductive element, including a step of forming a resist pattern on a surface of a transparent conductive layer provided on a surface of a base, and a step of forming a transparent electrode pattern part and a transparent insulating pattern part on the surface of the base by etching the transparent conductive layer using the resist pattern as a mask, the transparent electrode pattern part and the transparent insulating pattern part being laid alternately on the surface of the base, plural pore portions being randomly formed apart in the transparent electrode pattern parts, plural island portions being randomly formed apart in the transparent insulating pattern parts.

In the present technique, it is preferable that the transparent electrode pattern part be a transparent conductive layer with plural pore portions randomly formed apart, and that the transparent insulating pattern part be a transparent conductive layer composed of plural island portions randomly formed apart.

In the present technique, it is preferable that a boundary between the transparent electrode pattern part and the transparent insulating pattern part have a random shape. It is preferable that the random shape be a shape obtained by randomly forming a plurality of inverting portions at the boundary between the transparent electrode pattern part and the transparent insulating pattern part, the inverting portions including the pore portions and the island portions taking the place of the pore portions at the boundary, or a shape obtained by combining parts of the shapes of the pore portions and parts of the shapes of the island portions.

In the present technique, it is preferable that the pore portions and the island portions have a shape of at least one type selected from the group consisting of a circular shape, an oval shape, a shape formed by partially cutting off a circular shape, a shape formed by partially cutting off an oval shape, a polygonal shape, a polygonal shape with rounded off corners, and an indefinite shape. The circular shape is particularly preferable in terms of easiness of generation of a random pattern. The pore portions and the island portions may have different shapes. The oval shape includes not only a complete ellipse mathematically defined but also an oval with some deformation (such as an elongated circle and an egg shape). The circular shape includes not only a complete circle (perfect circle) mathematically defined but also a circular shape with some deformation. The polygonal shape includes not only a complete polygon mathematically defined but also a polygon with deformed sides, a polygon with rounded corners, and a polygon with deformed sides and rounded corners, for example. Deformation to be given to sides is a convex or a concave, for example.

In the present technique, examples of method of forming a plurality of pore portions and a plurality of island portions having a random pattern include a method of forming a uniform film and then removing unnecessary part (this method is hereinafter called etching method where appropriate), and a method of forming a random pattern directly from the start (this method is hereinafter called printing method where appropriate). However, the forming method is not limited to these methods. Examples of the etching method include a method of performing patterning by exposure to light and wet etching by using an etching liquid, and a method of applying etching paste to conform to a patterning shape. However, the etching method is not limited to these methods. Examples of the printing method include a screen printing, a waterless planographic printing, a flexographic printing, a gravure printing, a gravure offset printing, a reverse offset printing, and a micro-contact printing. However, the printing method is not limited to these methods.

In the present technique, it is preferable that the transparent electrode pattern part be an X electrode pattern part or a Y electrode pattern part. If the transparent conductive element is used as a capacitive information input device (touch panel), the X electrode pattern part and the Y electrode pattern part may each be formed on at least one of a first surface and a second surface of different bases. The X electrode pattern part and the Y electrode pattern part may be formed on a first surface and a second surface respectively of a single base. Both the X electrode pattern part and the Y electrode pattern part may be formed on one of a first surface and a second surface of a single base. If both the X electrode pattern part and the Y electrode pattern part are formed on one of the first and second surfaces of the single base, it is preferable that the transparent insulating pattern part be formed in a void between the X electrode pattern part and the Y electrode pattern part.

In the present technique, it is preferable all the plural pore portions be isolated. In this regard, some of the plural pore portions may be in contact or be overlapped with each other within a range that does not generate reduction of visibility and conductivity. It is further preferable that all the plural island portions be isolated from each other. In this regard, some of the plural island portions may be in contact or be overlapped with each other within a range that does not generate reduction of visibility and insulating properties.

In the present technique, the transparent electrode pattern part and the transparent insulating pattern part are laid alternately on a base surface. This makes it possible to reduce a difference in optical characteristics between a region where the transparent electrode pattern part is formed and a region where the transparent electrode pattern part is not formed (namely, a region where the transparent insulating pattern part is formed). As a result, the transparent electrode pattern part can be less visible. Additionally, the pore portions are randomly formed apart in the transparent electrode pattern part, and the plural island portions are randomly formed apart in the transparent insulating pattern part. As a result, generation of moire can be suppressed.

Advantageous Effects of Invention

As described in detail above, the present technique can make a transparent electrode pattern part less visible and suppress generation of moire, so that a transparent conductive element having excellent visibility can be realized.

BRIEF DESCRIPTION OF DRAWINGS

FIG. 3A is a plan view showing a boundary and its vicinity in an enlarged manner between a transparent electrode pattern part and a transparent insulating pattern part. FIG. 3B is a cross-sectional view taken along line A-A of FIG. 3A.

FIGS. 5A to 5D are process diagrams describing an example of a method of manufacturing the first transparent conductive element according to the first embodiment of the present technique.

FIG. 11A is a view schematically showing the concept of a method of generating random patterns. FIG. 11B is a view showing an example of generation of random patterns with the area ratio of circles of 80%.

FIG. 12A is a view showing an example where radii of circles are made smaller than generated patterns. FIG. 12B is a view showing an example where generated patterns are composed of squares with rounded off corners.

FIG. 13A is a plan view showing a boundary and its vicinity in an enlarged manner between a transparent electrode pattern part and a transparent insulating pattern part of the first transparent conductive element. FIG. 13B is a plan view showing a boundary and its vicinity in an enlarged manner between a transparent electrode pattern part and a transparent insulating pattern part of the second transparent conductive element.

FIG. 15A is a perspective view showing an example of the shape of a master used in a method of manufacturing a first transparent conductive element according to a second embodiment of the present technique. FIG. 15B is a plan view showing part of a first region $R_1$ and part of a second region $R_2$ of FIG. 15A in an enlarged manner.

FIG. 18A is a plan view showing a boundary and its vicinity in an enlarged manner between a transparent electrode pattern part and a transparent insulating pattern part. FIG. 18B is a cross-sectional view taken along line b-b of FIG. 18A.

FIGS. 23A and 23B are graphs each describing weighting of a random number in the third embodiment of the present technique.

FIGS. 24A to 24C are simplified diagrams each describing a method of forming a random mesh pattern according to the third embodiment of the present technique.

FIG. 25A is a perspective view showing an example of the shape of a master used in a method of manufacturing the first transparent conductive element according to the third embodiment of the present technique. FIG. 25B is a plan view showing part of a first region $R_1$ and part of a second region $R_2$ of FIG. 25A in an enlarged manner.

FIGS. 29A to 29C are cross-sectional views each showing an example of the structure of a transparent conductive element according to a fifth embodiment of the present technique.

FIGS. 32A to 32C are plan views describing procedure to form a groove pattern in an insulating region based on generated patterns.

FIG. 34A is a perspective view showing an example of the shape of a master used in a method of manufacturing the transparent conductive element according to the sixth embodiment of the present technique. FIG. 34B is a plan view showing part of a first region $R_1$ and part of a second region $R_2$ of FIG. 34A in an enlarged manner.

FIG. 36A is a plan view describing an example of the structure of a transparent conductive element according to an eighth embodiment of the present technique. FIG. 36B is a plan view describing a modification of the transparent conductive element according to the eighth embodiment of the present technique.

FIG. 38A is a plan view showing an example of the structure of a transparent conductive element according to a tenth embodiment of the present technique. FIG. 38B is a schematic cross-sectional view taken along line A-A of FIG. 38A.

FIG. 39A is a plan view showing an intersection C and its vicinity of FIG. 38A in an enlarged manner. FIG. 39B is a cross-sectional view taken along line A-A of FIG. 39A.

FIGS. 45A and 45B each show the photograph of a transparent electrode pattern part and a transparent insulating pattern part of a transparent conductive film of Example 1.

FIG. 48 includes plan views showing transparent electrode pattern parts (electrode regions) and transparent insulating pattern parts (insulating regions) of Examples 3-1 to 3-3.

DESCRIPTION OF EMBODIMENTS

Figure 1:
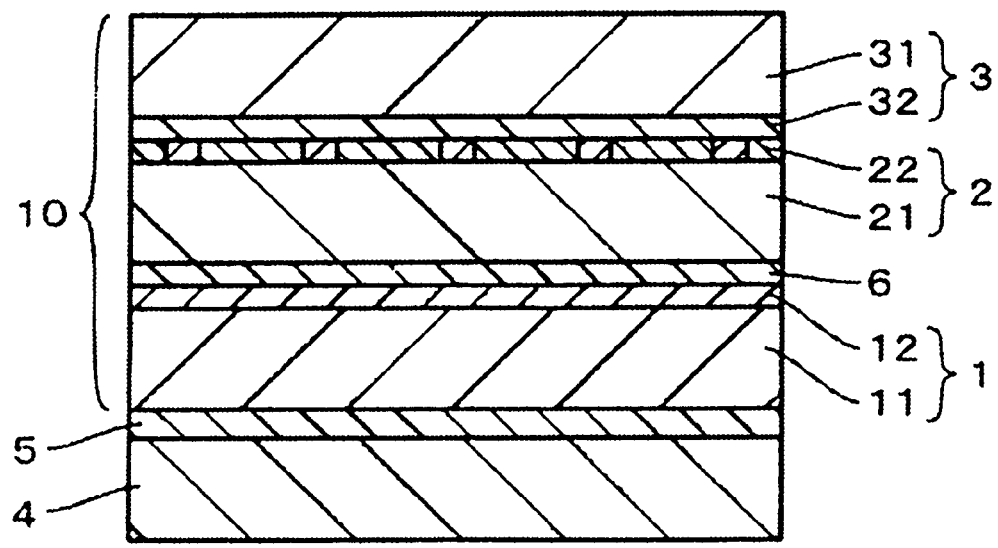
FIG. 1 is a cross-sectional view showing an example of the structure of an information input device according to a first embodiment of the present technique.

Embodiments of the present technique will be described in the order given below by referring to the drawings. In all the drawings relating to the embodiments described below, common parts or corresponding parts are denoted by the same reference numbers.

1. First Embodiment (an example of a transparent conductive element and an example of an information input device using the transparent conductive element)

2. Second Embodiment (an example of a method of manufacturing a transparent conductive element by a printing method)

3. Third Embodiment (an example where a random pattern for a transparent electrode pattern part and that for a transparent insulating pattern part differ from each other)

4. Fourth Embodiment (an example of an electrode having a diamond pattern)

5. Fifth Embodiment (an example of a transparent conductive element using metallic nanowires)

6. Sixth Embodiment (an example where groove portions of a mesh pattern is provided in a transparent insulating pattern part)

7. Seventh Embodiment (an example of a transparent conductive element where only a transparent insulating pattern part has a random pattern)

8. Eighth Embodiment (an example where a range of a ratio in boundary length between a transparent electrode pattern part and a transparent insulating pattern part is numerically limited)

9. Ninth Embodiment (an example where an X electrode is provided on one principal surface and a Y electrode is provided on the opposite principal surface of a base)

10. Tenth Embodiment (an example where an X electrode and a Y electrode are provided on one principal surface of a base)

11. Eleventh Embodiment (exemplary applications to electronic devices)

1. First Embodiment

Structure of Information Input Device

FIG. 1 is a cross-sectional view showing an example of the structure of an information input device according to a first embodiment of the present technique. As shown in FIG. 1, the information input device 10 is provided on a display surface of a display device 4. The information input device 10 is bonded to the display surface of the display device 4 through a bonding layer 5, for example.

The information input device 10 is what is called a projected capacitive touch panel, and includes a first transparent conductive element 1, and a second transparent conductive element 2 provided on a surface of the first transparent conductive element 1. The first and second transparent conductive elements 1 and 2 are bonded together through a bonding layer 6. If necessary, an optical layer 3 may be provided further on the surface of the second transparent conductive element 2.

(First Transparent Conductive Element)

Figure 2:
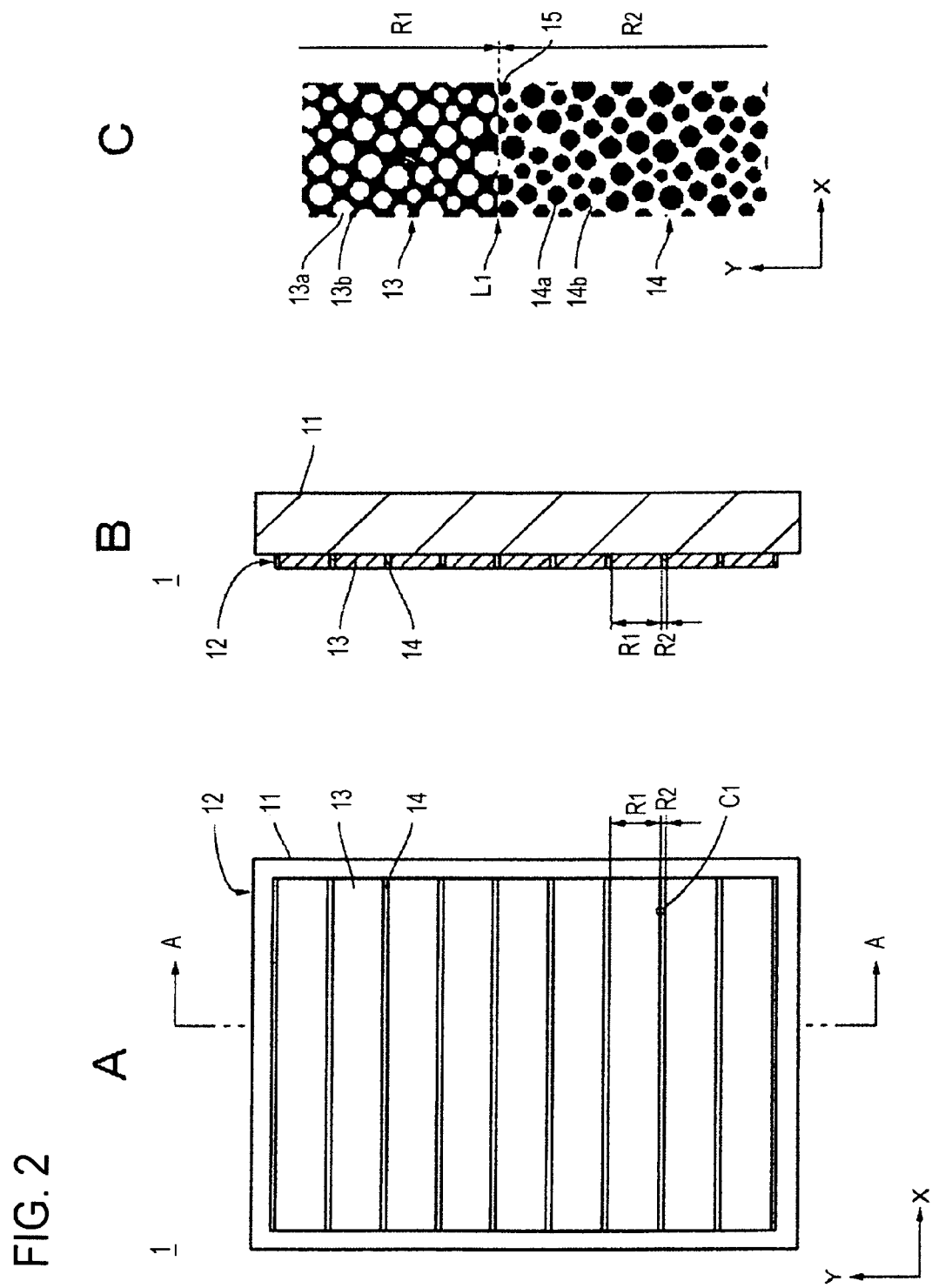
FIG. 2A is a plan view showing an example of the structure of a first transparent conductive element according to the first embodiment of the present technique.
FIG. 2B is a cross-sectional view taken along line A-A of FIG. 2A.
FIG. 2C is a plan view showing a region $C_1$ of FIG. 2A in an enlarged manner.

FIG. 2A is a plan view showing an example of the structure of the first transparent conductive element according to the first embodiment of the present technique. FIG. 2B is a cross-sectional view taken along line A-A of FIG. 2A. FIG. 2C is a plan view showing a region $C_1$ of FIG. 2A in an enlarged manner. As shown in FIGS. 2A and 2B, the first transparent conductive element 1 includes a base 11 having a surface and a transparent conductive layer 12 formed on this surface. The transparent conductive layer 12 includes transparent electrode pattern parts 13 and transparent insulating pattern parts 14. The transparent electrode pattern parts 13 are X electrode pattern parts extending in an X axis direction. The transparent insulating pattern parts 14 are what are called dummy electrode pattern parts, and are insulating pattern parts extending in the X axis direction and placed between the transparent electrode pattern parts 13 to electrically isolate adjacent ones of the transparent electrode pattern parts 13. The transparent electrode pattern parts 13 and the transparent insulating pattern parts 14 are laid alternately on the surface of the base 11 toward a Y axis direction. In FIGS. 2A to 2C, regions $R_1$ show regions for formation of the transparent electrode pattern parts 13, and regions $R_2$ show regions for formation of the transparent insulating pattern parts 14.

It is preferable that the transparent electrode pattern parts 13 and the transparent insulating pattern parts 14 have shapes appropriately selected according to the shape of a screen or a driving circuit, for example. A linear shape, and a shape formed by coupling plural rhombus shapes (diamond shapes) in a linear fashion are applicable, for example. However, the shapes of the transparent electrode pattern parts 13 and the transparent insulating pattern parts 14 are not specifically limited to these shapes. In the example of FIG. 2A, the transparent electrode pattern parts 13 and the transparent insulating pattern parts 14 have a linear shape.

As shown in FIG. 2C, the transparent electrode pattern part 13 is a transparent conductive layer with plural pore portions 13a randomly formed apart, and a conductive portion 13b is provided between adjacent ones of the pore portions 13a. Further, the transparent insulating pattern part 14 is a transparent conductive layer composed of plural island portions 14a randomly formed apart, and a void portion 14b functioning as an insulating portion is provided between adjacent ones of the island portions 14a. It is preferable that the transparent conductive layer be removed completely in the void portion 14b. In this regard, part of the transparent conductive layer may remain in the shape of an island or a thin film within a range that allows the void portion 14b to function as an insulating portion. It is preferable that the pore portions 13a and the island portions 14a have random structures with no periodicity. If the pore portions 13a and the island portions 14a are formed into periodic structures on the order of microns or less, the pore portions 13a and the island portions 14a themselves tend to generate interfering light, or generate moire if visually observed while the information input device 10 is arranged on the display surface of the display device 4.

FIG. 3A is a plan view showing a boundary and its vicinity in an enlarged manner between the transparent electrode pattern part and the transparent insulating pattern part. FIG. 3B is a cross-sectional view taken along line A-A of FIG. 3A. As shown in FIGS. 3A and 3B, it is preferable that plural, inverting portions 15 be randomly formed apart at a boundary $L_1$ between the transparent electrode pattern part 13 and the transparent insulating pattern part 14. The inverting portions 15 have the pore portions 13a and the island portions 14a, and of a structure where the island portions 14a take the place of the pore portions 13a at the boundary $L_1$. Forming the plural inverting portions 15 randomly at the boundary $L_1$ allows the boundary $L_1$ to be less visible.

In the first region $R_1$, the plural pore portions 13a are an exposed region of the base surface, and the conductive portion 13b between adjacent ones of the pore portions 13a is a covering region of the base surface. In the second region $R_2$, the plural island portions 14a are covering regions of the base surface, and the void portion 14b between adjacent ones of the island portions 14a is an exposed region of the base surface. A difference in coverage factor between the first region $R_1$ and the second region $R_2$ is set at 60% or less, preferably, 40% or less, and further preferably, 30% or less. It is also preferable that the pore portions 13a and the island portions 14a be formed to sizes that do not allow them to be visually observed. This allows the transparent conductive layer to be seen as if it covers the first and second regions $R_1$ and $R_2$ in the substantially same manner if the transparent electrode pattern part 13 and the transparent insulating pattern part 14 are compared by visual observation. As a result, the transparent electrode pattern part 13 and the transparent insulating pattern part 14 can be less visible.

It is preferable that the ratio in area covered with the conductive portion 13b be increased in the first region $R_1$. The reason therefor is given as follows. As a coverage factor is reduced, the thickness of the conductive portion 13b should be increased in order to maintain the same conductivity. However, this necessitates increase of the thickness of a film entirely formed in an initial stage in consideration of the case where the film is processed by etching. As a result, cost is increased in inverse proportion to the coverage factor. For example, the cost of material is doubled if the coverage factor is 50%, and is increased by ten times if the coverage factor is 10%. Increasing the thickness of the conductive portion 13b causes an additional problem of deterioration of optical characteristics, or reduction of printing performance if fine patterns are printed by coating with a conductive material. Electrical isolation may occur with a higher probability if the coverage factor is too low. In consideration of these viewpoints, it is preferable that the coverage factor be at least 10% or more. The upper limit of the coverage factor is not specifically defined.

If the coverage factor of the island portions 14a in the second region $R_2$ is too high, formation of a random pattern itself becomes difficult, and the island portions 14a get nearer to each other to result in the fear of electrical short therebetween. Accordingly, it is preferable that the coverage factor of the island portions 14a be 95% or less.

The pore portions 13a and the island portions 14a may be of any shape as long as such a shape does not allow recognition thereof by visual observation and does not have periodicity. For example, one, or two or more shapes in combination, selected from the group consisting of a circular shape, an oval shape, a shape formed by partially cutting off a circular shape, a shape formed by partially cutting off an oval shape, a polygonal shape, a polygonal shape with rounded off corners, and an indefinite shape are applicable. In this regard, recognition of the pore portions 13a and the island portions 14a by visual observation is unavoidable if the size of each of the pore portions 13a and the island portions 14a is too large. Accordingly, it is preferable that a shape with a conductive or non-conductive portion continuously extending 50 μm or more in all directions from an arbitrary point be avoided. For example, if the island portions 14a are formed into a circular shape, it is preferable that the diameter thereof be less than 100 μm. Depending on a distance of visual recognition, it is preferable that a shape with a conductive or non-conductive portion continuously extending 30 μm or more in all directions from an arbitrary point be avoided. The thickness of the first transparent conductive layer may not be uniform depending on a method of forming the transparent conductive element 1. In this case, the aforementioned "coverage factor" may be defined in terms of the volume per unit area of a conductive material.

It is preferable that the absolute value of a difference in reflection L value between the transparent electrode pattern part 13 and the transparent insulating pattern part 14 be less than 0.3, as this allows the transparent electrode pattern part 13 and the transparent insulating pattern part 14 to be less visible.

(Base)

The base 11 can be made of a material such as glass and plastic, for example. Publicly known glass is applicable as the glass, for example. Specific examples of the publicly known glass include soda-lime glass, lead glass, hard glass, quartz glass, and liquid crystallized glass. A publicly known polymeric material is applicable as the plastic, for example. Specific examples of the publicly known polymeric material include triacetylcellulose (TAC), polyester (TPEE), polyethylene terephthalate (PET), polyethylene naphthalate (PEN), polyimide (PI), polyamide (PA), aramid, polyethylene (PE), polyacrylate, polyether sulfone, polysulphone, polypropylene (PP), diacetylcellulose, polyvinyl chloride, acrylic resins (PMMA), polycarbonate (PC), epoxy resins, urea resins, urethane resins, melamine resins, cyclic olefin polymers (COP), and norbornene thermoplastic resins.

It is preferable that the glass base have a thickness of from 20 μm to 10 mm. However, the thickness is not specifically limited to this range. It is preferable that the plastic base have a thickness of from 20 μm to 500 μm. However, the thickness is not specifically limited to this range.

(Transparent Conductive Layer)

Examples of a material for the transparent conductive layer 12 include metal oxides such as indium tin oxide (ITO), zinc oxide, indium oxide, antimony-added tin oxide, fluorine-added tin oxide, aluminum-added zinc oxide, gallium-added zinc oxide, silicon-added zinc oxide, zinc oxide/tin oxide based materials, indium oxide/tin oxide based materials, and zinc oxide/indium oxide/magnesium oxide based materials; metals such as copper, silver, gold, platinum, palladium, nickel, tin, cobalt, rhodium, iridium, iron, ruthenium, osmium, manganese, molybdenum, tungsten, niobium, tantalum, titanium, bismuth, antimony, and lead; and alloys of these metals. Further, a composite material prepared by dispersing a carbon nanotube in a binder material is also applicable. Conductive polymers such as substituted or unsubstituted polyaniline, polypyrrole, polythiophene, and (co) polymers of one or two or more selected from these materials are also applicable. Two or more of these materials cited here may be used in combination.

The transparent conductive layer 12 can be formed by a method such as PVD methods including a sputtering method, a vacuum deposition method, and an ion plating method, a CVD method, a coating method, and a printing method, for example. It is preferable that the transparent conductive layers 12 and 22 have thicknesses appropriately selected such that the surface resistances thereof do not exceed 1000 Ω/sq. in a condition before patterned (condition where the transparent conductive layers 12 and 22 are formed on the entire surface of the bases 11 and 21, respectively).

(Second Transparent Conductive Element)

Figure 4:
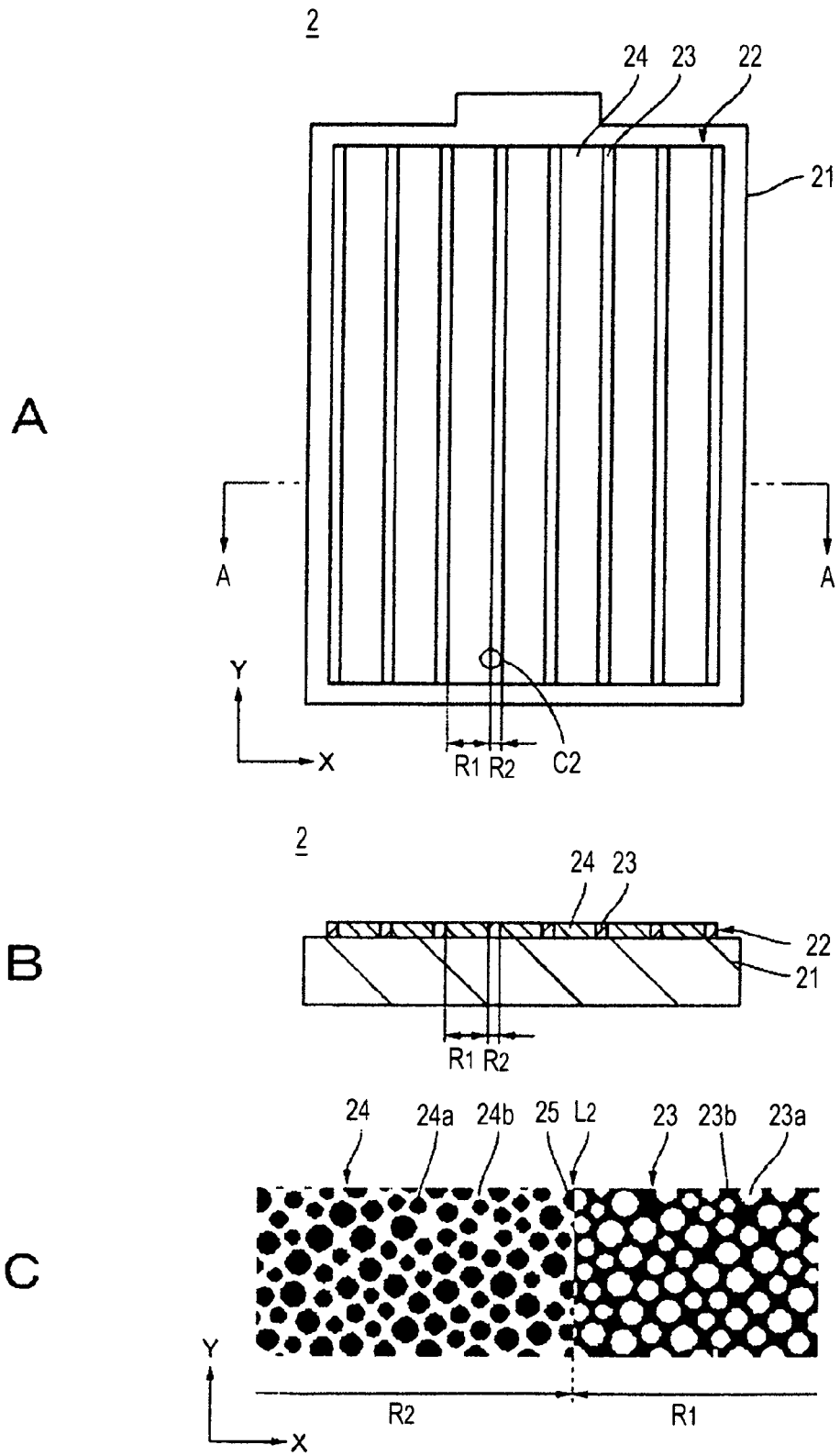
FIG. 4A is a plan view showing an example of the structure of a second transparent conductive element according to the first embodiment of the present technique.
FIG. 4B is a cross-sectional view taken along line A-A of FIG. 4A.
FIG. 4C is a plan view showing a region $C_2$ of FIG. 4A in an enlarged manner.

FIG. 4A is a plan view showing an example of the structure of the second transparent conductive element according to the first embodiment of the present technique. FIG. 4B is a cross-sectional view taken along line A-A of FIG. 4A. FIG. 4C is a plan view showing a region $C_2$ of FIG. 4A in an enlarged manner. As shown in FIGS. 4A and 4B, the second transparent conductive element 2 includes a base 21 having a surface and a transparent conductive layer 22 formed on this surface. The transparent conductive layer 22 includes transparent electrode pattern parts 23 and transparent insulating pattern parts 24. The transparent electrode pattern parts 23 are Y electrode pattern parts extending in the Y axis direction. The transparent insulating pattern parts 24 are what are called dummy electrode pattern parts, and are insulating pattern parts extending in the Y axis direction and placed between the transparent electrode pattern parts 23 to electrically isolate adjacent ones of the transparent electrode pattern parts 23. The transparent electrode pattern parts 23 and the transparent insulating pattern parts 24 are laid alternately on the surface of the base 21 toward the X axis direction. The transparent electrode pattern parts 13 and the transparent insulating pattern parts 14 of the first transparent conductive element 1 are, for example, perpendicular to the transparent electrode pattern parts 23 and the transparent insulating pattern parts 24 of the second transparent conductive element 2. In FIGS. 4A to 4C, regions $R_1$ show regions for formation of the transparent electrode pattern parts 23, and regions $R_2$ show regions for formation of the transparent insulating pattern parts 24.

As shown in FIG. 4C, the transparent electrode pattern part 23 is a transparent conductive layer with plural pore portions 23a randomly formed apart, and a conductive portion 23b is provided between adjacent ones of the pore portions 23a. Further, the transparent insulating pattern part 24 is a transparent conductive layer with plural isolated portion 24a randomly formed apart, and a void portion 24b functioning as an insulating portion is provided between adjacent ones of the island portions 24a. It is preferable that plural inverting portions 25 be randomly formed apart, and at a boundary $L_2$ between the transparent electrode pattern part 23 and the transparent insulating pattern part 24. Except for these described above, the second transparent conductive element 2 is the same as the first transparent conductive element 1.

(Optical Layer)

For example, the optical layer 3 includes a base 31, and a bonding layer 32 provided between the base 31 and the second transparent conductive element 2. The base 31 is bonded through the bonding layer 32 to the surface of the second transparent conductive element 2. This is not the only example of the optical layer 3, but the optical layer 3 may be a ceramic coat (overcoat) made of $SiO_2$, for example.

(Display Device)

The display device 4 to which the information input device 10 is applied is not specifically limited. In this regard, examples thereof may include various display devices such as a liquid crystal display, a CRT (cathode ray tube) display, a plasma display panel (PDP), an electro luminescent (EL) display, and a surface-conduction electron-emitter display (SED).

[Method of Manufacturing Transparent Conductive Element]

An example of a method of manufacturing the first conductive element 1 of the aforementioned structure will next be described by referring to FIGS. 5A to 5D. The second transparent conductive element 2 can be manufactured in the same manner as the first transparent conductive element 1, so that the method of manufacturing the second transparent conductive element 2 will not be described.

(Step of Depositing Transparent Conductive Layer)

First, the transparent conductive layer 12 is formed on the surface of the base 11 as shown in FIG. 5A. The base 11 may be heated when the transparent conductive layer 12 is formed. The transparent conductive layer 12 may be formed by methods including, for example, CVD methods (chemical vapor deposition: technique of depositing a thin film from a gas phase by means of chemical reaction) such as thermal CVD, plasma CVD, and optical CVD, and PVD methods (physical vapor deposition: technique of forming a thin film by condensing a material physically vaporized in vacuum on a base) such as vacuum deposition, plasma-assisted deposition, sputtering, and ion plating. Next, if necessary, the transparent conductive layer 12 is subjected to annealing treatment. As a result, the transparent conductive layer 12 is formed into a mixture in an amorphous and polycrystalline condition or into a polycrystalline condition to enhance the conductivity of the transparent conductive layer 12.

(Step of Depositing Resist Layer)

Next, a resist layer 41 is formed on a surface of the transparent conductive layer 12 as shown in FIG. 5B. The resist layer 41 has opening portions 33 provided at positions corresponding to the aforementioned pore portions 13a and the void portion 14b. Both an organic resist and an inorganic resist are applicable as a material for the resist layer 41. A novolac resist and a chemically amplified resist are applicable as the organic resist, for example. A metal compound composed of one or two or more transition metals is applicable as the inorganic resist, for example.

(Developing Step)

Next, as shown in FIG. 5C, the transparent conductive layer 12 is subjected to etching treatment by using the resist layer 41 with the plural opening portions 33 functioning as an etching mask. As a result, the pore portions 13a and the conductive portion 13b are formed in the transparent conductive layer 12 in the first region $R_1$. Further, the island portions 14a and the void portion 14b are formed in the transparent conductive layer 12 in the second region $R_2$. Both drying etching and wet etching are applicable as the etching. In this regard, it is preferable that wet etching be employed as wet etching is realized in a simple facility.

(Step of Peeling Resist Layer)

Next, as shown in FIG. 5D, the resist layer 41 formed on the transparent conductive layer 12 is peeled, for example, by ashing.

As a result, the target first transparent conductive element 1 can be obtained.

[Method of Generating Random Pattern]

A method of generating a random pattern to form the pore portions 13a and 23a, and the island portions 14a and 24a will be described below. Random patterns to be generated will be described here so as to have a circular shape, for example. However, this is not the only shape of the random patterns.

(Basic Algorithm for Random Pattern Generation)

The radii of circles are changed randomly within a set range, and the center coordinates of the circles are calculated and the circles are arranged such that adjacent ones of the circles are always in contact with each other, thereby generating patterns satisfying both randomness in arrangement and high-density filling. The algorithm descried below realizes high-density patterns all of which are arranged randomly by a small amount of calculation.

(1) Circles of "radii randomly determined within a certain range" are aligned on the X axis so as to be in contact with each other.

(2) "Circles of random radii" are determined, and are stacked in order from below such that they are in contact with existing two circles but do not overlap with a different circle.

Parameters used in generating random patterns are given below:

$X_{max}$: Maximum X-coordinate value of a region where a circle is to be formed $Y_{max}$: Maximum Y-coordinate value of a region where a circle is to be formed $R_{min}$: Minimum radius of a circle to be formed $R_{max}$: Maximum radius of a circle to be formed $R_{fill}$: Minimum radius of a circle provided subsidiarily to increase a filling factor Rnd: Random number value obtained in a range of from 0.0 to 1.0

$P_n$: Circle defined by an X-coordinate value $x_n$, Y-coordinate value $y_n$, and a radius $r_n$ (1) Circles of "radii randomly determined within a certain range" are aligned on the X axis so as to be in contact with each other.

Parameters to be used are given below:

$X_{max}$: Maximum X-coordinate value of a region where a circle is to be formed $Y_w$: Setting of the maximum possible Y-coordinate value when a circle is arranged on the X axis $R_{min}$: Minimum radius of a circle to be formed $R_{max}$: Maximum radius of a circle to be formed Rnd: Random number value obtained in a range of from 0.0 to 1.0

Figure 6:
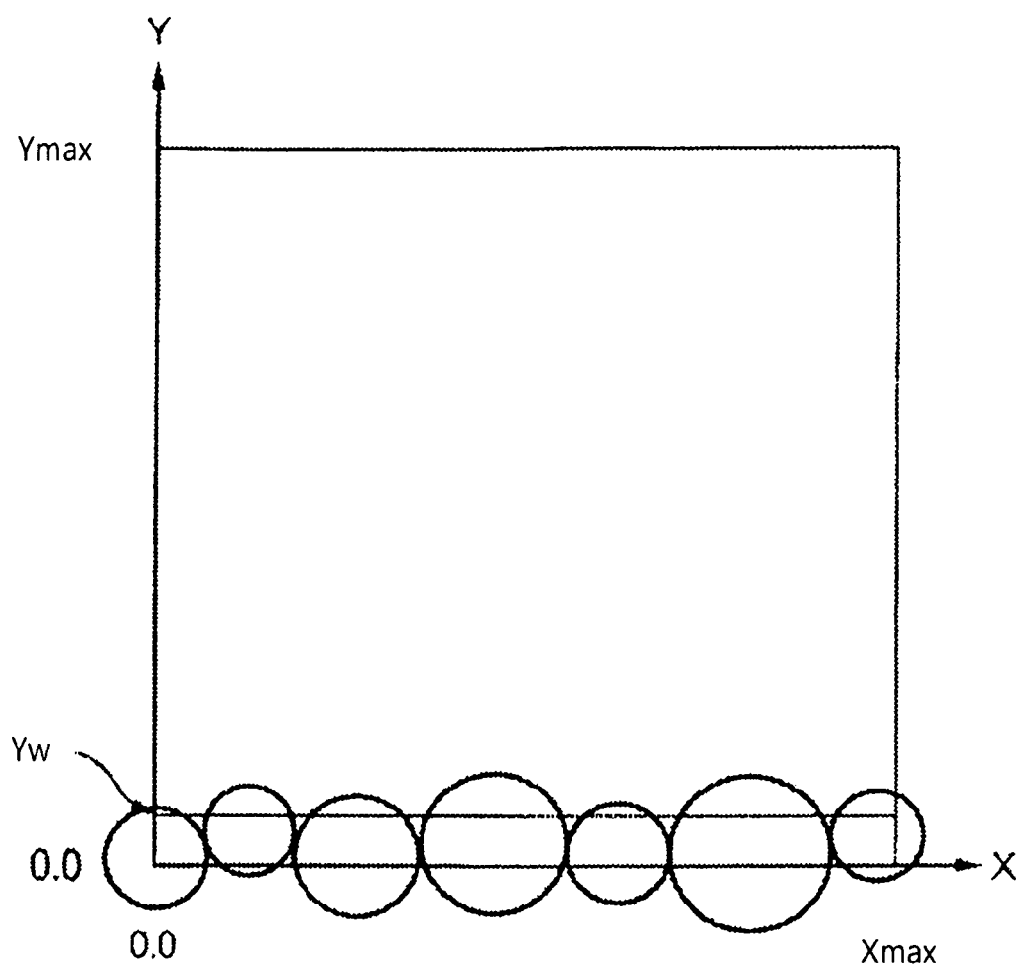
FIG. 6 is a simplified diagram describing an algorithm for random pattern generation.

$P_n$: Circle defined by an X-coordinate value $x_n$, Y-coordinate value $y_n$, and a radius $r_n$ As shown in FIG. 6, circles of Y-coordinate values randomly determined within a range of from 0.0 on the X axis to about the value of $R_{min}$ and of radii randomly determined within a range of from $R_{min}$ to $R_{max}$ are placed repeatedly so as to be in contact with existing circles, thereby arranging the circles randomly in a line on the X axis.

Figure 7:
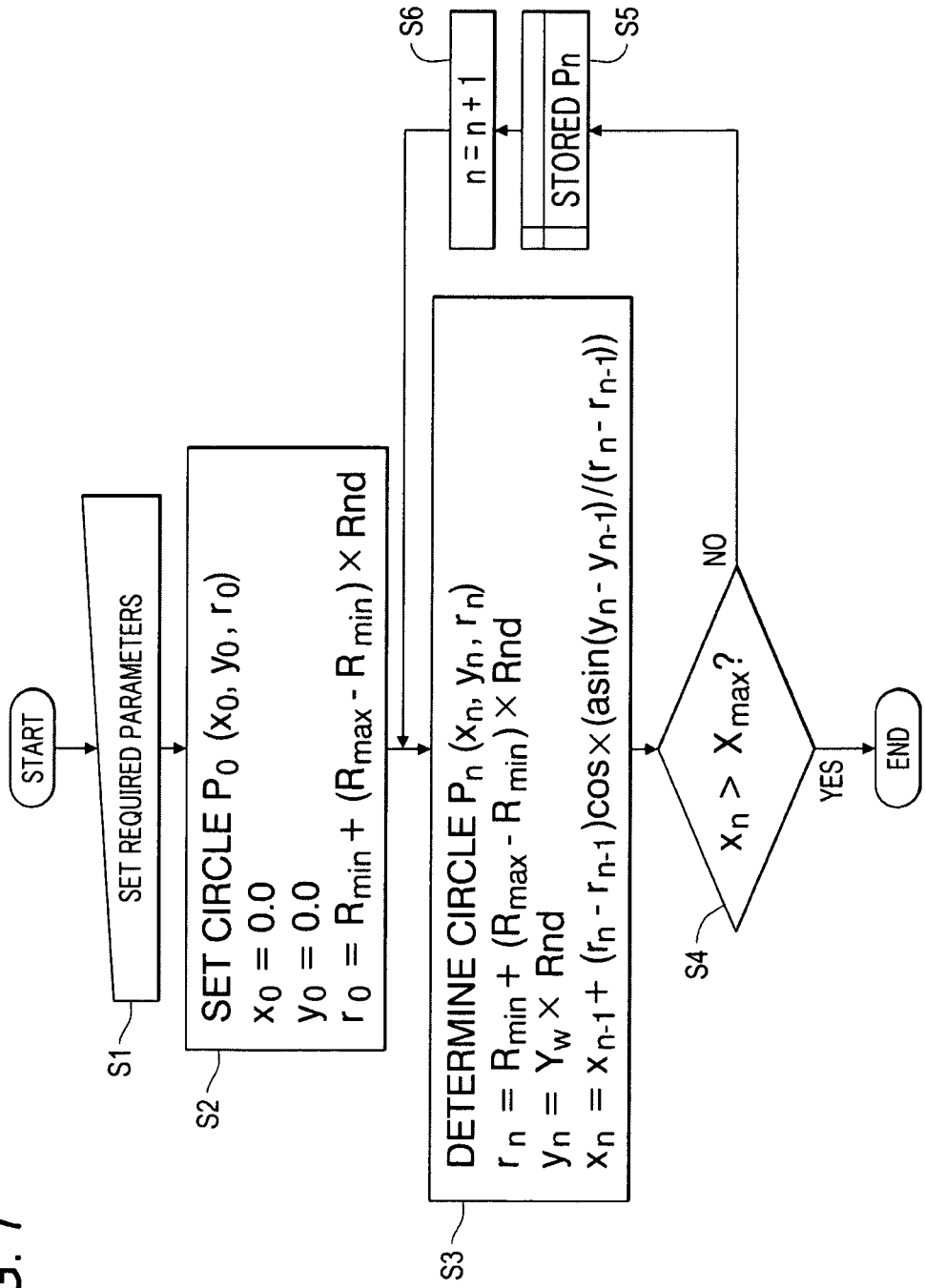
FIG. 7 is a flowchart describing the algorithm for random pattern generation.

The algorithm will be described below by using the flowchart of FIG. 7.

First, in step S1, required parameters are set. Next, in step S2, a circle $P_0$ ($x_0$, $y_0$, $r_0$) is set as follows:

$x_0=0.0$ $y_0=0.0$ $r_0=R_{min}+(R_{max}-R_{min})\times Rnd$

Next, in step S3, a circle $P_n$ ($x_n$, $y_n$, $r_n$) is determined by the following formulas:

$r_n=R_{min}(R_{max}-R_{min})\times Rnd$ $y_n=Y_w\times Rnd$ $x_n=x_{n-1}+(r_n-r_{n-1})\times\cos(a\sin(y_n-y_{n-1})/(r_n-r_{n-1}))$ Then, in step S4, it is determined if $X_n$ is greater than $X_{max}$. If it is determined in step S4 that $X_n$ is greater than $X_{max}$, the process is finished. If it is determined in step S4 that $X_n$ is not greater than $X_{max}$, the process proceeds to step S5. The circle $P_n$ ($x_n$, $y_n$, $r_n$) is stored in step S5. Next, in step S6, the value of n is incremented, and the process shifts to step S3.

(2) "Circles of random radii" are determined, and are stacked in order from below such that they are in contact with existing two circles but do not overlap a different circle.

Parameters to be used are given below:

$X_{max}$: Maximum X-coordinate value of a region where a circle is to be formed $Y_{max}$: Maximum Y-coordinate value of a region where a circle is to be formed $R_{min}$: Minimum radius of a circle to be formed $R_{max}$: Maximum radius of a circle to be formed $R_{fill}$: Minimum radius of a circle provided subsidiarily to increase a filling factor Rnd: Random number value obtained in a range of from 0.0 to 1.0

Figure 8:
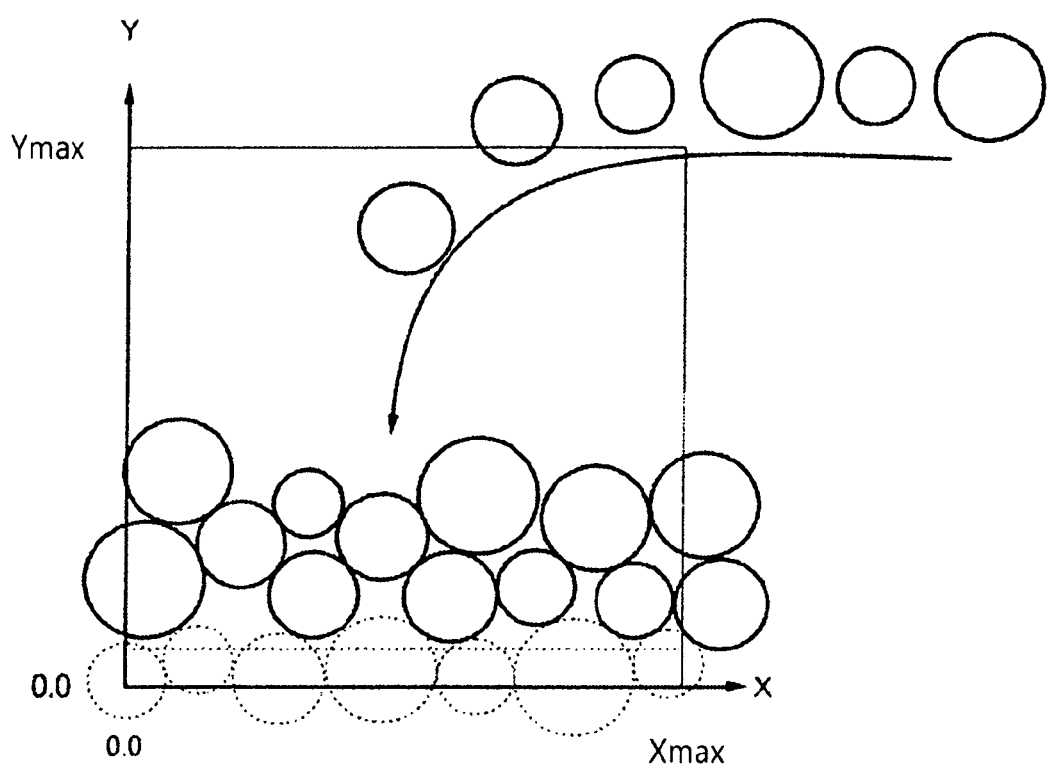
FIG. 8 is a simplified diagram describing the algorithm for random pattern generation.

$P_n$: Circle defined by an X-coordinate value $x_n$, Y-coordinate value $y_n$, and a radius $r_n$ As shown in FIG. 8, based on the circles determined in (1) and arranged in a line on the X axis, circles of random radii are determined in a range of from $R_{min}$ to $R_{max}$, and are arranged and stacked in the order of increasing Y-coordinates so as to be in contact with different circles. Further, $R_{fill}$ smaller than $R_{min}$ is set. Only if a gap that cannot be filled with the determined circles is generated, the gap is filled to increase a filling factor. If a circle having a radius smaller than $R_{min}$ is not used, $R_{fill}$ is set to be the same as $R_{min}$.

Figure 9:
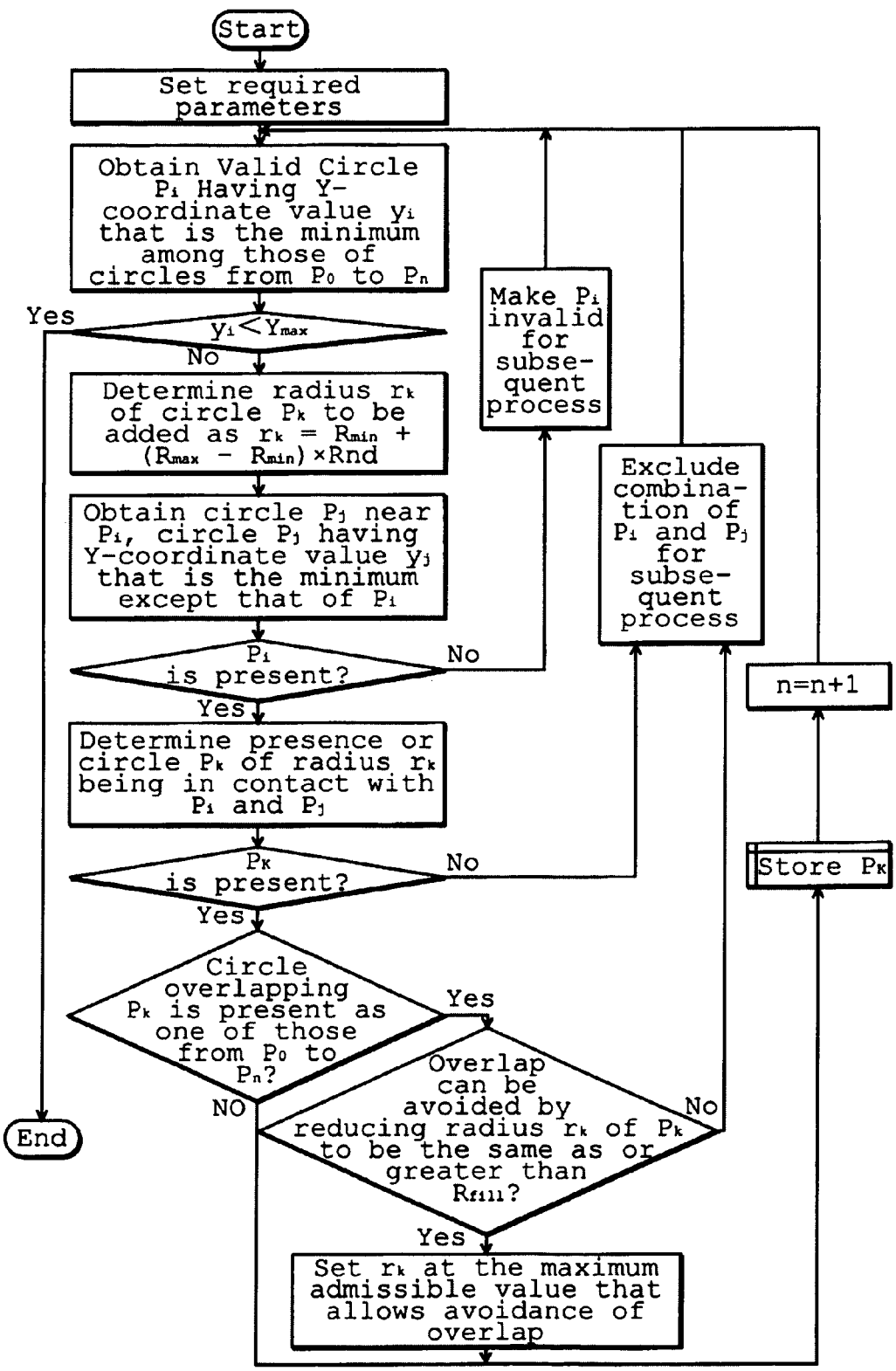
FIG. 9 is a flowchart describing the algorithm for random pattern generation.

The algorithm will be described below by using the flowchart of FIG. 9.

First, in step S11, required parameters are set. Next, in step S12, a circle $P_i$ is obtained having a Y-coordinate value $y_i$ that is the minimum among those of circles from $P_0$ to $P_n$. Then, in step S13, it is determined if $y_i$ is smaller than $Y_{max}$. If it is determined in step S13 that $y_i$ is smaller than $Y_{max}$, the process is finished. If it is determined in step S13 that $y_i$ is not smaller than $Y_{max}$, a radius $r_k$ of a circle $P_k$ to be added is determined as $r_k=R_{min}+(R_{max}-R_{min}) \times Rnd$ in step S14. Next, in step S15, a circle $P_j$ having a Y-coordinate value $y_j$ that is the minimum except that of the circle $P_i$ is obtained near the circle $P_i$.

Figure 10:
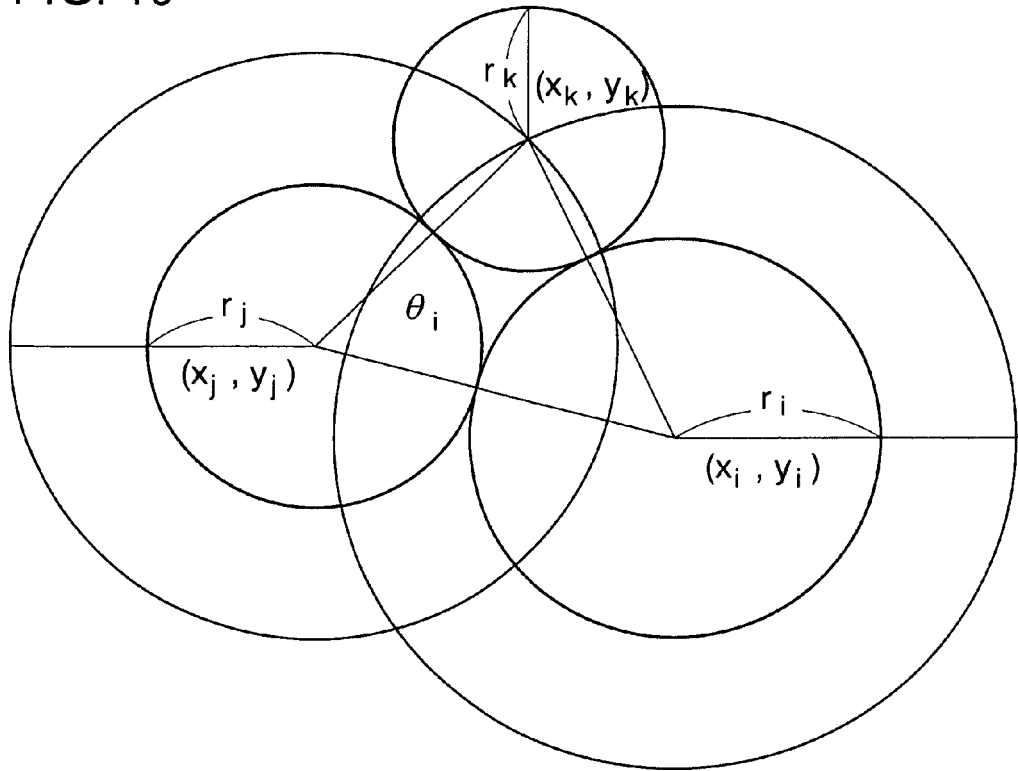
FIG. 10 is a simplified diagram describing the algorithm for random pattern generation.

Next, in step S16, it is determined if the minimum circle $P_i$ is present. If it is determined in step S16 that the minimum circle $P_i$ is not present, $P_i$ is made invalid in step S17 for subsequent process. If it is determined in step S16 that the minimum circle $P_i$ is present, the presence of a circle $P_k$ of a radius $r_k$ being in contact with the circles $P_i$ and $P_j$ is determined in step S18. FIG. 10 shows how coordinates are obtained if a circle of an arbitrary radius is arranged so as to be in contact with two circles in contact with each other.

Then, it is determined in step S19 if the circle $P_k$ of the radius $r_k$ being in contact with the circles $P_i$ and $P_j$ is present. If it is determined in step S19 that the circle $P_k$ is not present, a combination of the circles $P_i$ and $P_j$ is excluded in step S20 for subsequent process. If it is determined in step S19 that the circle $P_k$ is present, it is determined in step S21 if a circle overlapping with the circle $P_k$ is present as one of the circles from $P_0$ to $P_n$. If it is determined in step S21 that such an overlapping circle is not present, the circle $P_k$ ($x_k$, $y_k$, $r_k$) is stored in step S24. Then, in step S25, the value of n is incremented, and the process shifts to step S12.

If it is determined in step S21 that such an overlapping circle is present, it is determined in step S22 if the overlap can be avoided by reducing the radius $r_k$ of the circle $P_k$ to be the same as or greater than $R_{fill}$. If it is determined in step S22 that the overlap is unavoidable, the combination of the circles $P_i$ and $P_j$ is excluded in step S20 for subsequent process. If it is determined in step S22 that the overlap is avoidable, the radius $r_k$ is set at the maximum possible value that allows avoidance of the overlap. Next, the circle $P_k$ ($x_k$, $y_k$, $r_k$) is stored in step S24. Then, in step S25, the value of n is incremented, and the process shifts to step S12.

FIG. 11A is a view schematically showing the concept of the method of generating random patterns. FIG. 11B is a view showing an example of generation of random patterns with the area ratio of circles of 80%. As shown in FIG. 11A, high-density patterns without regularity can be generated by changing the radii of circles randomly within a set range and stacking these circles. The absence of regularity of the pattern makes it possible to avoid a negative effect such as generation of moire in the information input device 10, for example.

FIG. 12A is a view showing an example where radii of circles are made smaller than generated patterns. FIG. 12B is a view showing an example where patterns are composed of squares with rounded off corners. If graphic objects smaller than generated circles are created inside the circles, all resultant patterns isolated from each other can be formed (FIG. 12A). The transparent electrode pattern parts 13 and 23, and the transparent insulating pattern parts 14 and 24, can be formed by using these isolated patterns. If arbitrary graphic objects are created inside resultant patterned circles, tendency of the patterns can be changed, or a ratio of an occupied area can be controlled (FIG. 12B). Examples of the shape of a graphic object created inside a circle include a circle, an oval, a polygon, a polygon with rounded off corners, and an indefinite shape. Polygons with rounded off corners are shown in the example of FIG. 12B.

(Modifications)

Modifications of the first and second transparent conductive elements according to the first embodiment will next be described.

(Boundary)

FIG. 13A is a plan view showing a boundary and its vicinity in an enlarged manner between the transparent electrode pattern part and the transparent insulating pattern part of the first transparent conductive element. FIG. 13B is a plan view showing a boundary and its vicinity in an enlarged manner between the transparent electrode pattern part and the transparent insulating pattern part of the second transparent conductive element. As shown in FIG. 13A, it is preferable that the shape of the boundary $L_1$ between the transparent electrode pattern part and the transparent insulating pattern part of the first transparent conductive element be obtained by combining parts of the shapes of the pore portions 13a and parts of the shapes of the island portions 14a. This allows the boundary $L_1$ to have a random shape. As shown in FIG. 13B, it is preferable that the shape of the boundary $L_2$ between the transparent electrode pattern part and the transparent insulating pattern part of the second transparent conductive element be obtained by combining parts of the shapes of the pore portions 23a and parts of the shapes of the island portions 24a. This allows the boundary $L_2$ to have a random shape.

(Forming Surfaces of Conductive Pattern Part and Non-Conductive Pattern Part)

Figure 14:
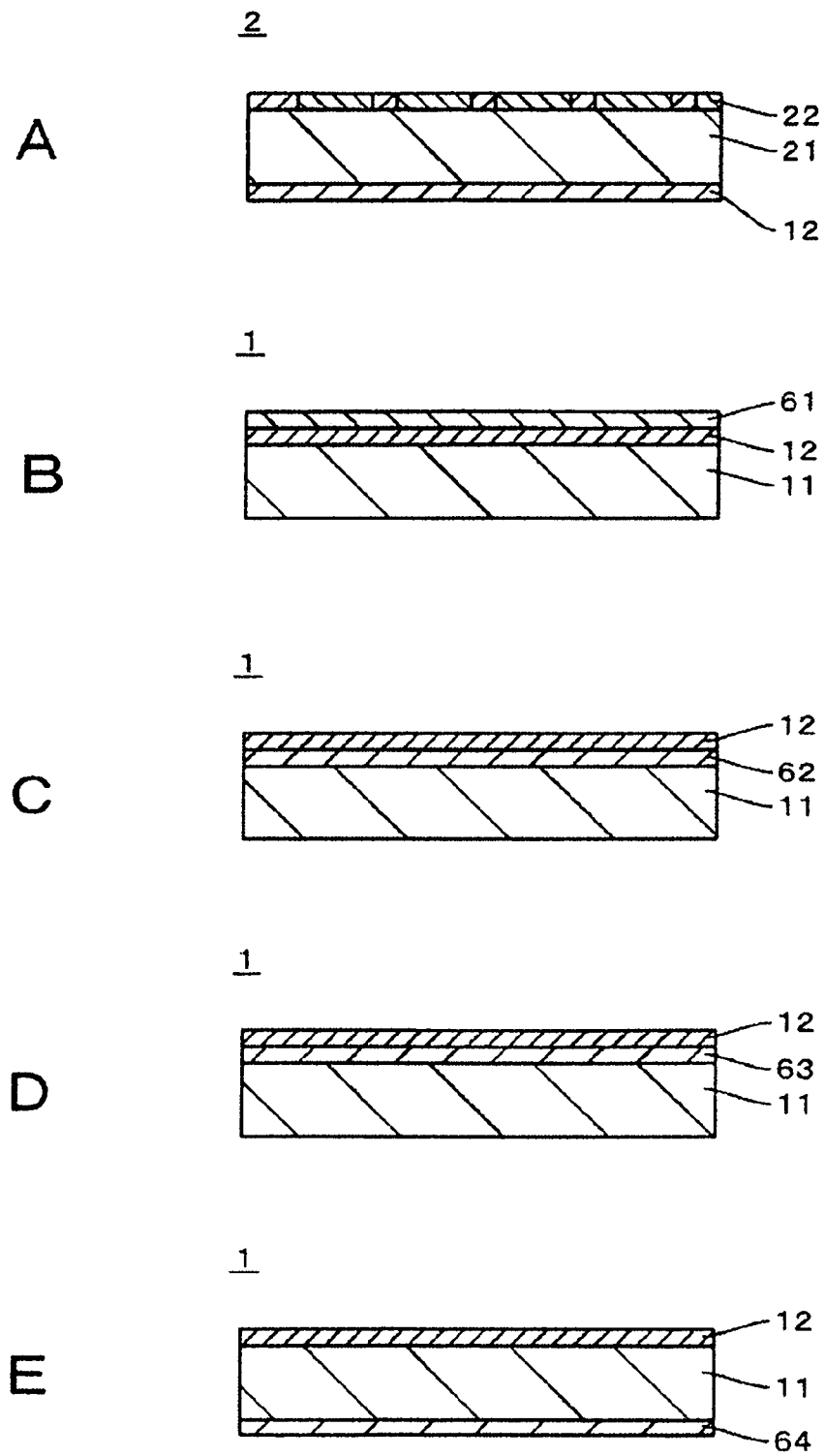
FIGS. 14A to 14E are cross-sectional views showing modifications of the first transparent conductive element and the second transparent conductive element according to the first embodiment of the present technique.

As shown in FIG. 14A, the transparent conductive layer 12 may be formed on one surface of the base 21 of the second transparent conductive element 2, and the transparent conductive layer 22 may be formed on the opposite surface thereof. In this case, formation of the base 11 can be omitted in the information input device 10 of FIG. 1.

(Hard Coat Layer)

As shown in FIG. 14B, a hard coat layer 61 may be formed at least on one of opposite surfaces of the first transparent conductive element 1. In this case, if a plastic base is used as the base 11, the base 11 can be protected from a flaw to be generated during the steps, and can be given a chemical resistance, and deposition of a low-molecular-weight substance such as an oligomer can be suppressed. It is preferable that an ionizing radiation curable resin cured with light or an electron beam, or a thermosetting resin cured with heat, be used as a hard coating material. A photosensitive resin cured with an ultraviolet ray is the most preferable resin. Examples of the photosensitive resin include acrylate resins such as urethane acrylate, epoxy acrylate, polyester acrylate, polyol acrylate, polyether acrylate, and melamine acrylate. For example, an urethane acrylate resin is obtained by making an isocyanate monomer or a prepolymer react with polyester polyol, and making an acrylate or methacrylate monomer having a hydroxyl group react with a resultant product. It is preferable that the hard coat layer 61 have a thickness of from 1 μm to 20 μm. However, the thickness is not specifically limited to this range.

The hard coat layer 61 is formed by coating the base 11 with a coating material for hard coating. The coating method is not specifically limited, and publicly known coating methods are applicable. Examples of the publicly known coating methods include a micro gravure coating method, a wire bar coating method, a direct gravure coating method, a die coating method, a dipping method, a spray coating method, a reverse roll coating method, a curtain coating method, a comma coating method, a knife coating method, and a spin coating method. The coating material for hard coating contains a resin raw material such a monomer and/or an oligomer having two functional groups or more, a photopolymerization initiator, and a solvent. The coating material for hard coating applied on the base 11 is dried to volatilize the solvent. Then, ionizing radiation or heat is applied to cure the coating material for hard coating dried on the base 11. Note that the hard coat layer 61 may be formed at least on one of opposite surfaces of the second transparent conductive element 2 in the same manner as the first transparent conductive element 1.

(Optical Controlling Layer)

As shown in FIG. 14C, it is preferable that an optical controlling layer 62 be placed between the base 11 and the transparent conductive layer 12 of the first transparent conductive element 1. This can assist in making the pattern shape of the transparent electrode pattern part 13 invisible. The optical controlling layer 62 is composed of a stacked structure with two or more layers having different indexes of refraction, for example, and the transparent conductive layer 12 is formed near a layer of a low index of refraction. As a more specific example, a conventionally and publicly known optical controlling layer can be used as the optical controlling layer 62. Examples of such an optical controlling layer include those described in Japanese Patent Application Laid-Open Nos. 2008-98169, 2010-15861, 2010-23282, and 2010-27294. Like in the first transparent conductive element 1, the optical controlling layer 62 may be placed between the base 21 and the transparent conductive layer 22 of the second transparent conductive element 2.

(Adhesion Assisting Layer)

As shown in FIG. 14D, it is preferable that an adhesion assisting layer 63 be provided as a foundation layer for the transparent conductive layer 12 of the first transparent conductive element 1. This can increase the adhesion of the transparent conductive layer 12 with respect to the base 11. Examples of a material for the adhesion assisting layer 63 include polyacrylic resins, polyamide resins, polyamide-imide resins, polyester resins, chlorides and peroxides of metal elements, and hydrolysis products and dehydrated and condensed products of such as alkoxides.

Instead of using the adhesion assisting layer 63, a surface on which the transparent conductive layer 12 is to be provided may be subjected to discharge treatment such as glow discharge and corona discharge. The surface on which the transparent conductive layer 12 is to be provided may also be treated with a chemical agent such as acid and alkali. After the transparent conductive layer 12 is provided, adhesion may be increased by calendaring process. Like in the first transparent conductive element 1, the adhesion assisting layer 63 may be provided, or the aforementioned treatment for increasing adhesion may be performed in the second transparent conductive element 2.

(Shielding Layer)

As shown in FIG. 14E, it is preferable that a shielding layer 64 be formed on the first transparent conductive element 1. For example, a film with the shielding layer 64 may be bonded through a transparent sticky agent layer to the first transparent conductive element 1. If an X electrode pattern and a Y electrode pattern are formed on the same side of a single base 11, the shielding layer 64 may be formed directly on the opposite side. The shielding layer 64 can be made of the same material as the transparent conductive layer 12. The shielding layer 64 can be formed by the same method as the transparent conductive layer 12. In this regard, the shielding layer 64 is not patterned but is used while it is formed entirely on a surface of the base 11. Forming the shielding layer 64 on the first transparent conductive element 1 reduces noise due to electromagnetic waves generated from the display device 4 and the like, so that position detection of the information input device 10 can be achieved with a higher degree of accuracy. Like the first transparent conductive element 1, the shielding layer 64 may be formed in the second transparent conductive element 2.

2. Second Embodiment

A second embodiment according to the present technique differs from the first embodiment in that a printing method is used in place of the etching method to form a first transparent conductive element 1 and a second transparent conductive element 2. The second transparent conductive element 2 can be formed in the same manner as the first transparent conductive element 1, so that the method of manufacturing the second transparent conductive element 2 will not be described.

[Master]

FIG. 15A is a perspective view showing an example of the shape of a master used in a method of manufacturing the first transparent conductive element according to the second embodiment of the present technique. FIG. 15B is a plan view showing part of a first region $R_1$ and part of a second region $R_2$ of FIG. 15A in an enlarged manner. For example, the master 100 is a roll master having a cylindrical surface functioning as a transferring surface, and the first and second regions $R_1$ and $R_2$ are laid alternately in the cylindrical surface. Plural pore portions 113a in the shape of recesses are formed apart in the first region $R_1$. The pore portions 113a are isolated through a projecting portion 113b. The pore portions 113a are provided to form pore portions 13a of a transparent electrode pattern part 13 by printing, and the projecting portion 113b is provided to form conductive portion 13b of the transparent electrode pattern part 13 by printing. Plural island portions 114a in the shape of projections are formed apart in the second region $R_2$. The island portions 114a are isolated through a recessed portion 114b. The island portions 114a are provided to form island portions 14a of a transparent insulating pattern part 14 by printing, and the recessed portion 114b is provided to form a void portion 14b of the transparent insulating pattern part 14 by printing.

[Method of Manufacturing Transparent Conductive Element]

An example of the method of manufacturing the first transparent conductive element according to the second embodiment of the present technique will be described by referring to FIGS. 16A and 16B.

Figure 16:
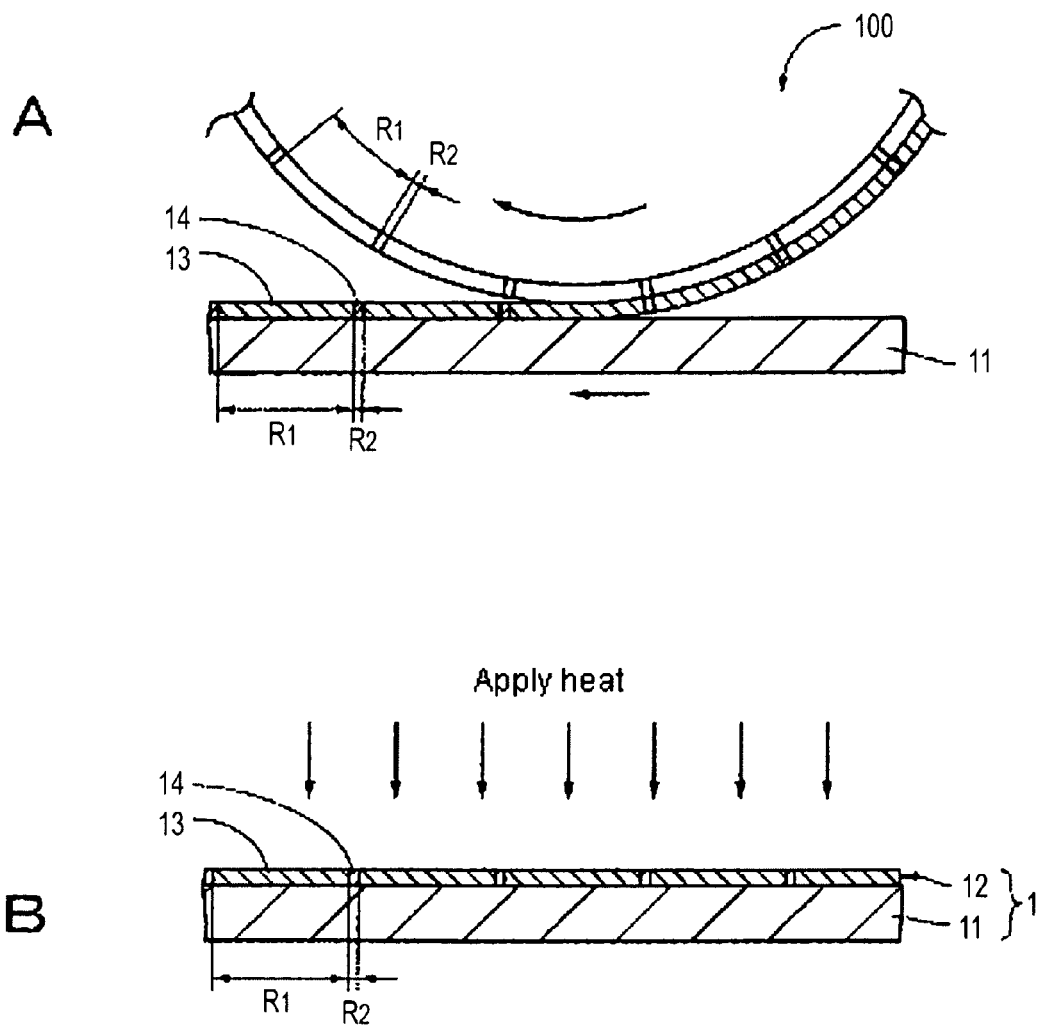
FIGS. 16A and 16B are process diagrams describing an example of a method of manufacturing the first conductive element according to the second embodiment of the present technique.

First, as shown in FIG. 16A, a conductive ink is applied to the transferring surface of the master 100, and the applied conductive ink is printed on a surface of a base 11. Examples of applicable printing methods include screen printing, waterless planographic printing, flexographic printing, gravure printing, gravure offset printing, and reverse offset printing. Next, as shown in FIG. 16B, the conductive ink printed on the surface of the base 11 is heated, if necessary, thereby drying and/or sintering the conductive ink. As a result, the target first transparent conductive element 1 can be obtained.

3. Third Embodiment

Structure of Transparent Conductive Element

A first transparent conductive element 1 and a second transparent conductive element 2 of a third embodiment will be described. In the description below, the first transparent conductive element 1 and the second and transparent conductive element 2 will be referred to as the transparent conductive element 1 and the transparent conductive element 2, respectively, where appropriate.

Figure 17:
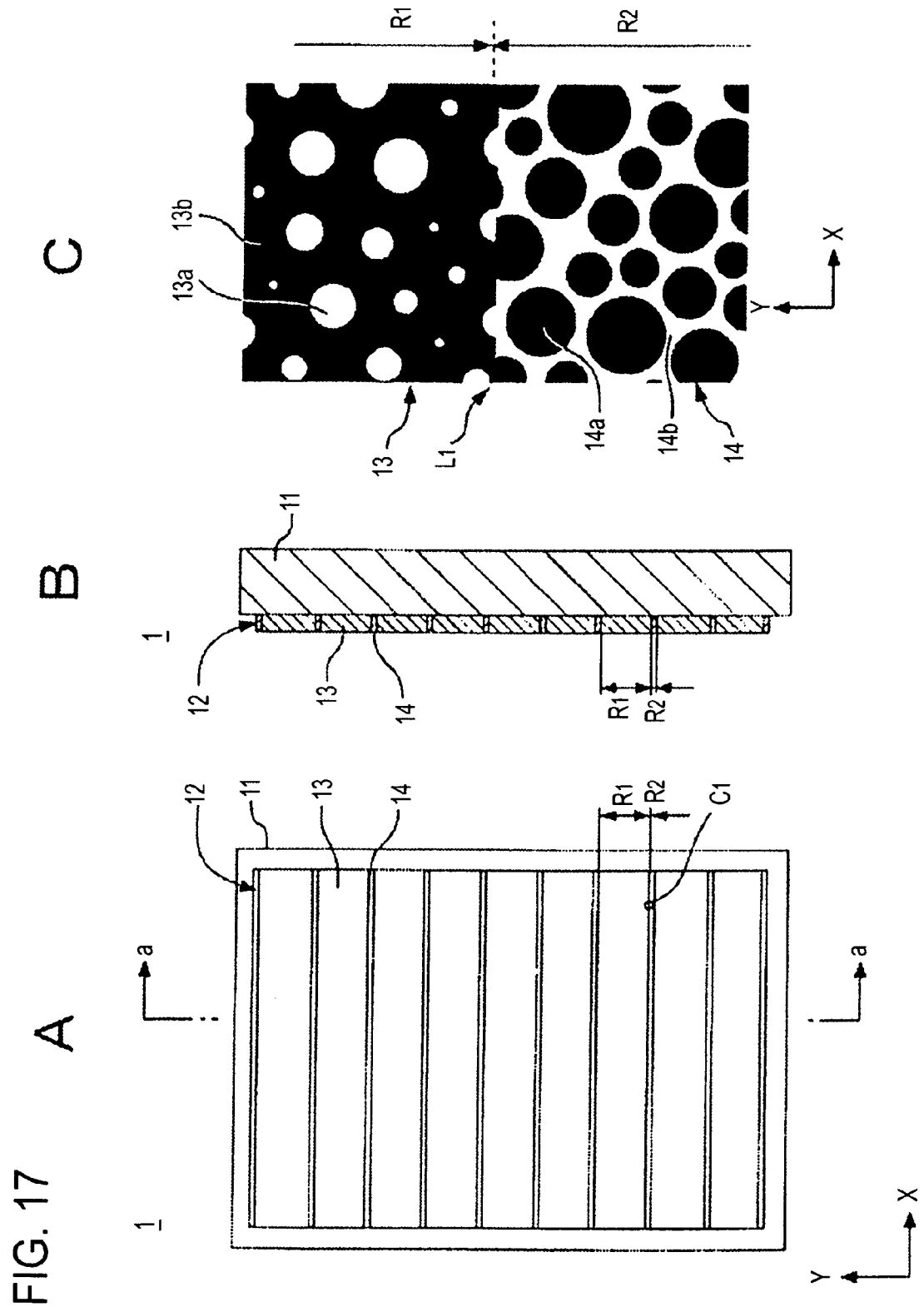
FIG. 17A is a plan view showing an example of the structure of a first transparent conductive element according to a third embodiment of the present technique.
FIG. 17B is a cross-sectional view taken along line a-a of FIG. 17A.
FIG. 17C is a plan view showing a region $C_1$ of FIG. 17A in an enlarged manner.

The transparent conductive element 1 forming an X electrode will be described first by using FIGS. 17A to 18B. FIG. 17A is a plan view showing an example of the structure of the transparent conductive element. FIG. 17B is a cross-sectional view taken along line a-a of FIG. 17A. FIG. 17C is a plan view showing a region $C_1$ of FIG. 17A in an enlarged manner.

As shown in FIGS. 17A and 17B, the transparent conductive element 1 includes a base 11 having a surface and a transparent conductive layer 12 formed on this surface. The transparent conductive layer 12 includes transparent electrode pattern parts 13 and transparent insulating pattern parts 14. The transparent electrode pattern parts 13 are X electrode pattern parts extending in an X axis direction. The transparent insulating pattern parts 14 are what are called dummy electrode pattern parts, and are insulating pattern parts extending in the X axis direction and placed between the transparent electrode pattern parts 13 to electrically isolate adjacent ones of the transparent electrode pattern parts 13. The transparent electrode pattern parts 13 and the transparent insulating pattern parts 14 are laid alternately on the surface of the base 11 toward a Y axis direction. In FIGS. 17A to 17C, regions $R_1$ show regions (electrode regions) for formation of the transparent electrode pattern parts 13, and regions $R_2$ show regions (insulating regions) for formation of the transparent insulating pattern parts 14.

It is preferable that the transparent electrode pattern parts 13 and the transparent insulating pattern parts 14 have shapes appropriately selected according to the shape of a screen or a driving circuit, for example. A linear shape, and a shape formed by coupling a plurality of rhombus shapes (diamond shapes) in a linear fashion are applicable, for example. However, the shapes of the transparent electrode pattern parts 13 and the transparent insulating pattern parts 14 are not specifically limited to these shapes. In the example of the third embodiment, the transparent electrode pattern parts 13 and the transparent insulating pattern parts 14 have a linear shape. An example of a diamond-shaped pattern will be described later as a fourth embodiment.

As shown in FIG. 17C, the transparent electrode pattern part 13 is a transparent conductive layer with plural pore portions 13a randomly formed apart, and a conductive portion 13b is provided between adjacent ones of the pore portions 13a. The conductive portion 13b is a conductive material portion where the surface of the base 11 is covered with a conductive material, and the pore portions 13a are non-conductive portions not covered with the conductive material. Thus, in the transparent electrode pattern part 13, plural non-conductive portions (pore portions 13a) are randomly formed apart within a forming surface of the conductive material portion (conductive portion 13b).

Further, the transparent insulating pattern part 14 is a transparent conductive layer with plural island portions 14a randomly formed apart, and a void portion 14b functioning as an insulating portion is provided between adjacent ones of the island portions 14a. The island portions 14a are conductive material portions where the surface of the base 11 is not covered with a conductive material, and the void portion 14b is a non-conductive portion not covered with the conductive material. Thus, in the transparent insulating pattern part 14, the conductive material portions (island portions 14a) are formed randomly to be isolated within a forming surface of the non-conductive portion (void portion 14b).

In the present embodiment, the transparent electrode pattern part 13 and the transparent insulating pattern part 14 are formed of different random patterns. More specifically, a random pattern formed at a boundary between a conductive material portion and a non-conductive portion is a random pattern differing between the transparent electrode pattern part 13 and the transparent insulating pattern part 14. Different random patterns are formed by arranging a conductive material portion and a non-conductive portion based on random patterns generated under different conditions of generation. To be specific, a random pattern for the transparent electrode pattern part 13 is formed, and then the pore portions 13a and the conductive portion 13b are formed based on the random pattern thereby formed. Further, a random pattern for the transparent insulating pattern part 14 is formed, and then the island portions 14a and the void portion 14b are formed based on the random pattern thereby formed.

It is preferable that the conductive material be removed completely in the void portion 14b of the transparent insulating pattern part 14. In this regard, part of the conductive material may remain in the shape of an island or a thin film within a range that allows the void portion 14b to function as an insulating portion. It is preferable that the pore portions 13a and the island portions 14a have random structures with no periodicity. If the pore portions 13a and the island portions 14a are formed to have periodic structures on the order of microns or less, the pore portions 13a and the island portions 14a themselves tend to generate interfering light, or generate moire if it is visually observed while an information input device 10 is arranged on a display surface of a display device 4.

FIG. 18A is a plan view showing a boundary and its vicinity in an enlarged manner between the transparent electrode pattern part and the transparent insulating pattern part. FIG. 18B is a cross-sectional view taken along line b-b of FIG. 18A. As shown in FIG. 18B, the conductive portion 13b and the island portions 14a are portions where the base 11 is covered with the conductive material from above, and the pore portions 13a and the void portion 14b are portions where the conductive material is removed to expose the base surface.

As seen from FIG. 18A, the transparent electrode pattern part 13 and the transparent insulating pattern part 14 have different random patterns for formation of the conductive material portions and the non-conductive portions thereof. A boundary $L_1$ is in a condition formed by simply cutting the two types of random patterns as they are and bonding these patterns together. As a result, boundaries between the conductive material portions and the non-conductive portions become irregular near the boundary $L_1$, so that the boundary $L_1$ can be less visible.

Figure 19:
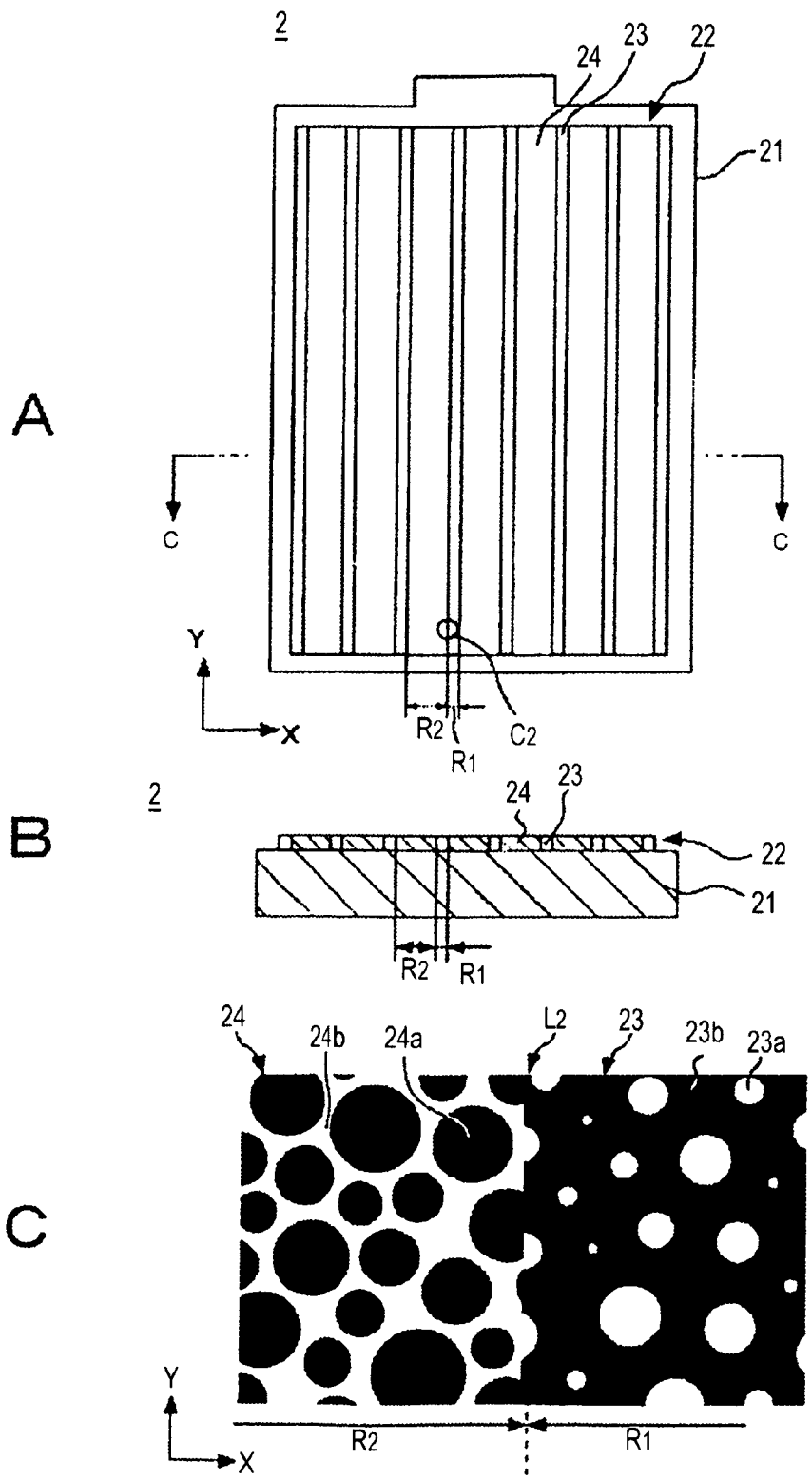
FIG. 19A is a plan view showing an example of the structure of a second transparent conductive element according to the third embodiment of the present technique.
FIG. 19B is a cross-sectional view taken along line c-c of FIG. 19A.
FIG. 19C is a plan view showing a region $C_2$ of FIG. 19A in an enlarged manner.

FIG. 19 shows a transparent conductive element forming a Y electrode. FIG. 19A is a plan view showing an example of the structure of the transparent conductive element. FIG. 19B is a cross-sectional view taken along line c-c of FIG. 19A. FIG. 19C is a plan view showing a region $C_2$ of FIG. 19A in an enlarged manner.

As shown in FIGS. 19A and 19B, the transparent conductive element 2 includes a base 21 having a surface and a transparent conductive layer 22 formed on this surface. The transparent conductive layer 22 includes transparent electrode pattern parts 23 and transparent insulating pattern parts 24. The transparent electrode pattern parts 23 are Y electrode pattern parts extending in the Y axis direction. The transparent insulating pattern parts 24 are what are called dummy electrode pattern parts, and are insulating pattern parts extending in the Y axis direction and placed between the transparent electrode pattern parts 23 to electrically isolate adjacent ones of the transparent electrode pattern parts 23. The transparent electrode pattern parts 23 and the transparent insulating pattern parts 24 are laid alternately on the surface of the base 21 toward the X axis direction. The transparent electrode pattern parts 13 and the transparent insulating pattern parts 14 of the transparent conductive element 1 are, for example, perpendicular to the transparent electrode pattern parts 23 and the transparent insulating pattern parts 24 of the transparent conductive element 2. In FIGS. 19A to 19C, regions $R_1$ show regions (electrode regions) for formation of the transparent electrode pattern parts 23, and regions $R_2$ show regions (insulating regions) for formation of the transparent insulating pattern parts 24.

As shown in FIG. 19C, the transparent electrode pattern part 23 is a transparent conductive layer with plural pore portions 23a randomly formed apart, and a conductive portion 23b is provided between adjacent ones of the pore portions 23a. Thus, in the transparent electrode pattern part 23, plural non-conductive portions (pore portions 23a) is randomly formed apart within a forming surface of a conductive material portion (conductive portion 23b).

Further, the transparent insulating pattern part 24 is a transparent conductive layer with plural island portions 24a randomly formed apart, and a void portion 24b functioning as an insulating portion is provided between adjacent ones of the island portions 24a. Thus, in the transparent insulating pattern part 24, conductive material portions (island portions 24a) are formed randomly to be isolated within a forming surface of a non-conductive portion (void portion 24b).

Like in the transparent conductive element 1 corresponding to the X electrode, the transparent electrode pattern part 23 and the transparent insulating pattern part 24 are formed of different random patterns. More specifically, a random pattern formed at a boundary between a conductive material portion and a non-conductive portion is a random pattern differing between the transparent electrode pattern part 23 and the transparent insulating pattern part 24. A boundary $L_2$ between the transparent electrode pattern part 23 and the transparent insulating pattern part 24 is in a condition formed by cutting the two types of random patterns as they are and bonding these patterns together.

Described next is how a conductive material covers the transparent electrode pattern parts 13 and 23 and the transparent insulating pattern parts 14 and 24 in the transparent conductive elements 1 and 2 of the aforementioned structures. The transparent electrode pattern part 13 and the transparent insulating pattern part 14 belonging to the X electrode are mainly used in the description below. In this regard, the same description is applicable to the transparent electrode pattern part 23 and the transparent insulating pattern part 24 belonging to the Y electrode.

Figure 20:
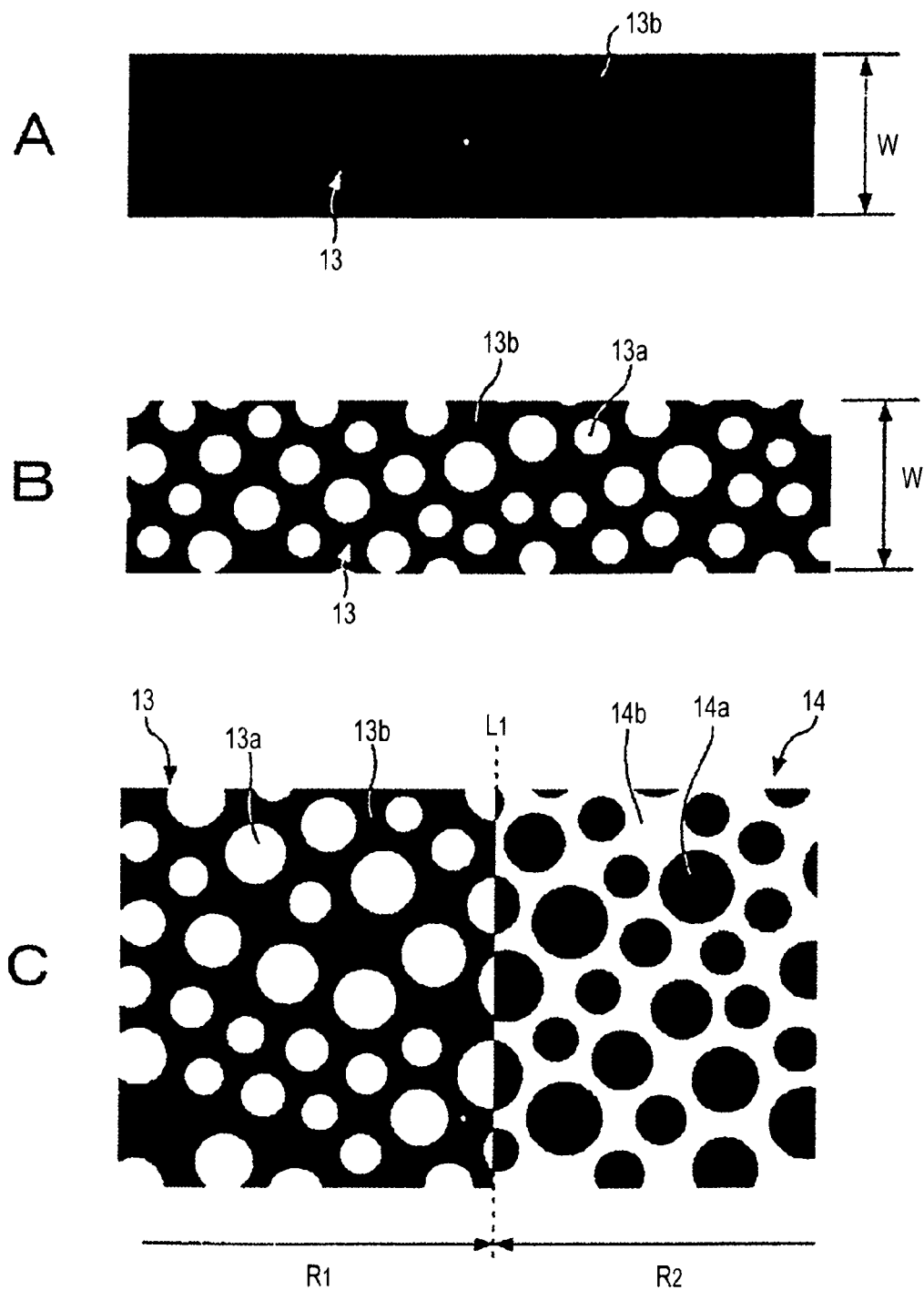
FIGS. 20A to 20C are explanatory views of patterns of a conductive portion and Comparative Examples.

FIG. 20A shows a condition where the conductive material is formed entirely in the transparent electrode pattern part 13. To be specific, this is a condition where the pore portions 13a are not provided, so that the conductive portion 13b is provided entirely. Thus, the coverage factor of the conductive material (conductive portion 13b) on the base 11 provided below not shown in the drawing is 100%. An electrode width of the transparent electrode pattern part 13 of FIG. 20A is defined as an electrode width W.

In contrast, the pore portions 13a may be formed of a random pattern as shown in FIG. 20B. It is assumed in this case that the coverage factor of the conductive portion 13b is 50%. Then, in the case of FIG. 20B, an average electrode width is obtained as W×0.5. Accordingly, with the same thickness of the conductive material, the transparent electrode pattern part 13 of FIG. 20B suffers from a doubled electrical resistance compared to the case of FIG. 20A where the coverage factor is 100%. The large electrical resistance of the transparent electrode pattern part 13 results in the fear of response speed reduction or accuracy reduction in position detection if the transparent electrode pattern part 13 is applied to a capacitive touch panel.

As a matter of course, even if the pore portions 13a are formed as shown in FIG. 20B, the electrical resistance can still be the same as that of FIG. 20A by doubling the thickness of the conductive material. However, this is not preferable as problems such as increase in material cost and speed reduction of a manufacturing line occur.

In this regard, providing the pore portions 13a means enhancing invisibility between the transparent electrode pattern part 13 and the transparent insulating pattern part 14.

FIG. 20C shows an example where a random pattern is generated where dots of various diameters are arranged randomly, and the pore portions 13a of the transparent electrode pattern part 13 and the island portions 14a of the transparent insulating pattern part 14 are formed based on the random pattern thereby generated. In FIG. 20C, one random pattern is shared between the transparent electrode pattern part 13 and the transparent insulating pattern part 14, and is reversed at the boundary $L_1$. To be specific, the dot portions of this random pattern become the pore portions 13a (non-conductive portions) in the transparent electrode pattern part 13, and become the island portions 14a (conductive material portions) in the transparent insulating pattern part 14. By introducing this random pattern into the transparent electrode pattern part 13 and the transparent insulating pattern part 14, invisibility that makes an electrode line invisible can be enhanced.

The aforementioned problem of a resistance value is caused here.

If the random pattern is introduced into the transparent electrode pattern part 13 as shown in FIG. 20C, the electrical resistance thereof is increased. It is desirable that the coverage factor of the conductive material be increased in the transparent electrode pattern part 13 in order to remedy such resistance degradation (rise in resistance value) of the transparent electrode pattern part 13. To be specific, it is desirable that the area ratio of the pore portions 13a be reduced and that of the conductive portion 13b be increased. However, when doing so, the area ratio of the island portions 14a is reduced and the area ratio of the void portion 14b is increased in the transparent insulating pattern part 14, if the transparent electrode pattern part 13 and the transparent insulating pattern part 14 use a common random pattern. As a result, the conductive portion 13b being a portion covered with the conductive material becomes conspicuous in the transparent electrode pattern part 13, whereas the void portion 14b not covered with the conductive material becomes conspicuous in the transparent insulating pattern part 14. This causes a problem of an increased difference in coverage factor of the conductive material between the transparent electrode pattern part 13 and the transparent insulating pattern part 14, so that invisibility is inhibited.

Figure 21:
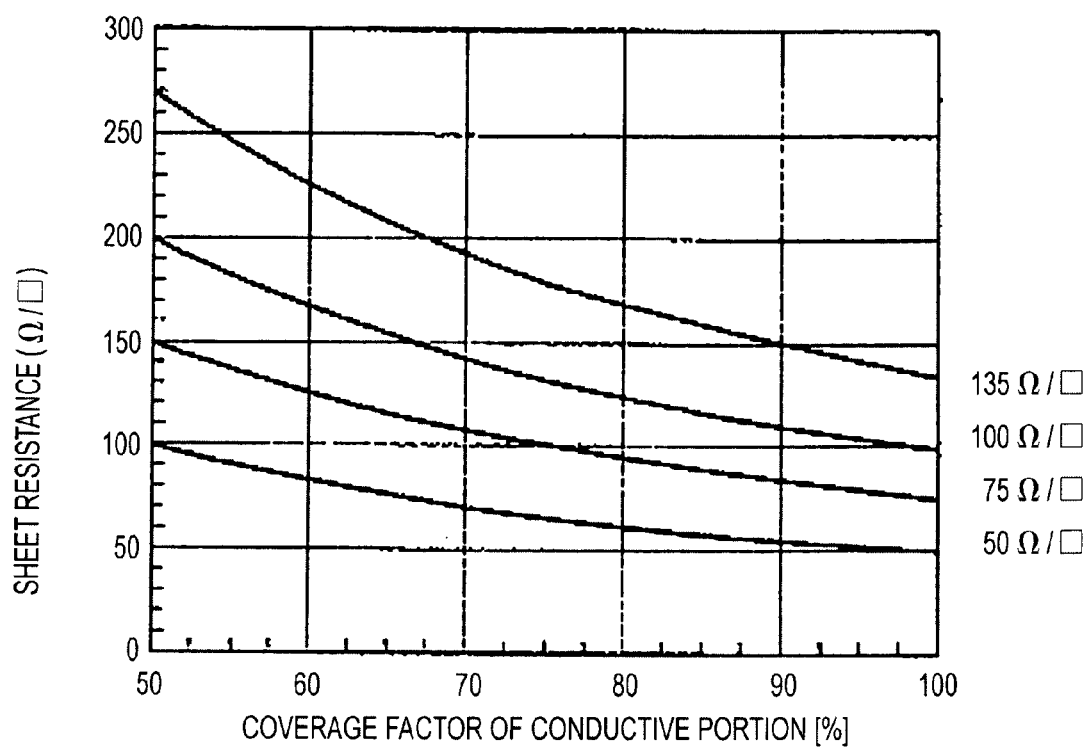
FIG. 21 explains a sheet resistance relative to the coverage factor of a conductive portion.

FIG. 21 shows how a sheet resistance changes with the coverage factor of the conductive portion 13b. FIG. 21 shows how sheet resistances change with reduction of the coverage factor of the conductive portion 13b if conductive materials of their certain electrode widths and thicknesses are used that achieve sheet resistances of 135 Ω/sq., 100 Ω/sq., 75 Ω/sq., and 50 Ω/sq. with the coverage factor of the conductive portion set at 100%.

As shown in the drawing, sheet resistances increase with reduction of the coverage factor of the conductive portion 13b. If a touch panel is applied to a middle-sized display such as that of a notebook-sized or tablet personal computer, for example, 150 Ω/sq. or less is an index to a sheet resistance. It is thus seen from the drawing that, if the conductive portion 13b is made of a conductive material having an electrode width and a thickness achieving a sheet resistance of 100 Ω/sq. with the coverage factor of 100%, it is preferable that the coverage factor of the conductive portion 13b be 67% or more (roughly, about 65% or more).

In summary, providing the pore portions 13a and the island portions 14a based on a random pattern acts advantageously on invisibility. In this regard, for enhancement of invisibility, it is preferable that the area ratio of the pore portions 13a in the transparent electrode pattern part 13 be the same as that of the island portions 14a in the transparent insulating pattern part 14. Preferably, this is achieved by generating a random pattern such as that of FIG. 20B providing the coverage factor of the conductive material of 50%, and by applying the conductive material such that one random pattern common to the transparent electrode pattern part 13 and the transparent insulating pattern part 14 is reversed at the boundary $L_1$ therebetween as in FIG. 20C.

In this case, however, the coverage factor of the conductive portion 13b is about 50% in the transparent electrode pattern part 13, thereby increasing a sheet resistance. In consideration of this, the coverage factor of the conductive portion 13b may be set, for example, at about 65% or more in the transparent electrode pattern part 13, thereby suppressing a sheet resistance. However, this in turn increases the area ratio of the void portion 14b in the transparent insulating pattern part 14, leading to deterioration of invisibility. Thus, reversing a random pattern in common between the transparent electrode pattern part 13 and the transparent insulating pattern part 14 forms a trade-off relationship between an electrode resistance and invisibility.

Accordingly, in the present embodiment, different patterns are used in the transparent electrode pattern part 13 and the transparent insulating pattern part 14. Examples of the different patterns are given below.

As a first example, the transparent electrode pattern part 13 has a solidly coated pattern providing the coverage factor of the conductive material of 100%, and the transparent insulating pattern part 14 has a random pattern. The solidly coated pattern forms the conductive portion 13b throughout the transparent electrode pattern part 13, and does not provide the pore portions 13a. Further, the island portions 14a and the void portion 14b are arranged randomly in the transparent insulating pattern part 14. To be specific, this is an example of the case where the transparent electrode pattern part 13 and the transparent insulating pattern part 14 include at least conductive material portions and these conductive material portions are formed of different patterns.

According to another example, the transparent electrode pattern part 13 and the transparent insulating pattern part 14 have different random patterns for formation of conductive material portions and non-conductive portions thereof. For example, the plural pore portions 13a (non-conductive portions) is randomly formed apart within a forming surface of the conductive material portion in the transparent electrode pattern part 13. The conductive material portions (island portions 14a) are randomly formed within a forming surface of the non-conductive portion in the transparent insulating pattern part 14 to be isolated. Further, in this example, a pattern formed at a boundary between a conductive material portion and a non-conductive portion is a random pattern differing between the transparent electrode pattern part 13 and the transparent insulating pattern part 14. In the present embodiment, as shown in FIGS. 17C and 19C, the transparent electrode pattern part 13 and the transparent insulating pattern part 14 are formed by using different random patterns as described above. Different random patterns mean patterns generated under different conditions of random pattern generation (such as a range of a radius, condition of creating a graphic object in a resultant circle, and weighting of a random number described below).

Using different random patterns makes it possible to satisfy both reduction of the resistance value of the transparent electrode pattern part 13 and assurance of invisibility. For example, if the conductive portion 13b to be formed in the transparent electrode pattern part 13 is made of a conductive material of FIG. 21 having an electrode width and a thickness achieving a sheet resistance of 100 Ω/sq., the coverage factor of the conductive portion 13b may be set at about 65% or more. Accordingly, in this case, a random pattern providing the area ratio of the pore portions 13a of 35% or less may be used. In this case, a random pattern providing the area ratio of the void portion 14b not different largely from that of the pore portions 13a may be used in the transparent insulating pattern part 14. As a result, invisibility can be maintained. For example, if the coverage factor of the conductive material portion (conductive portion 13b) in the transparent electrode pattern part 13 is set to be 65% or more and 100% or less, the coverage factor of the conductive material portions (void portion 14a) may also be set to be 65% or more and 100% or less. This condition can be realized by using different random patterns.

For assurance of invisibility, the transparent conductive element 1 (X electrode) and the transparent conductive element 2 (Y electrode) in a condition where they overlap with each other should also be considered. First, in the transparent conductive elements 1 and 2 forming the information input device 10 of the present embodiment, a conductive material portion and a non-conductive portion are formed of a random pattern differing between the transparent electrode pattern part 13 (23) and the transparent insulating pattern part 14 (24).

Figure 22:
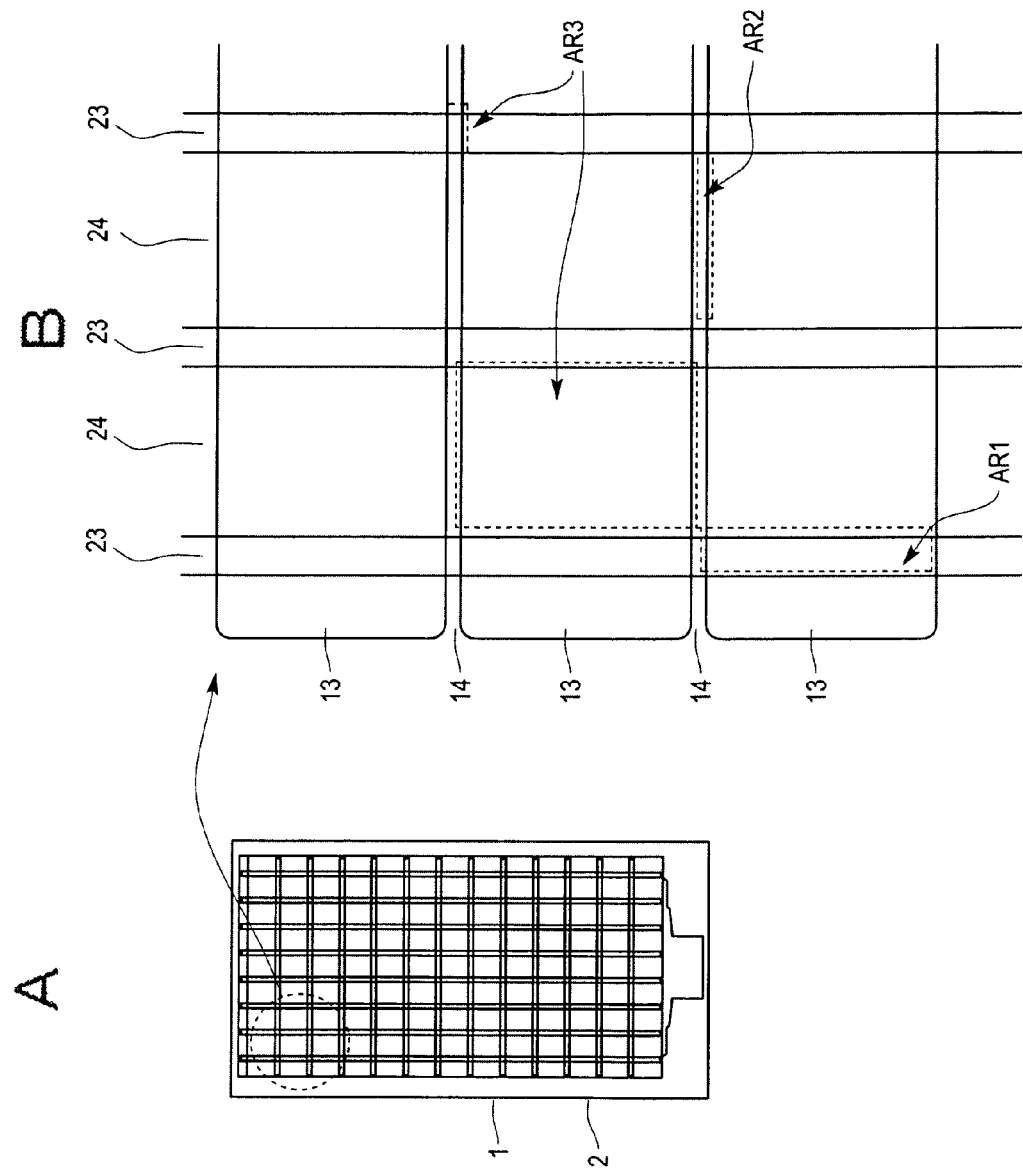
FIG. 22A is a plan view describing regions where the first and second transparent conductive elements according to the third embodiment of the present technique are overlapped with each other.
FIG. 22B is a plan view showing part of FIG. 22A in an enlarged manner.

FIG. 22A shows a condition corresponding to that of FIG. 1, specifically, the condition where the transparent conductive elements 1 and 2 overlap with each other. FIG. 22B is an enlarged view of part thereof. In this case, a region AR1 is a region where the transparent electrode pattern parts 13 and 23 overlap with each other. A region AR2 is a region where the transparent insulating pattern parts 14 and 24 overlap with each other. A region AR3 is a region where the transparent electrode pattern part 13 and the transparent insulating pattern part 24 overlap with each other, or where the transparent insulating pattern part 14 and the transparent electrode pattern part 23 overlap with each other. Overlapping parts of the transparent conductive elements 1 and 2 (input surface forming part) as seen from an input surface through which a user makes touch operation are all classified into the regions AR1, AR2 and AR3. In terms of invisibility considered from user's vision, visual recognition of distinction among the regions AR1, AR2 and AR3 should be prevented.

In conclusion, in the present embodiment, while the transparent conductive elements 1 and 2 overlap with each other, a difference in the sum of the coverage factor of a conductive material portion in the transparent conductive element 1 and that of a conductive material portion in the transparent conductive element 2 is set to be 0 or more and 60 or less among all the regions AR1, AR2 and AR3 as seen from the direction of the input surface.

For example, the coverage factors of respective conductive material portions (conductive portions 13b and 23b) in the transparent electrode pattern parts 13 and 23 are set at 80%. Further, the coverage factors of respective conductive material portions (island portions 14a and 24a) in the transparent insulating pattern parts 14 and 24 are set at 50%. Then, the sum of the coverage factor of a conductive material portion in the transparent conductive element 1 and that of a conductive material portion in the transparent conductive element 2 is obtained in each of the regions AR1, AR2 and AR3 as follows:

Region AR1: 80+80=160
Region AR2: 50+50=100
Region AR3: 80+50=130

In this case, the sum is the maximum in the region AR1 and the minimum in the region AR2, and a difference in the sum is 60. It is considered that invisibility is favorable if a difference in the sum does not exceed 60. The sum is used as an index for the reason that what is used as a basis for consideration of invisibility is user's vision. For example, the diameter of the pore portions 13a or the island portions 14a is determined according to parameters set for random pattern generation, and which may actually be from 10 μm to 100 μm, or from 100 μm to 500 μm, for example. However, these pores are extremely small as considered from people's vision. A user can hardly recognize each of the pore portions 13a or the island portions 14a visually on a transparent electrode. From a macroscopic viewpoint conforming to user's vision, if the transparent conductive elements 1 and 2 overlap with each other, the sum of the coverage factor of a conductive material portion in the transparent conductive element 1 and that of a conductive material portion in the transparent conductive element 2 is considered to be an average coverage factor in a pertinent region. To be specific, if a difference in the sum is large, distinction among the regions AR1, AR2 and AR3 is easily recognized visually as seen from user's vision. The present inventors found as a result of investigation of visibility that invisibility can be maintained if the aforementioned difference in the sum is set to be 0 or more and 60 or less among all the regions as seen from the direction of the input surface.

As a matter of course, reducing the difference in the sum acts more preferably on invisibility. In the case of the aforementioned example, increasing the sum in the region AR2 can reduce the difference in the sum among all the regions. Therefore, the coverage factors of respective conductive material portions (island portions 14a and 24a) in the transparent insulating pattern parts 14 and 24 are set at 65%. Then, the sum of the coverage factor of a conductive material portion in the transparent conductive element 1 and that of a conductive material portion in the transparent conductive element 2 is obtained in each of the regions AR1, AR2 and AR3 as follows:

Region AR1: 80+80=160
Region AR2: 65+65=130
Region AR3: 80+65=145

In this case, a difference in the sum is 30, so that this acts more preferably on invisibility.

However, increasing the coverage factors of conductive material portions (island portions 14a and 24a) in the transparent insulating pattern parts 14 and 24 involves, for example, if it is formed by printing described later, a greater amount of use of a conductive material to entail higher material cost accordingly. Thus, in consideration of material cost and the resistance value of the transparent electrode pattern parts 13, the coverage factors of conductive material portions (island portions 14a and 24a) in the transparent insulating pattern parts 14 and 24 may be set such that the difference in the sum among all the regions does not exceed 60.

In the present embodiment described above, different random patterns are used in the transparent electrode pattern part 13 (23) and the transparent insulating pattern part 14 (24). As a result of use of the different random patterns, the coverage factors of conductive material portions can be set with a higher degree of freedom in the transparent electrode pattern part 13 (23) and the transparent insulating pattern part 14 (24). Thus, the resistance value of the transparent electrode pattern part 13 (23) can be set at a proper value (150Ω or less, for example), and then the coverage factor of a conductive material portion in the transparent insulating pattern part 14 (24) can be set in consideration of invisibility and material cost. As a result, the resistance value of the transparent electrode pattern part 13 (23) can be reduced, and further, electrode structures can be made invisible in all the regions as seen from the direction of the input surface. This realizes the high-performance information input device 10 difficult to be visually recognized.

It is preferable that the coverage factors of conductive material portions in the transparent electrode pattern part 13 (23) and the transparent insulating pattern part 14 (24) be 65% or more and 100% or less. To make a transparent conductive layer pattern invisible, a difference in the sum of the coverage factors of a conductive material is set to be 0 or more and 60 or less among all regions defined by stacking the transparent conductive elements 1 and 2.

As given in the description of FIGS. 18A and 19C before, the boundary $L_1$ ($L_2$) between the transparent electrode pattern part 13 (23) and the transparent insulating pattern part 14 (24) is in a condition formed by cutting two types of random patterns as they are and bonding these patterns together (chopping of patterns). This acts preferably as it forms a boundary of a random shape hard to be visually recognized. Further, the plural pore portions 13a (23a) is randomly formed apart in the transparent electrode pattern part 13 (23), and the plural island portions 14a (24a) is randomly formed apart in the transparent insulating pattern part 14 (24), so that generation of moire can be suppressed.

The coverage factor of the pore portions 13a may be 0%, namely, the coverage factor of the conductive portion 13b may be 100% in the transparent electrode pattern part 13. The transparent electrode pattern part 13 may be formed by mixing regions of two types or more having different coverage factors of the pore portions 13a. Further, a random mesh pattern to be described later may be used as a random pattern for the transparent electrode pattern part 13 or the transparent insulating pattern part 14.

It is preferable that all the plural pore portions 13a be formed to be isolated. In this regard, some of the plural pore portions 13a may be in contact or overlap with each other within a range that does not generate reduction of visibility and conductivity. It is further preferable that all the plural island portions 14a be formed to be isolated. In this regard, some of the plural island portions 14a may be in contact or overlap with each other within a range that does not generate reduction of visibility and insulating properties.

[Method of Manufacturing Transparent Conductive Element]

A method of manufacturing the transparent conductive element according to the third embodiment is the same as the method of manufacturing the transparent conductive element according to the first embodiment, except for a method of generating a random pattern. In the method of manufacturing the transparent conductive element according to the third embodiment, a random pattern for a transparent electrode pattern part and that for a transparent insulating pattern part are generated by setting different conditions of pattern generation (such as a range of a radius, condition for creating a graphic object in a resultant circle, and weighting of a random number described below).

[Method of Forming Random Pattern]

In the transparent conductive elements 1 and 2 of the present embodiment, a conductive material portion is formed based on a random pattern differing between the transparent electrode pattern parts 13 and 14, and between the transparent electrode pattern parts 23 and 24. In this example, a method of forming a random pattern itself used as a basis for formation of this conductive material portion is described. A method described in this example generates random patterns for forming the circular pore portions 13a and 23a, and the circular island portions 14a and 24a, to which the shapes of the random patterns are not intended to be limited.

In this example, the transparent electrode pattern part 13 and the transparent insulating pattern part 14 use random patterns different from each other. This is realized by generating the random patterns under different conditions of generation.

First, the different conditions of generation may be made during the aforementioned parameter setting. For example, setting $R_{min}$, $R_{max}$ and $R_{fill}$ at different values provides different ranges of radii of resultant random circles such as those of FIG. 8. Further, the reduction ratios of circles such as those of FIG. 8 (or other graphic objects arranged in the circles) may be changed. Still further, different graphic objects may be arranged randomly. For example, circles may be arranged on one side, whereas squares may be arranged on the opposite side. Or, a random dot pattern may be generated on one side, whereas a random mesh pattern may be generated on the opposite side. Additionally, a random number value obtained in a range of from 0.0 to 1.0 is used as a random number value Rnd, and this random number value may be weighted in different ways. As a matter of course, these may be used in combination.

By making different conditions of generation as described above, a random pattern for the transparent electrode pattern part 13 and that for the transparent insulating pattern part 14 are made different, thereby realizing a desirable coverage factor of a conductive material portion in each of the transparent electrode pattern part 13 and the transparent insulating pattern part 14.

Weighting of a random number will now be described.

The radii of circles to be generated such as those of FIG. 8 are obtained as follows:

Radii of circles=set minimum radius $R_{min}$+(set maximum radius $R_{max}$−set minimum radius $R_{min}$)× random number The random number value Rnd is a random number value obtained in a range of from 0.0 to 1.0.

This random number is substituted into a calculating formula that makes a result of calculation fall in a range of from 0 to 1, thereby allowing weighting of a distribution of the radii of the generated circles.

For example, by setting the random number at 3, more circles with small radii can be distributed. Further, by setting the random number at ⅓, more circles with large radii can be distributed, so that a dot filling factor can be increased. FIG. 23A shows a random number after the weighting performed under conditions of $y=x^{1/3}$ and $Y=x^3$.

FIG. 23B shows the frequency of diameter of a circle (dot) obtained after the aforementioned weighting of the random number. In this case, as random patterns to be generated, circular random patterns are generated under the following conditions:

Range of radius: 35 to 56 μm
Reduction of radius: 10 μm

In FIG. 23B, a line NW shows a frequency distribution obtained when no weighting is performed, and a line AW shows a frequency distribution obtained when weighting of $y=x^{1/3}$ is performed, both with a diameter pitch of 1 μm. It is seen that weighting of the random number allows increase of the frequency of occurrence of circles of large diameters, thereby increasing a dot filling factor. Conversely, the frequency of small diameters may be increased to allow reduction of a dot filling factor. However, increasing the frequency of an arbitrary diameter more than necessary reduces randomness, resulting in the fear of generation of moire or diffracted light. Therefore, it is preferable that the frequency of an arbitrary diameter be 35% or less in the frequency distribution with a diameter pitch of 1 μm.

The generated random patterns described so far have a dot shape or a polygonal shape in circles. In this regard, a description will be given of a random mesh pattern such as that of FIG. 24A being generated.

For generation of the random mesh pattern, a pattern with randomly arranged circles may be generated first by the aforementioned algorithm. FIG. 24B shows the resultant random mesh pattern generated by drawing lines at random angles on the pattern with the random circles. To be specific, straight lines passing through the respective centers of all circles are drawn by using the respective center coordinates of the circles directly. At this time, the angle of rotation of each straight line is determined randomly in a range of from 0 degrees to 180 degrees, thereby drawing the lines tilted randomly as shown in the drawing. As a result, the random mesh pattern can be generated.

Technique shown in FIG. 24C is also applicable.

A pattern with generated circles randomly arranged is also used in the case of FIG. 24C. In this case, line segments each connecting the center coordinates of one circle and those of an adjacent circle are drawn sequentially. To be specific, the centers of neighboring circles are connected sequentially. This can also generate a random mesh pattern.

Regardless of whether the technique of FIG. 24B or 24C is employed, different random patterns of two types can still be generated by setting parameters at different values or changing the weighting of a random number value. Random patterns with different coverage factors of a conductive material portion can be generated easily by changing the thicknesses of straight lines to be formed randomly.

[Modifications]

In the third embodiment according to the present technique, a printing method may be used in place of an etching method to form the transparent conductive elements 1 and 2. Except for the shape of a transferring surface of a master used for the printing method, the printing method may be the same as that described in the second embodiment. Accordingly, only the structure of the master will be described here.

[Master]

FIG. 25A is a perspective view showing an example of the shape of the master. FIG. 25B is a plan view showing part of a region $R_1$ and part of a region $R_2$ of FIG. 25A in an enlarged manner. For example, the master 100 is a roll master having a cylindrical surface functioning as the transferring surface, and the regions $R_1$ and $R_2$ are laid alternately in the cylindrical surface.

Plural pore portions 113a in the shape of recesses are formed apart in the first region $R_1$. The pore portions 113a are isolated through a projecting portion 113b. The pore portions 113a are provided to form the pore portions 13a of the transparent electrode pattern part 13 by printing, and the projecting portion 113b is provided to form the conductive portion 13b of the transparent electrode pattern part 13 by printing.

Plural island portions 114a in the shape of projections are formed apart in the second region $R_2$. The island portions 114a are isolated through a recessed portion 114b. The island portions 114a are provided to form the island portions 14a of the transparent insulating pattern part 14 by printing, and the recessed portion 114b is provided to form the void portion 14b of the transparent insulating pattern part 14 by printing.

A random pattern for the pore portions 113a in the region $R_1$ and that for the island portions 114a in the region $R_2$ differ from each other.

4. Fourth Embodiment

A description will be given of a case where diamond-shaped pattern electrodes are provided as a fourth embodiment of the transparent conductive elements 1 and 2.

Figure 26:
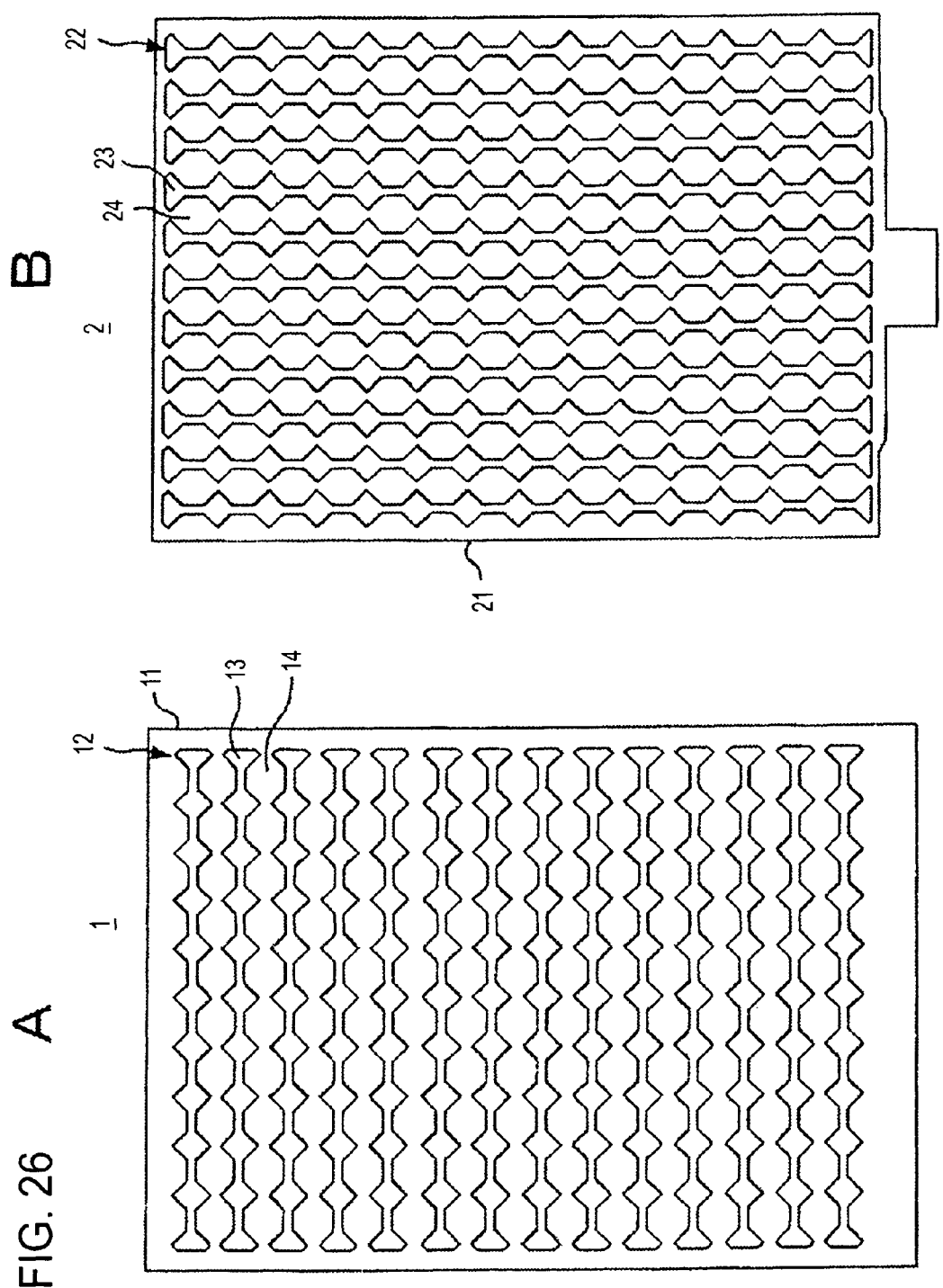
FIG. 26A is a plan view showing an example of the structure of a first transparent conductive element according to a fourth embodiment of the present technique.
FIG. 26B is a plan view showing an example of the structure of a second transparent conductive element according to the fourth embodiment of the present technique.

FIGS. 26A and 26B show electrode patterns in the transparent conductive elements 1 and 2 respectively. As shown in FIG. 26A, a transparent conductive layer 12 of the transparent conductive element 1 in this case also includes transparent electrode pattern parts 13 and transparent insulating pattern parts 14 formed therein. The transparent electrode pattern parts 13 have such a shape that diamond-shaped (substantially rhombus-shaped) sections extend in succession in an X axis direction. The transparent electrode pattern parts 13 and the transparent insulating pattern parts 14 are laid alternately on a surface of a base 11 in a Y axis direction.

Further, as shown in FIG. 26B, a transparent conductive layer 22 of the transparent conductive element 2 includes transparent electrode pattern parts 23 and transparent insulating pattern parts 24 formed therein. The transparent electrode pattern parts 23 have such a shape that diamond-shaped (substantially rhombus-shaped) sections extend in succession in the Y axis direction. The transparent electrode pattern parts 23 and the transparent insulating pattern parts 24 are laid alternately on a surface of a base 21 toward the X axis direction.

Like in the third embodiment, a conductive material portion is required to be formed by using a random pattern differing between the transparent electrode pattern part 13 (23) and the transparent insulating pattern part 14 (24) in the fourth embodiment. More specifically, each example explained in the third embodiment is also applicable in this regard. In particular, the description given here is intended for visibility determined when an X electrode and a Y electrode overlap with each other, and a specific example where the transparent electrode pattern parts 13 and 23 are composed of plural regions with different coverage factors of a conductive material portion.

Figure 27:
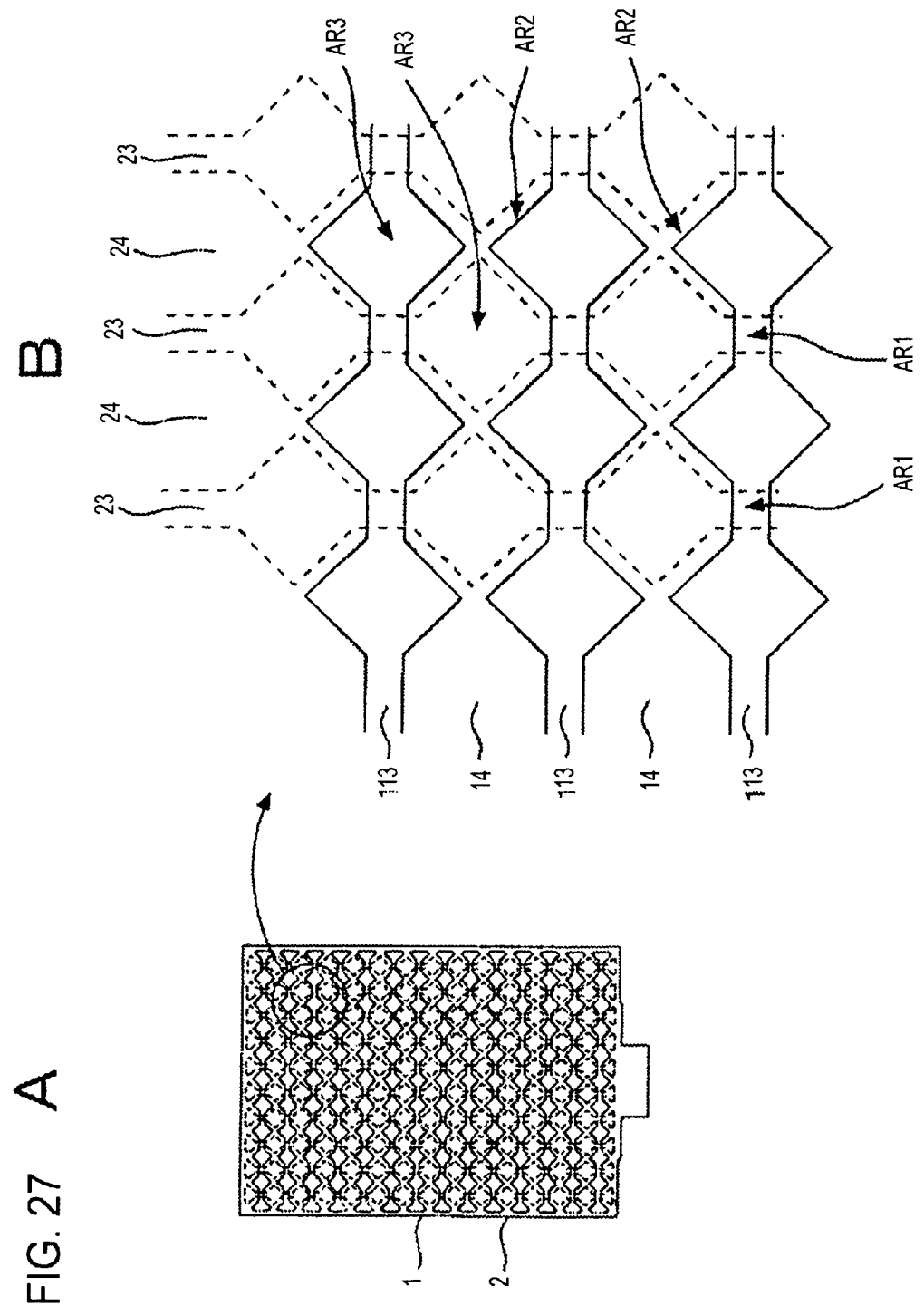
FIG. 27A is a plan view describing a region where the first and second transparent conductive elements according to the fourth embodiment of the present technique are overlapped with each other.
FIG. 27B is a plan view showing part of FIG. 27A in an enlarged manner.

Like FIG. 22A, FIG. 27A shows a condition where the transparent conductive elements 1 and 2 overlap with each other, and further, the transparent electrode pattern parts 13 and 14 have diamond shapes. FIG. 27B is an enlarged view of part thereof. Here, parts belonging to the transparent conductive element 2 are shown by dashed lines. As described by referring to FIG. 22B, a region AR1 is a region where the transparent electrode pattern parts 13 and 23 overlap with each other, and a region AR2 is a region where the transparent insulating pattern parts 14 and 24 overlap with each other. Further, a region AR3 is a region where the transparent electrode pattern part 13 and the transparent insulating pattern part 24 overlap with each other, or where the transparent insulating pattern part 14 and the transparent electrode pattern part 23 overlap with each other. In this case, all overlapping parts of the transparent conductive elements 1 and 2 (input surface forming part) as seen from an input surface through which a user makes touch operation are also classified into the regions AR1, AR2 and AR3. In terms of invisibility considered from user's vision, it is required that distinction among the regions AR1, AR2 and AR3 be not visually recognized.

The regions AR1, AR2 and AR3 have different shapes and ranges as a result of different electrode pattern shapes as shown in FIG. 27B. In this case, the coverage factors of respective conductive material portions (conductive portions 13b and 23b) in the transparent electrode pattern parts 13 and 23 are also set at 80%, and those of respective conductive material portions (island portions 14a and 24a) in the transparent insulating pattern parts 14 and 24 are set at 50%, for example. Then, a difference in the sum of the coverage factor of a conductive material portion in the transparent conductive element 1 and that of a conductive material portion in the transparent conductive element 2 is set not to exceed 60 among the regions AR1, AR2 and AR3, thereby achieving favorable invisibility.

Figure 28:
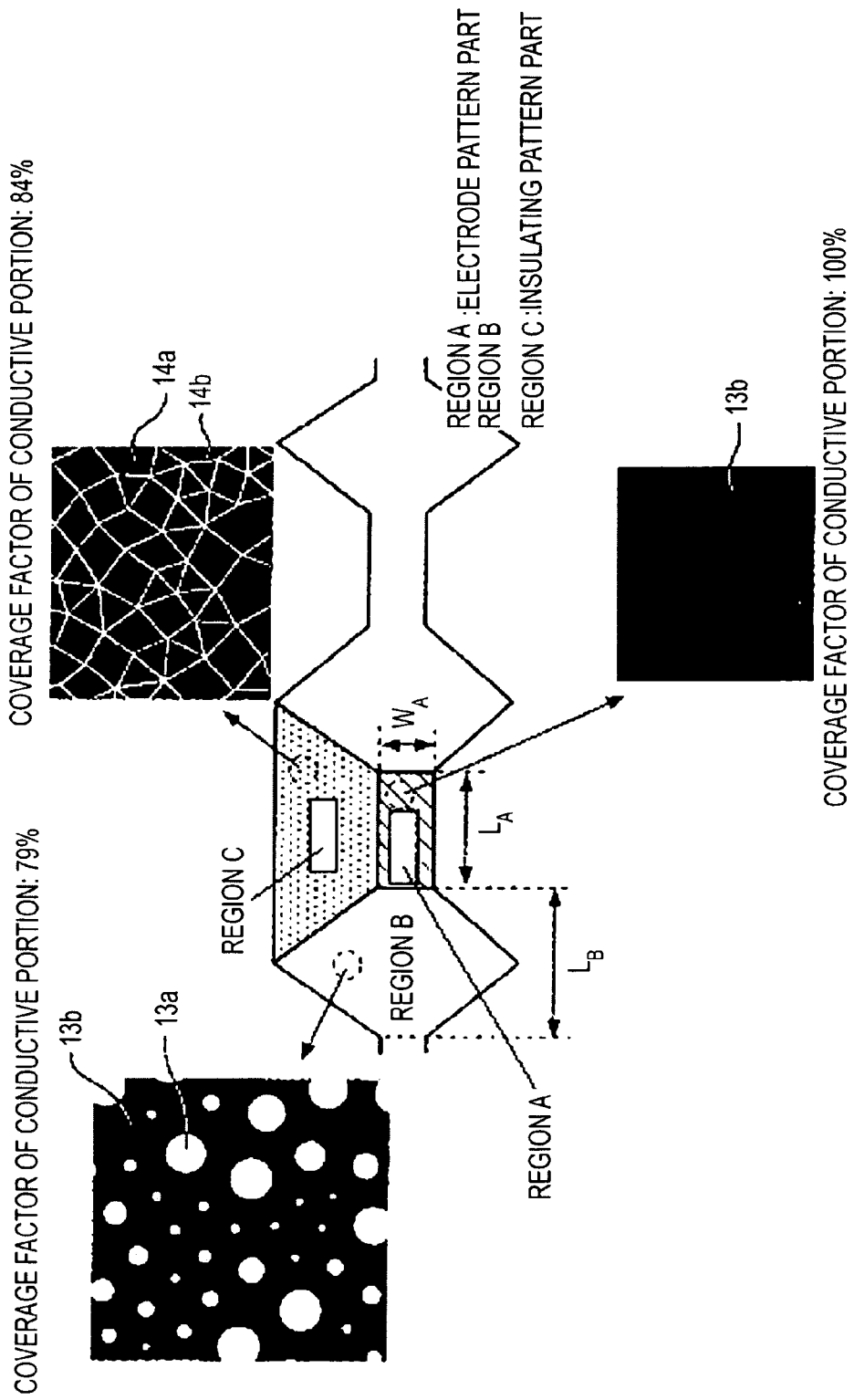
FIG. 28 is a simplified diagram describing a combination of patterns in the fourth embodiment of the present technique.

These diamond-shaped patterns particularly act effectively in mixing regions of two types or more having different coverage factors of a conductive material portion in the transparent electrode pattern part 13. As shown in FIG. 28, the transparent electrode pattern part 13 of a diamond-shaped pattern is divided into regions A and B. Further, part corresponding to the transparent insulating pattern part 14 is defined as a region C. The width and the length of the region A are defined as $W_A$ and $L_A$, respectively. The region B has a width $W_B$ determined as $W_B$=(area of the region B)/$L_B$. $L_B$ is the length of the region B.

If the transparent electrode pattern part 13 has a shape such as a diamond shape that allows the transparent electrode pattern part 13 to be divided into two or more regions, it is preferable that the coverage factor of the pore portions 13a be made smaller (meaning that the coverage factor of the conductive portion 13b is made larger) in a region of a larger value of $L(x)/W(x)$. The reason therefor is that the inherent resistance value of a region is large if the region has a larger value of $L(x)/W(x)$, so that resistance increase as a result of increase of the coverage factor of the pore portions 13a becomes more influential. In the case of FIG. 28, the region A has a large value of $L(x)/W(x)$ and inherently has a large resistance value compared to the region B. Thus, as shown in the drawing, it is considered that the coverage factor of the conductive portion 13b may be set at 79% (with the coverage factor of the pore portions 13a being 21%) in the region B, and that the coverage factor of the conductive portion 13b may be set at 100% (with the coverage factor of the pore portions 13a being 0%) in the region A, for example. These coverage factors are merely given as examples.

Regarding the region C, namely, the transparent insulating pattern part 14, the coverage factor of a conductive material portion (island portions 14a) may be set so as to satisfy the aforementioned condition of the difference in the sum of coverage factors determined when the X and Y electrodes overlap with each other. A random mesh pattern may be used rather than the random dot pattern shown in the drawing.

As described in this example, partially controlling the coverage factor of a conductive material portion makes it possible to suppress the amount of use of a conductive material (save material cost) if electrodes are formed by printing. In order to make a pattern invisible, it is preferable that a difference in coverage factor of a conductive material among the regions A to C be 0% or more and 30% or less.

5. Fifth Embodiment

A description will be given of transparent conductive elements 1 and 2 using metallic nanowires in a fifth embodiment. If a transparent conductive layer 12 is composed of metallic nanowires, when a transparent electrode pattern part 13 is subjected to random patterning treatment, an area covered with metallic nanowires is reduced, thereby lowering the reflection L value of a conductive portion. This makes black representation on a screen deeper corresponding to a conductive material portion to enhance the display characteristics (contrast) of a display, compared to the case where a linear or diamond pattern is used. Additionally, combining certain surface treatments makes it possible to lower a reflection L value further both in a conductive material portion and a non-conductive portion, thereby enhancing contrast further.

A transparent conductive layer using metallic nanowires as a conductive material can be deposited not by sputtering employed for a transparent conductive layer using ITO but by coating process. Unlike sputtering, coating process does not require a vacuum environment, so that reduction in manufacturing cost can be expected. Additionally, the transparent conductive layer using metallic nanowires is attracting attention as a next-generation transparent conductive layer not using indium being a rare metal.

FIG. 29A shows an example of the structure of a transparent conductive element using metallic nanowires. A transparent conductive layer 81 using metallic nanowires is formed on a base 80. Not only metallic nanowires but also a dye for surface treatment, a dispersant, a binder, and the like are used in the transparent conductive layer 81.

The base 80 is an inorganic or plastic base having transparency. By way of example, a film, a sheet, and a substrate having transparency are applicable in terms of the shape of the base. As a material for the inorganic base, quartz, sapphire, and glass are applicable, for example. As a material for the plastic base, a publicly known polymeric material is applicable, for example. Specific examples of the publicly known polymeric material include triacetylcellulose (TAC), polyester (TPEE), polyethylene terephthalate (PET), polyethylene naphthalate (PEN), polyimide (PI), polyamide (PA), aramid, polyethylene (PE), polyacrylate, polyether sulfone, polysulphone, polypropylene (PP), diacetylcellulose, polyvinyl chloride, acrylic resins (PMMA), polycarbonate (PC), epoxy resins, urea resins, urethane resins, melamine resins, and cycloolefin polymers (COP). In terms of productivity, it is preferable that the plastic base have a thickness of from 38 to 500 μm. However, the thickness is not specifically limited to this range.

The metallic nanowires consist of one or more elements selected from Ag, Au, Ni, Cu, Pd, Pt, Rh, Ir, Ru, Os, Fe, Co, and Sn. It is preferable that an average minor axial length of the nanowires exceed 1 nm but do not exceed 500 nm. Further, it is preferable that an average major axial length of the nanowires exceed 1 μm but do not exceed 1000 μm. When the average minor axial length is less than 1 nm, the conductivity of the wires deteriorates, so that the wires are hard to function as a conductive layer after coating. Meanwhile, when the average minor axial length is more than 500 nm, total light transmittance deteriorates. Further, the average major axial length of less than 1 μm makes it difficult to connect the wires to each other, so that the wires are hard to function as a conductive layer after coating. In this regard, when the average major axial length is more than 1000 μm, total light transmittance deteriorates. Or, this tends to impair the dispersibility of the nanowires when the nanowires are applied in a coating material.

To enhance the dispersibility of the metallic nanowires in the coating material, the metallic nanowires may be surface-treated with PVP and a compound containing an amino group such as polyethylenimine. It is preferable that the compound be added in an amount where the conductivity thereof does not deteriorate determined when the metallic nanowires are formed into a coating film. Additionally, a compound containing a functional group such as a sulfo group (including a sulfonate), a sulfonyl group, a sulfonamide group, a carboxylic group (including a carboxylate salt), an amide group, a phosphate group (including a phosphate and a phosphate ester), a phosphino group, a silanol group, an epoxy group, an isocyanate group, a cyano group, a vinyl group, a thiol group, and a carbinol group, and which is capable of adsorbing on metal, is applicable as a dispersant.

A material causing dispersion of the metallic nanowires is used as the dispersant. For example, at least one or more types selected from water, alcohol (such as methanol, ethanol, n-propanol, i-propanol, n-butanol, i-butanol, sec-butanol, and tert-butanol), anone (such as cyclohexanone and cyclopentanone), amide (DMF), and sulfide (DMSO), are applicable. To suppress unevenness of drying or a crack on a coating surface, a high-boiling solvent medium may be added further to control the evaporation rate of a solvent. Examples of the solvent medium include butyl cellosolve, diacetone alcohol, butyl trigycol, propylene glycol monomethyl ether, propylene glycol monoethyl ether, ethylene glycol monoethyl ether, ethylene glycol monopropyl ether, ethylene glycol monoisopropyl ether, diethylene glycol monobutyl ether, diethylene glycol monoethyl ether, diethylene glycol monomethyl ether, diethylene glycol diethyl ether, dipropylene glycol monomethyl ether, tripropylene glycol monomethyl ether, propylene glycol monobutyl ether, propylene glycol isopropyl ether, dipropylene glycol isopropyl ether, tripropylene glycol isopropyl ether, and methyl glycol. These solvent media may be used alone or a two or more of them may be used in combination.

An applicable binder material can be selected widely from well-known transparent natural or synthetic polymer resins. Examples of the binder material include transparent thermoplastic resins (such as polyvinyl chloride, vinyl chloride-vinyl acetate copolymers, polymethylmethacrylate, nitrocellulose, chlorinated polyethylene, chlorinated polypropylene, vinylidene fluoride, ethylcellulose, and hydroxypropyl methylcellulose), and transparent curable resins cured with heat, light, an electron beam, or a radiation ray (such as melamine acrylate, urethane acrylate, isocyanate, epoxy resins, polyimide resins, and silicon resins such as acrylic modified silicate). Further, examples of an additive include stabilizers such as surface-active agents, viscosity modifiers, dispersants, hardening accelerator catalysts, plasticizers, antioxidants, and sulfuration inhibitors.

To enhance durability, an overcoat layer 82 may separately be provided as shown in FIG. 29B after application of the metallic nanowires. Examples of an applicable material for the overcoat layer 82 include polyacrylic materials, polyamide materials, polyester materials, cellulose materials, and hydrolysis products and dehydrated and condensed products such as metal alkoxides. It is desirable that the overcoat layer 82 have a thickness that does not impair optical characteristics seriously.

To increase the adhesion, an anchor layer 83 may separately be provided on the base 80 as shown in FIG. 29C before application of the metallic nanowires. Examples of an applicable material for the anchor layer include polyacrylic materials, polyamide materials, polyester materials, cellulose materials, and hydrolysis products and dehydrated and condensed products such as metal alkoxides. It is desirable that the anchor layer have a thickness that does not impair optical characteristics seriously. The overcoat layer and the anchor layer may be used in combination.

The transparent conductive layer 81 using the metallic nanowires are manufactured by following the steps described below.

(Step 1) The metallic nanowires are dispersed in a solvent. Preferably, the metallic nanowires are dispersed by technique such as agitation, ultrasonic dispersion, dispersion with the use of beams, kneading, and homogenizing treatment. If the weight of the coating material is 100 parts by weight, the amount of the wires to be blended is set to be from 0.01 to 10 parts by weight. If the amount is less than 0.01 parts by weight, a sufficient density of the wires cannot be obtained in a film formed by coating. Meanwhile, if the amount is greater than 10 parts by weight, the dispersibility of the nanowires tends to deteriorate. To enhance the dispersibility of the metallic nanowires, PVP or a compound containing an amino group such as polyethylenimine may be added as a dispersant to a coating and dispersion liquid of the metallic nanowires. If the dispersant is added, it is preferable that the dispersant be added in an amount that does not impair the conductivity of a coating film. Additionally, a compound containing a functional group such as a sulfo group (including a sulfonate), a sulfonyl group, a sulfonamide group, a carboxylic group (including a carboxylate salt), an amide group, a phosphate group (including a phosphate and a phosphate ester), a phosphino group, a silanol group, an epoxy group, an isocyanate group, a cyano group, a vinyl group, a thiol group, and a carbinol group, and which is capable of adsorbing on metal, is applicable as the dispersant. To enhance performance in coating on the base 80, and adhesion and durability, a binder or an additive may be mixed, for example.

(Step 2) A transparent conductive layer composed of the metallic nanowires is formed on the base. The transparent conductive layer is formed by any method not specifically limited. However, in consideration of physical properties, convenience, manufacturing cost and the like, wet film forming process is preferable. Examples of known methods include coating, a spraying method, and printing. The coating method is not specifically limited, and publicly known coating methods are applicable. Examples of the publicly known coating methods include a micro gravure coating method, a wire bar coating method, a direct gravure coating method, a die coating method, a dipping method, a spray coating method, a reverse roll coating method, a curtain coating method, a comma coating method, a knife coating method, and a spin coating method. Examples of the printing methods include letterpress printing, offset printing, gravure printing, intaglio printing, rubber plate printing, screen printing, and ink-jet printing.

(Step 3) The solvent is dried after the coating. Natural drying and drying with heat are both applicable. For subsequent curing of the binder, the binder is cured with UV or heat, for example. To reduce a sheet resistance value, pressing process with a calendar may be performed.

It is desirable that the density ($g/m^2$) of the metallic nanowires in the metallic nanowire layer of FIG. 29A be from 0.001 g to 1 g. If the density is less than 0.001 g, the metallic nanowires do not exist in sufficient amounts in the coating film to degrade the performance thereof as a transparent conductive layer. A sheet resistance value is reduced with increase of the density. However, the density exceeding 1 g results in too much metallic nanowires in the coating film, thereby impairing total light transmittance.

6. Sixth Embodiment

Figure 30:
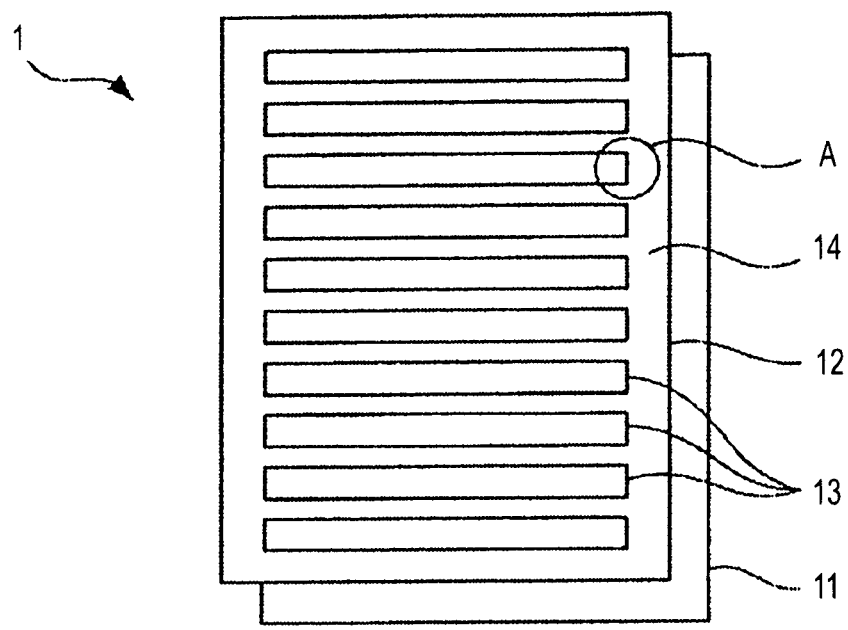
FIG. 30 is a plan view showing an example of the structure of a transparent conductive element according to a sixth embodiment of the present technique.
Figure 31:
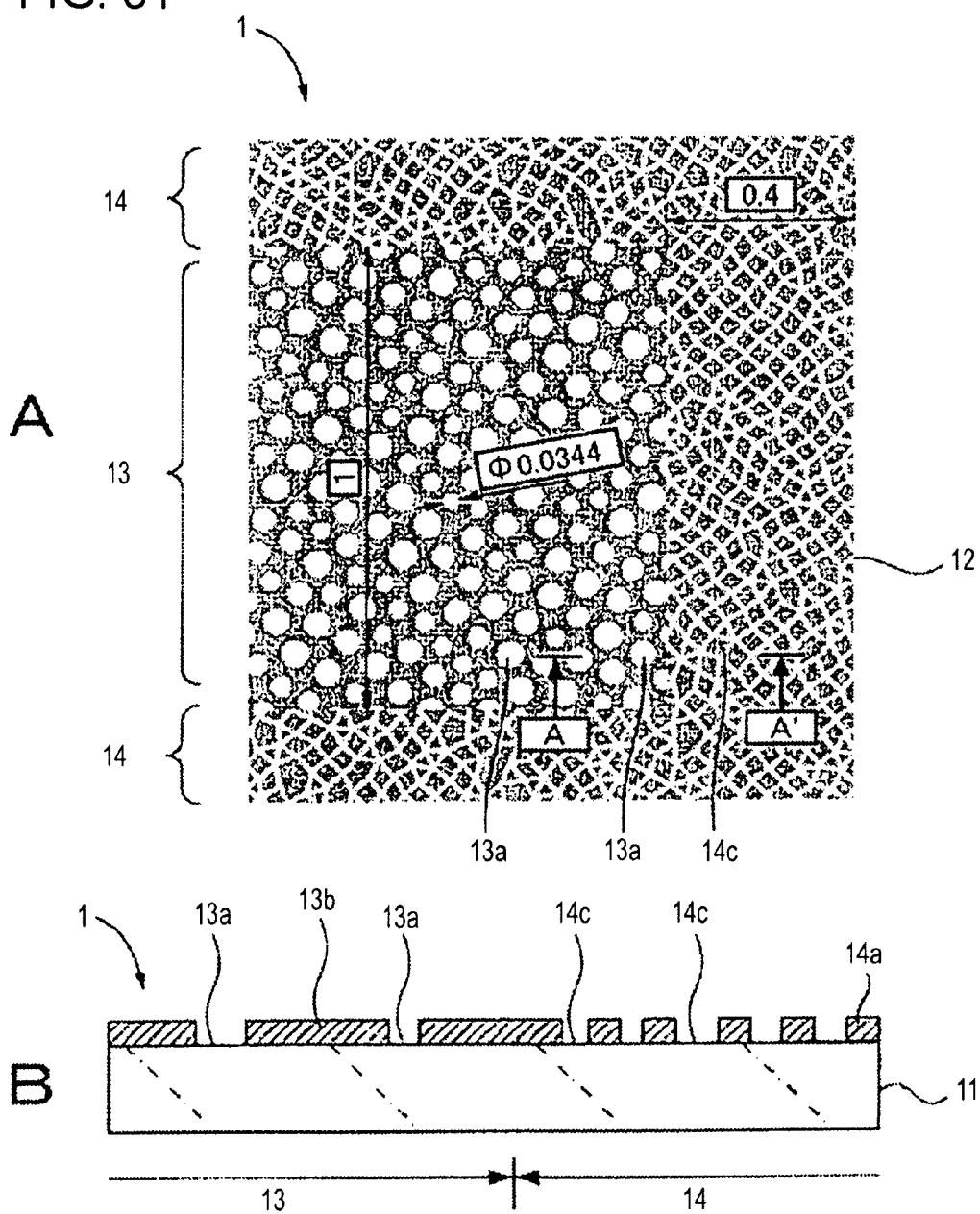
FIG. 31A is a plan view showing a region A of FIG. 30 in an enlarged manner.
FIG. 31B is a cross-sectional view taken along line A-A' of FIG. 31A.

FIG. 30 is a plan view describing the structure of a transparent conductive element of a sixth embodiment. FIG. 31A is an enlarged plan view of an enlarged part A of FIG. 30. FIG. 31B is a cross-sectional view showing part A-A' of the enlarged plan view of FIG. 31A. A transparent conductive element 1 shown in these drawings is a transparent conductive element arranged preferably on a display surface of a display panel, for example, and is configured as follows.

To be specific, the transparent conductive element 1 includes a base 11 and a transparent conductive layer 12 provided on the base 11. The transparent conductive element 1 further includes plural transparent electrode pattern parts (electrode regions) 13 formed by using the transparent conductive layer 12, and a transparent insulating pattern part (insulating region) 14 arranged to be adjacent to the transparent electrode pattern parts 13. A characteristic aspect lies in that the transparent conductive layer 12 is also arranged in the transparent insulating pattern part 14. Each member and each region are described in detail below.

(Base)

The base 11 is composed of a transparent material, for example, and publicly known glass or plastic is applicable. Examples of the publicly known glass include soda-lime glass, lead glass, hard glass, quartz glass, and liquid crystallized glass. Examples of the publicly known plastic include triacetylcellulose (TAC), polyester (TPEE), polyethylene terephthalate (PET), polyethylene naphthalate (PEN), polyimide (PI), polyamide (PA), aramid, polyethylene (P), polyacrylate, polyether sulfone, polysulphone, polypropylene (PP), diacetylcellulose, polyvinyl chloride, acrylic resins (PMMA), polycarbonate (PC), epoxy resins, urea resins, urethane resins, melamine resins, cyclic olefin polymers (COP), and norbornene thermoplastic resins.

It is preferable that the base 11 using the glass have a thickness of from 20 μm to 10 mm. However, the thickness is not specifically limited to this range. It is preferable that the base 11 using the plastic have a thickness of from 20 μm to 500 μm. However, the thickness is not specifically limited to this range.

(Transparent Conductive Layer)

Examples of a material for the transparent conductive layer 12 include metal oxides such as indium tin oxide (ITO), zinc oxide, indium oxide, antimony-added tin oxide, fluorine-added tin oxide, aluminum-added zinc oxide, gallium-added zinc oxide, silicon-added zinc oxide, zinc oxide and tin oxide based materials, indium oxide/tin oxide based materials, and zinc oxide/indium oxide/magnesium oxide based materials. Metals such as copper, silver, gold, platinum, palladium, nickel, tin, cobalt, rhodium, iridium, iron, ruthenium, osmium, manganese, molybdenum, tungsten, niobium, tantalum, titanium, bismuth, antimony, and lead, and alloys of these metals, are also applicable.

Examples of the material for the transparent conductive layer 12 further include composite materials prepared by dispersing carbon nanotubes in binder materials, metallic nanowires, and materials prepared by adsorbing colored compounds on metallic nanowires so as to be capable of preventing diffused reflection of light on surfaces. Conductive polymers such as substituted or unsubstituted polyaniline, polypyrrole, polythiophene, and (co)polymers of one or two or more selected from these materials are also applicable. Or, two or more of these materials cited here may be used in combination.

The transparent conductive layer 12 can be formed by a method such as PVD methods including a sputtering method, a vacuum deposition method, and an ion plating method, a CVD method, a coating method, and a printing method, for example. It is preferable that the transparent conductive layer 12 have a thickness appropriately selected such that the surface resistance thereof does not exceed 1000 Ω/sq. in a condition before patterned (condition where the transparent conductive layer is formed on the entire surface of the base 11).

(Transparent Electrode Pattern Part)

The transparent electrode pattern parts 13 are configured as regions where plural pore portions 13a is provided randomly in the transparent conductive layer 12. To be specific, the transparent electrode pattern parts 13 are formed by using the transparent conductive layer 12, and the pore portions 13a of random sizes are arranged as random patterns. Here, the circular pore portions 13a of various diameters are arranged independently in the transparent conductive layer 12, thereby maintaining the conductivity of all the transparent electrode pattern parts 13 as a whole.

In the transparent electrode pattern parts 13, assume that a diameter range set for each of the pore portions 13a controls the coverage factor of the transparent conductive layer 12. This coverage factor is set for each material and each thickness of the transparent conductive layer 12 to an extent that achieves conductivity necessary for the transparent electrode pattern parts 13. Control of the coverage factor by the diameter range of the pore portions 13a will be described in an article given below relating to a method of generating random patterns.

The shapes of the pore portions 13a arranged in the transparent electrode pattern parts 13 are not limited to a circle. The pore portions 13a may be of any shape as long as this shape does not allow recognition thereof by visual observation and does not have periodicity. For example, one, or two or more shapes in combination, selected from the group consisting of a circular shape, an oval shape, a shape formed by partially cutting off a circular shape, a shape formed by partially cutting off an oval shape, a polygonal shape, a polygonal shape with rounded off corners, and an indefinite shape are applicable.

The transparent electrode pattern parts 13 may have a structure where the pore portions 13a are isolated by strip patterns provided to the transparent conductive layer 12 by reversing groove portions 14c in the transparent insulating pattern part 14 described below. In this case, the strip patterns composed of the transparent conductive layer 12 extend in random directions in the transparent electrode pattern parts 13. These strip patterns extending in random directions also become random patterns.

In this regard, recognition of the pore portions 13a by visual observation is unavoidable if the size of each of the pore portions 13a is too large. Therefore, it is preferable that the shape of part composed of the pore portion 13a and the transparent conductive layer 12 continuously extending 100 μm or more in all directions from an arbitrary point do not exist in large numbers in the transparent electrode pattern parts 13. If the pore portions 13a have a circular shape, it is preferable that the diameters thereof do not exceed 100 μm, for example.

(Transparent Insulating Pattern Part)

The transparent insulating pattern part 14 is a region arranged to be adjacent to the transparent electrode pattern parts 13, and fills in between all the transparent electrode pattern parts 13 and isolates all the transparent electrode pattern parts 13. The transparent conductive layer 12 arranged in the transparent insulating pattern part 14 is divided into independent island shapes by the groove portions 14c extending in random directions. To be specific, the transparent insulating pattern part 14 is formed by using the transparent conductive layer 12. Island-shaped patterns generated by dividing the transparent conductive layer 12 by the groove portions 14c extending in random directions are arranged as random patterns in the transparent insulating pattern part 14. These island-shaped patterns (namely, random patterns) are formed as a result of division into random polygons by the groove portions 14c extending in random directions. The groove portions 14c extending in random directions themselves also become random patterns.

The groove portions 14c provided in the transparent insulating pattern part 14 extend in random directions in the transparent insulating pattern part 14, and it is assumed that the widths (called line widths) thereof perpendicular to their extending directions are the same. In the transparent insulating pattern part 14, the coverage factor of the transparent conductive layer 12 is controlled by the line width of each of the groove portions 14c. It is assumed that this coverage factor is set to be substantially the same as that of the transparent conductive layer 12 in the transparent electrode pattern parts 13. The coverage factors being "substantially the same" mentioned here are such factors that the transparent electrode pattern parts 13 and the transparent insulating pattern part 14 cannot be visually recognized as patterns in units of the pitches of the pattern parts 13 and 14. Control of the coverage factor by the line widths of the groove portions 14c will be described in the article given below relating to a method of generating random patterns.

In this regard, recognition by visual observation of the transparent conductive layer 12 having island shapes isolated by the groove portions 14c is unavoidable if the size of each of the island shapes is too large. Therefore, it is preferable that a shape with part composed of the transparent conductive layer 12 continuously extending 100 μm or more in all directions from an arbitrary point do not exist in large numbers in the transparent electrode pattern parts 13.

The transparent conductive layer 12 provided through the transparent electrode pattern parts 13 and the transparent insulating pattern part 14 is arranged randomly at boundaries between the pattern parts 13 and 14.

[Method of Manufacturing Transparent Conductive Element]

Except for a method of generating random patterns of the transparent insulating pattern part 14 being an insulating region, a method of manufacturing the transparent conductive element according to the sixth embodiment is the same as the method of manufacturing the transparent conductive element according to the first embodiment.

[Method of Generating Random Pattern]

As shown in FIG. 32A, in the generated random patterns, straight lines connecting the centers of circles with circumferences being in contact with each other are generated. This generates polygonal random patterns composed of line segments extending in random directions as shown in FIG. 32B. Next, as shown in FIG. 32C, the line segments forming the polygonal random patterns are made thicker to a predetermined line width, and the thickened line segments become the groove portions 14c in the transparent insulating pattern part 14 shown in FIG. 31A, thereby obtaining the random patterns of the transparent insulating pattern part 14.

Figure 33:
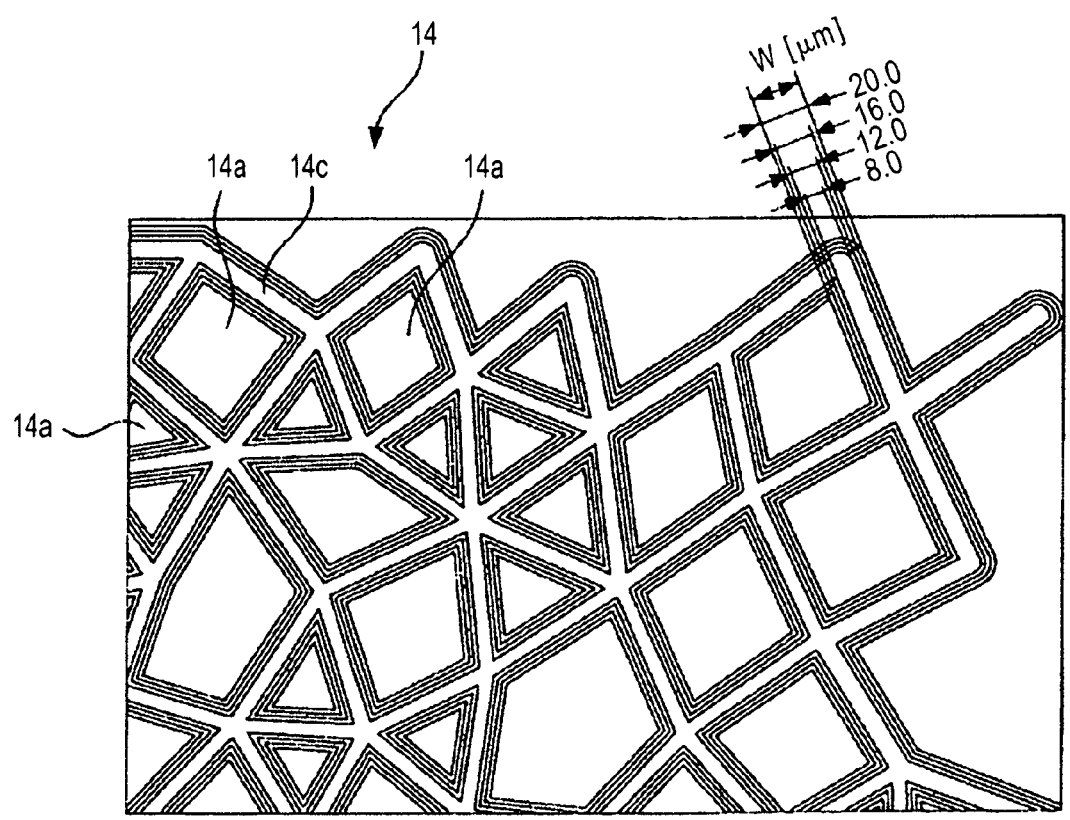
FIG. 33 is a plan view showing changes of the width of the groove pattern.

The groove portions 14c have line widths that can be changed into various line widths W as shown as shown in FIG. 33. By changing the line widths W of the groove portions 14c, the coverage factor of the transparent conductive layer 12 divided by the groove portions 14c in the transparent insulating pattern part 14 can be controlled in a wide range. Table 1 given below shows a result of calculation of the coverage factor [%] of the transparent conductive layer 12 in the transparent insulating pattern part 14 obtained for each range of radii r of circles to be generated as random patterns (from $R_{min}$ to $R_{max}$) and for each line width W of the groove portions 14c.

TABLE 1

| Line Width [μm] | Coverage Factor [%] | | |
| --- | --- | --- | --- |
| | r = 25 to 45 [μm] | r = 20 to 35 [μm] | r = 20 to 25 [μm] |
| 8 | 74.9 | 68.9 | 65.5 |
| 12 | 64.0 | 55.8 | 51.2 |

TABLE 1-continued

| | Coverage Factor [%] | | |
|---|---|---|---|
| Line Width [μm] | r = 25 to 45 [μm] | r = 20 to 35 [μm] | r = 20 to 25 [μm] |
| 16 | 54.0 | 44.4 | 38.8 |
| 20 | 45.1 | 34.6 | 28.5 |

It is seen from Table 1 that, in the transparent insulating pattern part 14 formed by dividing the transparent conductive layer 12 by the groove portions 14c, the coverage factor of the transparent conductive layer 12 can be controlled in a wide range of from 28.5% to 74.9%.

In contrast, if a pattern generated by reversing the pattern of the transparent electrode pattern parts 13 shown in FIG. 31A is employed in the insulating region, an upper limit of about 65% is derived by the following calculation as the limiting value of the coverage factor of the transparent conductive layer 12 in this insulating region.

Specifically, if circles are arranged in one region, the maximum filling factor of the circles is ideally 90.7% achieved in a condition where the circles are arranged in a staggered pattern. If the radii of the circles are set at 50 μm and if gaps of 8 μm are provided between the circles to arrange the circles independently, the radius of each circle is reduced to (50−8/2)=46 μm. The area ratio of the circles in this condition is determined as (46×46)/(50×50)=0.846, and the filling factor of the circles is determined as (90.7%)×(0.846)=76.7%.

If the radii of the circles are set randomly, gaps between the circles become larger. Accordingly, an actual filling factor is at a value between the filling factor (90.7%) obtained in the staggered pattern and a filling factor (78.5%) obtained in a lattice pattern. This value varies depending on a ratio between the maximum and the minimum of the radii (distribution) of the randomly generated circles, and becomes about 80% at a maximum.

Thus, it is assumed that the radii r of circles to be generated initially as random patterns are set in a range of from $R_{min}$=35 μm to $R_{max}$=50 μm, and gaps of 8 μm are provided between the circles. The filling factor of the circles in this case is determined to be from 80%×(31×31)/(35×35)=62.76% to 80%×(46×46)/(50×50)=67.71%. Even if a distribution of the randomly generated circles is shifted to slightly larger circles, about 65% is still derived as the limit value of the filling factor. It is seen that the limiting value of about 65% of the filling factor thereby calculated is lower than the coverage factor of 74.9% calculated for the transparent insulating pattern part 14 formed by dividing the transparent conductive layer 12 by the groove portions 14c.

[Effects]

In the transparent conductive element 1 of the aforementioned structure, the pore portions 13a are provided randomly in the transparent conductive layer 12 forming the transparent electrode pattern parts 13. Thus, the coverage factor of the transparent conductive layer 12 is kept low in the transparent electrode pattern parts 13. In this regard, the transparent conductive layer 12 divided into island shapes is arranged in the transparent insulating pattern part 14 adjacent to the transparent electrode pattern parts 13. As a result, a difference in coverage factor of the transparent conductive layer 12 can be kept low between the transparent electrode pattern parts 13 and the transparent insulating pattern part 14 to reduce contract between the pattern parts 13 and 14, making it possible to make the patterns of the transparent electrode pattern parts 13 less visible.

In particular, the pore portions 13a are provided randomly in the transparent conductive layer 12 in the transparent electrode pattern parts 13, and the transparent conductive layer 12 in the transparent insulating pattern part 14 is divided by the groove portions 14c extending in random directions. Thus, in a resultant structure, generation of moire is suppressed. Further, a continuous groove pattern extending along the transparent electrode pattern parts 13 will not be arranged at boundaries between the transparent electrode pattern parts 13 and the transparent insulating pattern part 14, so that outlines of the electrode regions are not recognized distinctively.

The coverage factor of the transparent conductive layer 12 in the transparent insulating pattern part 14 can be controlled in a wide range depending on the widths of the groove portions 14c. Thus, even if the transparent conductive layer 12 is set to have a great thickness in order to keep the sheet resistance of the transparent electrode pattern parts 13 low, the coverage factor of the transparent conductive layer 12 can still be high in the transparent insulating pattern part 14. As a result, contrast can be reduced effectively in the transparent electrode pattern parts 13.

[Modifications]

In the sixth embodiment according to the present technique, a printing method may be used in place of an etching method to form transparent conductive elements 1 and 2. Except for the shape of a transferring surface of a master used for the printing method, the printing method may be the same as that described in the above sixth embodiment. Therefore, only the structure of the master will be described here.

[Master]

FIG. 34A is a perspective view showing an example of the shape of the master used in a first manufacturing method. FIG. 34B is a plan view showing part of an electrode region forming part $R_1$ and part of an insulating region forming part $R_2$ (enlarged part B) of FIG. 34A in an enlarged manner. For example, the master 100 shown in these drawings is a roll master having a cylindrical surface functioning as the transferring surface, and the electrode region forming part $R_1$ and the insulating region forming part $R_2$ are laid alternately in the cylindrical surface.

Plural pore portions 113a in the shape of recesses are formed apart in the electrode region forming part $R_1$. The pore portions 113a are provided to form a porous pattern in an electrode region of a transparent conductive element by printing. A projecting portion arranged between all the pore portions 113a in the electrode region forming part $R_1$ is provided to form a transparent conductive layer to be arranged in the electrode region by printing.

Groove portions 114c in the shape of recesses are formed to extend in random directions in the insulating region forming part $R_2$. The groove portions 114c are provided to form groove patterns in the insulating region of the transparent conductive element 1 by printing. Island-shaped projecting portions in the insulating region forming part $R_2$ isolated by the groove portion 114c are provided to form the transparent conductive layer in the shape of independent islands in the insulating region by printing. These projecting portions have the same height as that of the projecting portion in the electrode region forming part $R_1$.

7. Seventh Embodiment

Figure 35:
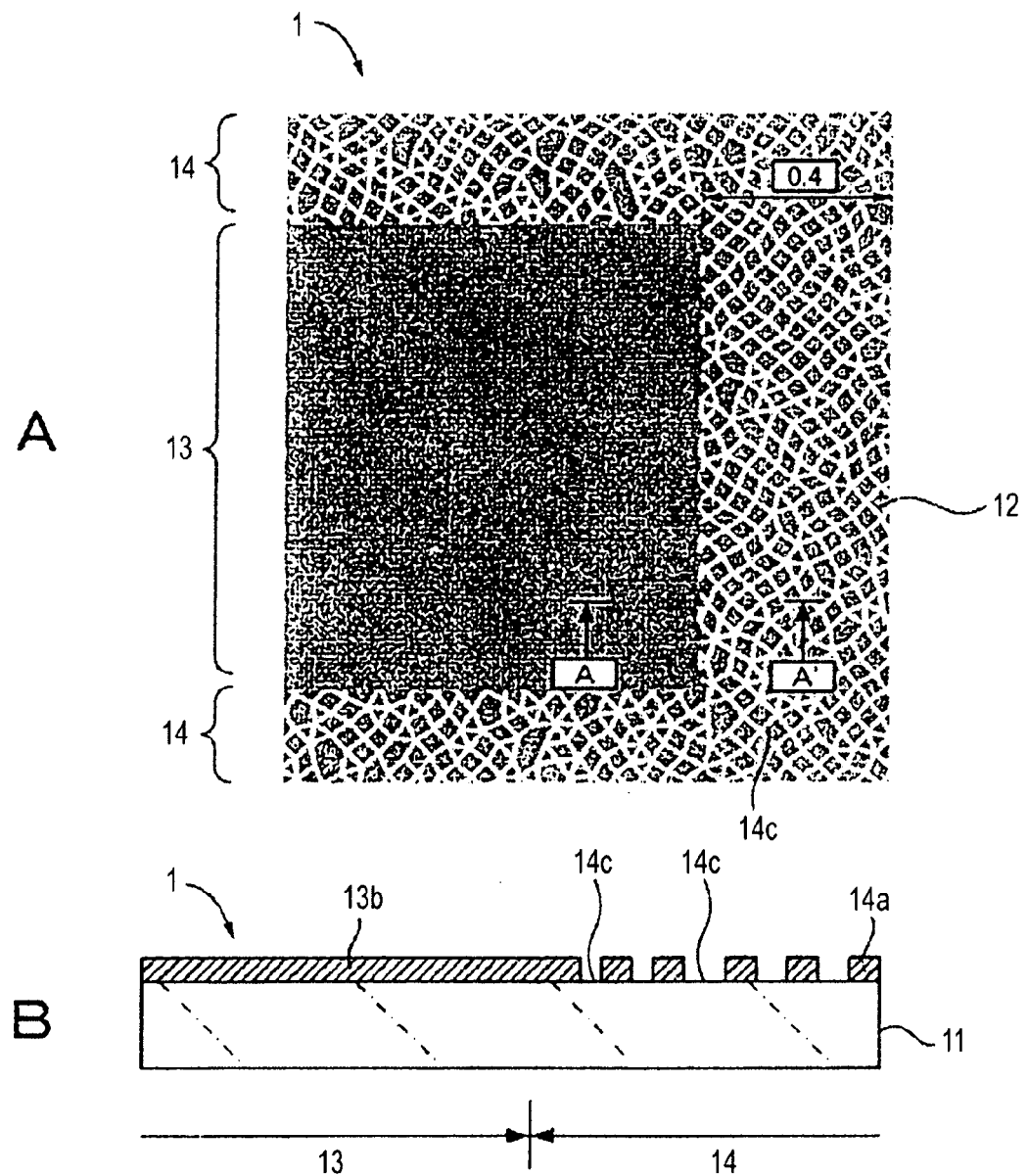
FIG. 35A is a plan view showing part of a transparent conductive element according to a seventh embodiment of the present technique in an enlarged manner.
FIG. 35B is a cross-sectional view taken along line A-A' in FIG. 35A.

FIGS. 35A and 35B are enlarged views describing the structure of a transparent conductive element of a seventh embodiment. FIG. 35A is an enlarged plan view corresponding to enlarged part A of FIG. 30. FIG. 35B is a cross-sectional view of part A-A' in the enlarged plan view of FIG.

35A. The transparent conductive element 1 shown in these drawings has the same structure as that of the transparent conductive element 1 of the sixth embodiment described by using FIG. 31, with a difference in that a transparent electrode pattern part 13 is composed of a transparent conductive layer 12 having the shape of a solidly coated film.

To be specific, the transparent conductive layer 12 having the shape of a solidly coated film is arranged in a region for the transparent electrode pattern part 13, so that the coverage factor of the transparent conductive layer 12 is 100%. The transparent conductive layer 12 provided through the transparent electrode pattern part 13 and a transparent insulating pattern part 14 is also arranged randomly at a boundary between the pattern parts 13 and 14.

In this case, the structure of the transparent insulating pattern part 14 is the same as that of the first embodiment. However, the coverage factor of the transparent conductive layer 12 in the transparent insulating pattern part 14 is set in a range larger than that of the sixth embodiment. In this regard, the line widths of groove portions 14c used to control this coverage factor are controlled in a range smaller than that of the sixth embodiment.

[Effects]

In the transparent conductive element 2 of the aforementioned structure, the transparent conductive layer 12 divided into island shapes by the groove portions 14c extending in random directions is also arranged in the transparent insulating pattern part 14 adjacent to the transparent electrode pattern part 13. Thus, like in the sixth embodiment, generation of moire is suppressed, and the outline of the transparent electrode pattern part 13 is not recognized distinctively in a resultant structure. Additionally, even if the transparent conductive layer 12 is set to have a great thickness in order to keep the sheet resistance of the transparent electrode pattern part 13 low, the coverage factor of the transparent conductive layer 12 can still be high in the transparent insulating pattern part 14. As a result, contrast can be reduced effectively in the transparent electrode pattern part 13.

8. Eighth Embodiment

FIG. 36A is a plan view describing an example of the structure of a transparent conductive element according to an eighth embodiment of the present technique. The eighth embodiment of the present technique differs from the first embodiment in that it numerically limits a ratio in average boundary length (La/Lb) between an average boundary length La of a transparent electrode pattern part 13 and an average boundary length Lb of a transparent insulating pattern part 14. More specifically, it is preferable that the ratio in average boundary length (La/Lb) between the average boundary length La of the transparent electrode pattern part 13 provided in a first region (electrode region) $R_1$ and the average boundary length Lb of the transparent insulating pattern part 14 provided in a second region (insulating region) $R_2$ be in a range of from 0.75 to 1.25. Here, the average boundary length La is an average length of boundaries between pore portions 13a and a conductive portion 13b provided in the transparent electrode pattern part 13, and the average boundary length Lb is an average length of boundaries between island portions 14a and a void portion 14b provided in the transparent insulating pattern part 14.

The ratio in average boundary length (La/Lb) going out of the aforementioned range makes visual recognition of the transparent electrode pattern part 13 and the transparent insulating pattern part 14 unavoidable, even if a difference in coverage factor between the transparent electrode pattern part 13 and the transparent insulating pattern part 14 does not change. This is, for example, due to the fact that part with a transparent conductive material and part without a transparent conductive material have different indexes of refraction. If there is a large difference in index of refraction between the part with a transparent conductive material and the part without a transparent conductive material, light scattering occurs at a boundary between the part with a transparent conductive material and the part without a transparent conductive material. This makes a region with a longer boundary length more whitish, so that the absolute value of a difference in reflection L value between the transparent electrode pattern part 13 and the transparent insulating pattern part 14 evaluated in accordance with JIS Z8722 becomes 0.3 or more. This makes visual recognition of a pattern unavoidable regardless of a difference in coverage factor.

The average boundary length La of the transparent electrode pattern part 13 is determined as follows. First, the transparent electrode pattern part 13 is observed with a digital microscope (trade name: VHX-900, available from KEYENCE CORPORATION) in a magnification range of from 100× to 500×, and an observed image is stored. Next, image analysis is performed on the stored observed image to measure a boundary ($\Sigma C_i = C_1 + \ldots + C_n$), thereby obtaining a boundary length $L_1$ [mm/mm$^2$]. This measurement is performed on 10 fields of view selected at random from the transparent electrode pattern part 13, thereby obtaining boundary lengths $L_1, \ldots, L_{10}$. Then, the resultant boundary lengths $L_1, \ldots, L_{10}$ are simply averaged (arithmetically averaged) to determine the average boundary length La of the transparent electrode pattern part 13.

The average boundary length Lb of the transparent insulating pattern part 14 is determined as follows. First, the transparent insulating pattern part 14 is observed with a digital microscope (trade name: VHX-900, available from KEYENCE CORPORATION) in a magnification range of from 100× to 500×, and an observed image is stored. Next, image analysis is performed on the stored observed image to measure a boundary ($\Sigma C_i = C_1 + \ldots + C_n$), thereby obtaining the boundary length $L_1$ [mm/mm$^2$]. This measurement is performed on 10 fields of view selected at random from the transparent insulating pattern part 14, thereby obtaining boundary lengths $L_1, \ldots, L_{10}$. Then, the resultant boundary lengths $L_1, \ldots, L_{10}$ are simply averaged (arithmetically averaged) to determine the average boundary length Lb of the transparent insulating pattern part 14.

[Modifications]

FIG. 36B is a plan view describing a modification of the transparent conductive element according to the eighth embodiment of the present technique. As shown in FIG. 36B, if groove portions 14c of a mesh pattern are provided in the transparent insulating pattern part 14, it is still preferable that the ratio in average boundary length (La/Lb) be in a range of from 0.75 to 1.25. Here, the average boundary length Lb is an average length of boundaries between the island portions 14a and the groove portions 14c as an example of a void portion provided in the transparent insulating pattern part 14. The average boundary length Lb of the transparent insulating pattern part 14 is determined in the same manner as that described above, except that a boundary ($\Sigma l_i = l_1 + \ldots + l_n$) is measured, and boundary lengths $L_1, \ldots, L_{10}$ [mm/mm$^2$] are obtained by image analysis. Here, the boundary $l_i$ ($l_1, \ldots, l_n$) means a boundary between each of the island portions 14a and the groove portions 14c.

9. Ninth Embodiment

Figure 37:
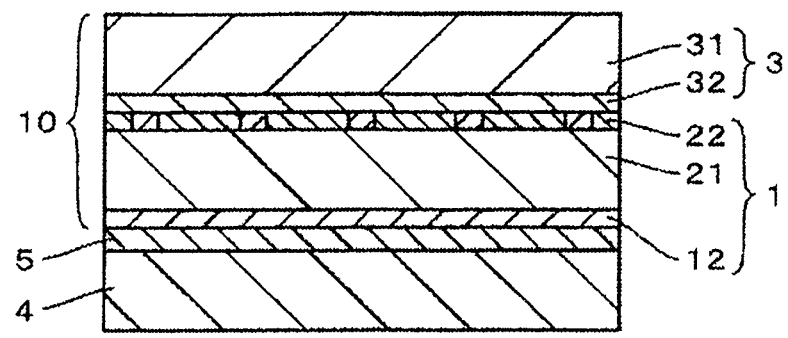
FIG. 37 is a cross-sectional view showing an example of the structure of an information input device according to a ninth embodiment of the present technique.

FIG. 37 is a cross-sectional view showing an example of the structure of an information input device according to a ninth embodiment of the present technique. The information input device according to the ninth embodiment differs from the information input device of the first embodiment in that it includes a transparent conductive layer 12 on one principal surface of a base 21, and a transparent conductive layer 22 on the opposite principal surface of the base 21. The transparent conductive layer 12 includes a transparent electrode pattern part and a transparent insulating pattern part. The transparent conductive layer 22 includes a transparent electrode pattern part and a transparent insulating pattern part. The transparent electrode pattern part of the transparent conductive layer 12 is an X electrode pattern part extending in an X axis direction, and the transparent electrode pattern part of the transparent conductive layer 22 is a Y electrode pattern part extending in a Y axis direction. Therefore, the respective transparent electrode pattern parts of the transparent conductive layers 12 and 22 are perpendicular to each other.

10. Tenth Embodiment

FIG. 38 includes a cross-sectional view showing an example of the structure of a transparent conductive element according to a tenth embodiment of the present technique. As shown in FIG. 38, an information input device 10 includes a base 11, plural transparent electrode pattern parts 13 and plural transparent electrode pattern parts 23, an insulating pattern part 14, and a transparent insulating layer 51. The plural transparent electrode pattern parts 13 and the plural transparent electrode pattern parts 23 are provided on the same surface of the base 11. The insulating pattern part 14 is provided between the transparent electrode pattern parts 13 and the transparent electrode pattern parts 23 as seen in the in-plane direction of the base 11. The transparent insulating layer 51 is placed between the transparent electrode pattern parts 13 and the transparent electrode pattern parts 23 and at intersections therebetween.

If necessary, an optical layer 52 may be provided further on the surface of the base 11 on which the transparent electrode pattern parts 13 and the transparent electrode pattern parts 23 are formed. The optical layer 52 includes a bonding layer 53 and a base 54, and the base 54 is bonded through the bonding layer 53 to the surface of the base 11. The information input device 10 is applied preferably to a display surface of a display device. The base 11 and the optical layer 52 have transparencies to allow passage of visible light, for example. It is preferable that the base 11 and the optical layer 52 have indexes of refraction n in a range of from 1.2 to 1.7. In the description below, two directions perpendicular to each other within a surface of the information input device 10 are called an X axis direction and a Y axis direction, and a direction vertical to this surface is called a Z axis direction.

The transparent electrode pattern parts 13 extend in the X axis direction (first direction) on the surface of the base 11, whereas the transparent electrode pattern parts 23 extend in the Y axis direction (second direction) on the surface of the base 11. Thus, the transparent electrode pattern parts 13 and the transparent electrode pattern parts 23 cross each other at right angles. At intersections C where the transparent electrode pattern parts 13 and the transparent electrode pattern parts 23 cross each other, the transparent insulating layer 51 is placed therebetween to electrically isolate these electrodes. One end of each of the transparent electrode pattern parts 13 and one end of each of the transparent electrode pattern parts 23 are electrically connected to an extraction electrode, and these extraction electrodes and a driving circuit are connected through an FPC (flexible printed circuit).

FIG. 39A is a plan view showing the intersection C and its vicinity of FIG. 38A in an enlarged manner. FIG. 39B is a cross-sectional view taken along line A-A of FIG. 39A. The transparent electrode pattern part 13 includes plural pad sections (unit electrode bodies) 13m, and plural coupling sections 13n connecting the pad sections 13m. The coupling sections 13n extend in the X axis direction, and connect end portions of adjacent pad sections 13m. The transparent electrode pattern part 23 includes plural pad sections (unit electrode bodies) 23m, and plural coupling sections 23n connecting the pad sections 23m. The coupling sections 23n extend in the Y axis direction, and connect end portions of adjacent pad sections 23m.

At the intersections C, the coupling sections 23n, the transparent insulating layer 51, and the coupling sections 13n are stacked in this order on the surface of the base 11. The coupling sections 13n are formed so as to cross over the transparent insulating layer 51 transversely, and one end of each of the coupling sections 13n crossing over the transparent insulating layer 51 is electrically connected to one of adjacent pad sections 13m, and the other end of this coupling section 13n crossing over the transparent insulating layer 51 is electrically connected to the other of the adjacent pad sections 13m.

The pad sections 23m and the coupling sections 23n are formed integrally, whereas the pad sections 13m and the coupling sections 13n are formed separately. The pad sections 13m, the pad sections 23m, the coupling sections 23n, and the insulating pattern part 14 are composed of a transparent conductive layer 12 being a single layer provided on the surface of the base 11. The coupling sections 13n are composed of a conductive layer, for example.

(Transparent Insulating Layer)

It is preferable that the transparent insulating layer 51 have an area larger than that of intersections between the coupling sections 13n and the coupling sections 23n. For example, the transparent insulating layer 51 has a size that makes the transparent insulating layer 51 cover the tip ends of the pad sections 13m and those of the pad sections 23m at the intersections C.

The transparent insulating layer 51 mainly contains a transparent insulating material. It is preferable that a transparent polymeric material be used as the transparent insulating material. Examples of this material include: (meth)acrylic resins such as polymethylmethacrylate, and copolymers of methylmethacrylate and different vinyl monomers such as alkyl(meth)acrylate and styrene; polycarbonate resins such as polycarbonate and diethyleneglycol-bis-allylcarbonate (CR-39); thermosetting (meth)acrylic resins such as homopolymers and copolymers of (brominated) bisphenol A type di(meth)acrylate, and polymers and copolymers of urethane modified monomers of (brominated) bisphenol A mono (meth)acrylate; polyester, specifically polyethylene terephthalate, polyethylene naphthalate and unsaturated polyester; copolymers of acrylonitrile and styrene; polyvinyl chloride; polyurethane; epoxy resins; polyarylate; polyether sulphone; polyether ketone; cycloolefin polymers (trade name: ARTON and ZEONOR); and cycloolefin copolymers. Aramid resins allowing for resistance to heat are also applicable. (Meth) acrylate mentioned here means acrylate or methacrylate.

(Conductive Layer)

A metal layer or a transparent conductive layer is applicable as the conductive layer forming the coupling sections 13n. The metal layer mainly contains metal. It is preferable that a high-conductivity metal be used as the metal, and examples of such a metal include Ag, Al, Cu, Ti, Nb, and impurity-added Si. In this regard, in consideration of a conductivity level, film deposition performance, and printing performance, for example, Ag is preferred. It is preferable that the widths, thicknesses, and lengths of the coupling sections 13n be reduced by using a high-conductivity metal as a material for the metal layer, as this can enhance visibility.

The transparent conductive layer mainly contains a transparent conductive material. This transparent conductive material can be the same as that for the pad sections 13m, the pad sections 23m, and the coupling sections 23n. If the transparent conductive layer is used as the conductive layer, in order for the coupling sections 13n to have transparency, the coupling sections 13n may have wider widths than those in the case where the metal layer is used as the conductive layer.

11. Eleventh Embodiment

Exemplary Application to Electronic Device

FIGS. 40 to 44 show examples of electronic devices with display parts to which the display device including the information input device according to the first embodiment described by referring to FIG. 1 is applied. Exemplary applications of the present technique to electronic devices will be described below.

Figure 40:
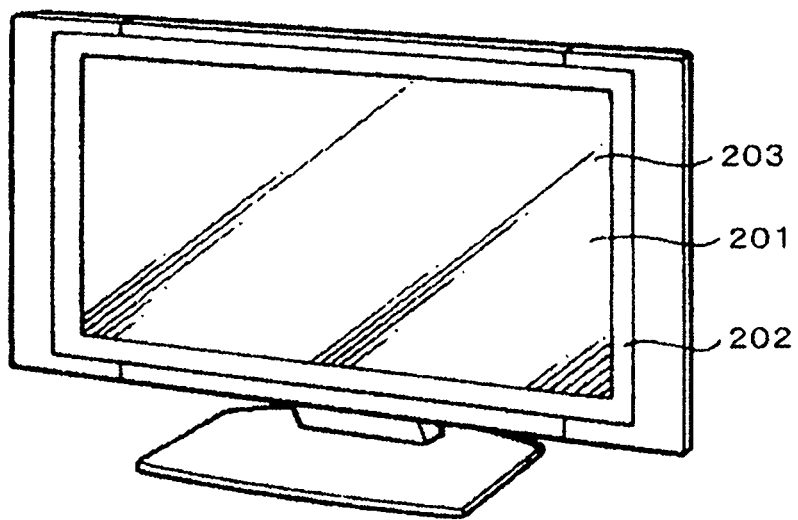
FIG. 40 is a perspective view showing a television (electronic device) with a display part.

FIG. 40 is a perspective view showing a television set to which the present technique is applied. A television set 200 according to this exemplary application includes a display part 201 composed of a front panel 202, a filter glass 203, and the like. The aforementioned display device is applied as the display part 201.

Figure 41:
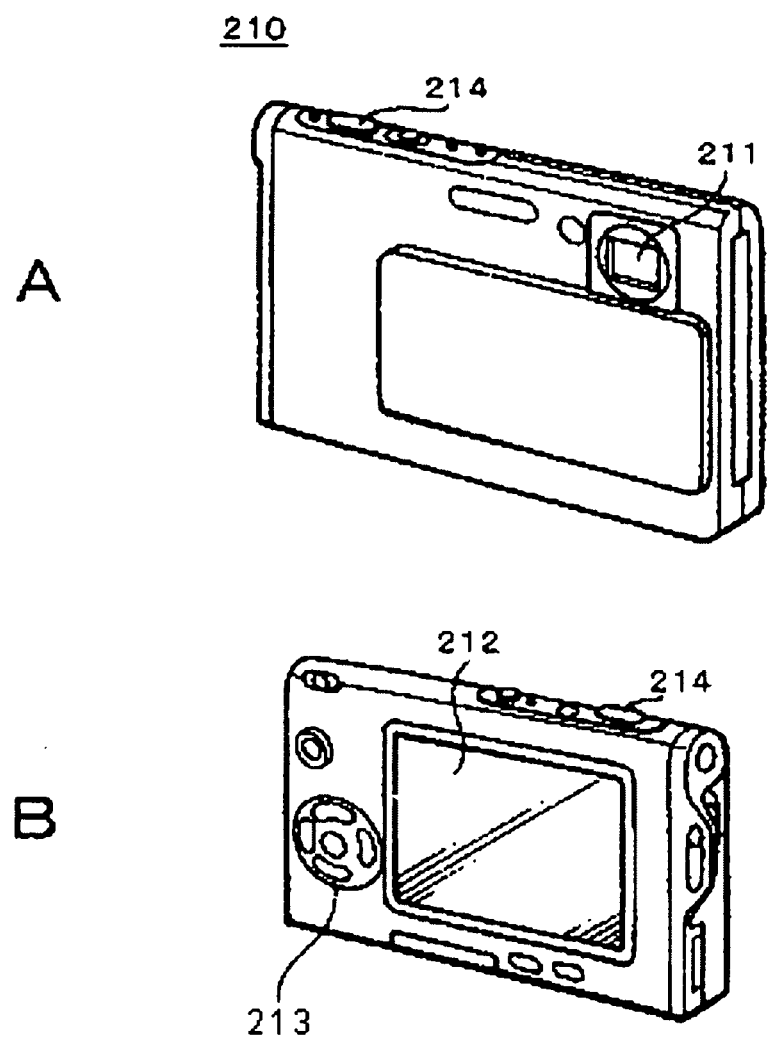
FIG. 41 is a perspective view showing a digital camera (electronic device) with a display part.

FIG. 41 shows a digital camera to which the present technique is applied. FIG. 41A is a perspective view from the front side, and FIG. 41B is a perspective view from the rear side. A digital camera 210 according to this exemplary application includes a light emitting part 211 for flashes, a display part 212, a menu switch 213, a shutter button 214, and the like. The aforementioned display device is applied as the display part 212.

Figure 42:
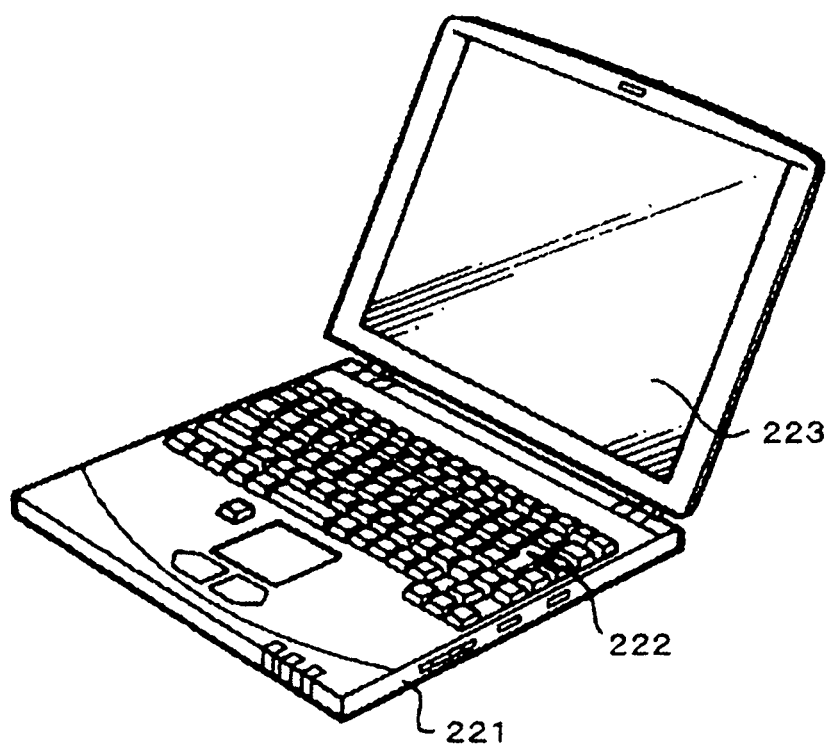
FIG. 42 is a perspective view showing a notebook-type personal computer (electronic device) with a display part.

FIG. 42 is a perspective view showing a notebook-type personal computer to which the present technique is applied. A notebook-type personal computer 220 according to this exemplary application includes a main body 221, a keyboard 222 operated for entry of characters and others, a display part 223 on which images are displayed, and the like. The aforementioned display device is applied as the display part 223.

Figure 43:
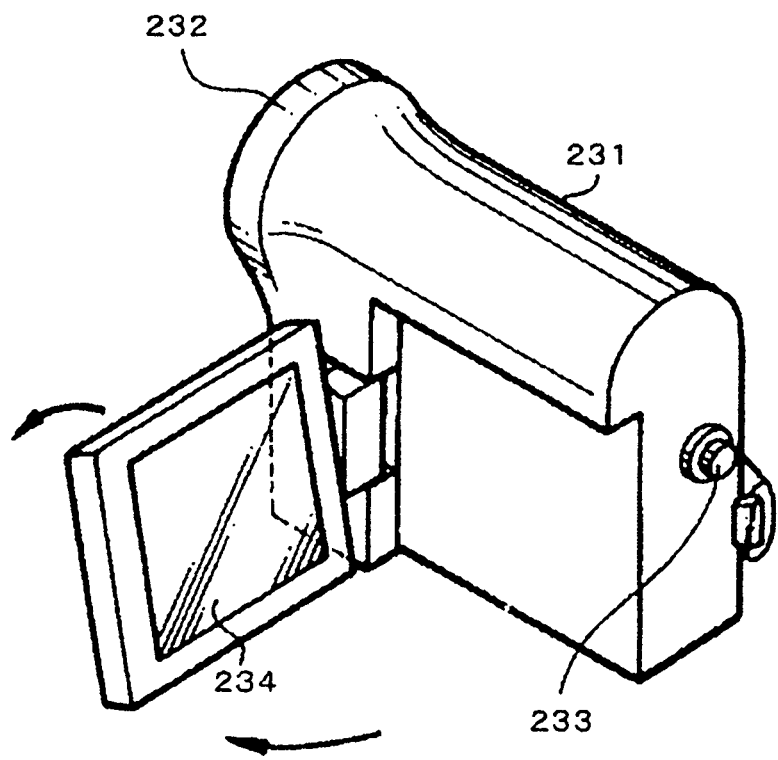
FIG. 43 is a perspective view showing a video camera (electronic device) with a display part.

FIG. 43 is a perspective view showing a video camera to which the present technique is applied. A video camera 230 according to this exemplary application includes a main body part 231, a lens 232 for image capture of targets provided on a forward-facing side surface, a start/stop switch 233 used in image capture, a display part 234, and the like. The aforementioned display device is applied as the display part 234.

Figure 44:
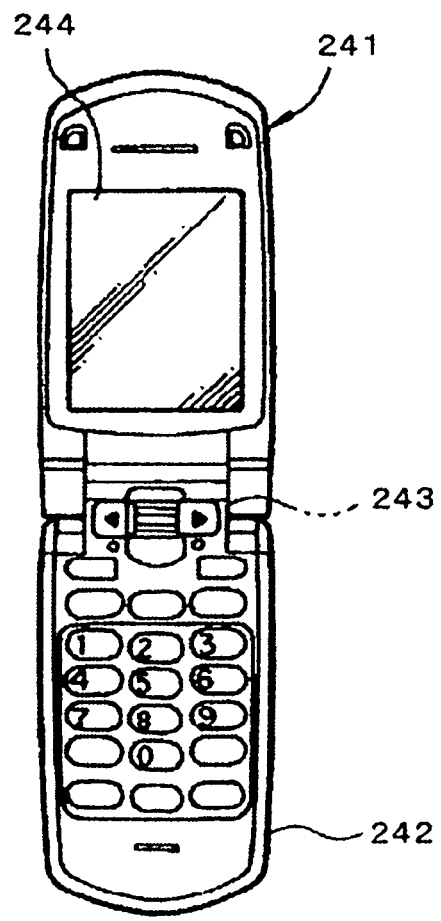
FIG. 44 is a front view showing a portable terminal device (electronic device) with a display part.

FIG. 44 is a front view showing portable terminal device, for example a cell-phone to which the present technique is applied. A cell-phone 240 according to this exemplary application includes an upper casing 241, a lower casing 242, a coupling part (here, a hinge part) 243, a display part 244, and the like. The aforementioned display device is applied as the display part 244.

[Effects]

All the aforementioned electronic devices of the eleventh embodiment use the display device described in the first embodiment as their display parts. Therefore, while being provided with the information input device 10, these electronic devices are capable of achieving high-definition display on their display panels.

EXAMPLES

The present technique will be described in detail by way of Examples below. However, the present technique is not intended to be limited to these Examples.

Examples 1-1 to 1-4

First, an ITO layer was formed by a sputtering method on a surface of a PET film of a thickness of 125 μm, thereby obtaining a transparent conductive film. The sheet resistance of the transparent conductive film was 254 Ω/sq. Next, a resist layer was formed on the ITO layer of the transparent conductive film, and thereafter, the resist layer was exposed to light while using a Cr photomask with a random pattern. The random pattern of the Cr photomask used at this time was composed of circular shapes. Then, the resist layer was developed to form the resist pattern, and the ITO layer was wet etched while using the resist pattern as a mask. The resist layer was thereafter removed by aching process. As a result, a transparent electrode pattern part and a transparent insulating pattern part were obtained where plural pore portions and plural island portions having parameters shown in Table 2 were randomly formed, respectively. FIGS. 45A and 45B show the photographs of these pattern parts. In FIGS. 45A and 45B, a first region $R_1$ is a conductive part functioning as an electrode, and a second region $R_2$ is a non-conductive part functioning as a dummy electrode.

As a result, a target transparent conductive film was obtained.

Examples 1-5 to 1-8

A silver nanowire layer was formed by a coating method on a surface of a PET film of a thickness of 125 μm, thereby obtaining a transparent conductive film. The sheet resistance of the transparent conductive film was 130 Ω/sq. Except for this, the transparent conductive film was formed in the same manner as in Examples 1-1 to 1-4.

Comparative Examples 1-1

A transparent conductive film was obtained in the same manner as in Example 1-1 except that a transparent electrode pattern part and a transparent insulating pattern part were formed while using a Cr photomask without a random pattern.

Comparative Examples 1-2

A transparent conductive film was obtained in the same manner as in Example 1-5 except that a transparent electrode pattern part and a transparent insulating pattern part were formed while using a Cr photomask without a random pattern.

(Evaluation)

The transparent conductive films obtained as above were each evaluated as follows in terms of the invisibility of the transparent electrode pattern part, glare, moire, and interfering light. First, the transparent conductive film was bonded to a liquid crystal display measuring 3.5 inches diagonally through a pressure-sensitive adhesive sheet such that a surface of the transparent conductive film on the side of ITO or silver nanowires faced a screen. Next, an AR film was bonded through a pressure-sensitive adhesive sheet to the transparent conductive film on the side of its base (PET film). Then, black or green representation was given on the liquid crystal display and a display surface was observed by visual observation to evaluate invisibility, glare, moire, and interfering light. Results obtained therefrom are shown in Table 2.

Criteria for evaluation of invisibility, glare, moire, and interfering light are given below.

<Invisibility>
AA: A pattern is completely invisible from any angle
A: A pattern is very hard to be visually recognized but is visually recognizable depending on an angle
B: Visually recognizable
<Glare>
AA: Glare is not recognized from any angle
A: Glare is not recognized as observed from the front, but some glare is recognized as observed diagonally
B: Glare is recognized as observed from the front
<Moire and Interfering Light>
AA: Moire and interfering light are not recognized from any angle
A: Moire and interfering light are not recognized as observed from the front, but some moire and some interfering light are recognized as observed diagonally
B: Moire and interfering light are recognized as observed from the front Such a slight difference between the effect achieved by the ITO and that achieved by the silver nanowires results from the fact that patterns made of the ITO and the silver nanowires are visually recognized for different reasons. In the case of the ITO film, visual recognition of a pattern is unavoidable due to a difference in reflectivity between the conductive part and the non-conductive part. In contrast, in the case of the silver nanowire film, visual recognition of a pattern is unavoidable due to a difference in reflection L value. It is considered that, while invisibility is enhanced in both cases by employing the random patterns shown in Examples 1-1 to 1-8, the accompanying effect is slightly different between these cases.

Even if there is a difference in coverage factor of 50% between the conductive pattern part and the non-conductive pattern part, the effect of making the transparent electrode pattern part hard to be visually recognized is still achieved satisfactorily. With substantially the same coverage factor, the transparent electrode pattern part could not be confirmed in any of visual recognition methods. This is because the transparent electrode pattern part becomes most difficult to be visually recognized if the coverage factor in the transparent electrode pattern part and that in the transparent insulating

TABLE 2

| | Conductive Material | Size Range of Circle (Diameter: μm) | Distance between Nearest Circles (μm) | Coverage Factor of Conductive Portion (%) | Coverage Factor of Non-Conductive Portion (%) | Difference in Coverage Factor (%) | Invisibility | Glare | Moire and Interfering Light |
|---|---|---|---|---|---|---|---|---|---|
| Example 1-1 | ITO | 20 to 50 | 20 | 66.9 | 33.1 | 34 | A | AA | AA |
| Example 1-2 | ITO | 35 to 50 | 35 | 75.5 | 24.5 | 51 | A | AA | AA |
| Example 1-3 | ITO | 35 to 77 | 35 | 69.0 | 31.0 | 38 | A | AA | AA |
| Example 1-4 | ITO | 50 to 92 | 20 | 50.3 | 49.7 | 1 | AA | AA | AA |
| Example 1-5 | Ag Nanowire | 20 to 50 | 20 | 66.9 | 33.1 | 34 | A | AA | AA |
| Example 1-6 | Ag Nanowire | 35 to 50 | 35 | 755 | 24.5 | 51 | A | AA | AA |
| Example 1-7 | Ag Nanowire | 35 to 77 | 35 | 69.0 | 31.0 | 38 | A | AA | AA |
| Example 1-8 | Ag Nanowire | 50 to 92 | 20 | 50.3 | 49.7 | 1 | AA | AA | AA |
| Comparative Example 1-1 | ITO | — | — | 100 | 0 | 100 | B | AA | AA |
| Comparative Example 1-2 | Ag Nanowire | — | — | 100 | 0 | 100 | B | AA | AA |

The following is understood from Table 2.

In Examples 1-1 to 1-8 where the pore portions and the island portions are randomly formed, the conductive pattern part can be made more invisible. Further, glare can be suppressed, and generation of moire and interfering light can also be suppressed. In contrast, in Comparative Examples 1-1 and 1-2 where pore portions and island portions are not formed, the conductive pattern part cannot be made more invisible.

Employing the random pattern shown in Examples 1-1 to 1-8 allows the electrode pattern to be more invisible both in the ITO film and the silver nanowire film. The resultant conductive films were observed in more detail, and it was found that in the case of the silver nanowire film, the reflection L value of the conductive part reduced due to the decrease in area covered with the silver nanowires. As a result, black representation was made on a screen corresponding to the conductive part was made deeper to produce an effect in that the display characteristics of a display were enhanced compared to the use of a linear pattern or a diamond pattern.

pattern part are completely the same. In consideration of this point, it is preferable that these coverage factors be the same or close to each other.

Various conditions and results of evaluation relating to Examples 2-1 to 2-12 described below are shown in Table 3. Criteria for evaluation of invisibility, moire and interfering light, and glare are the same as those employed in Examples 1-1 to 1-8, and Comparative Examples 1-1 and 1-2 described above.

Examples 2-1 to 2-3

First, an ITO layer was formed by a sputtering method on a surface of a PET film of a thickness of 125 μm, thereby obtaining a transparent conductive film. The sheet resistance of the transparent conductive film was 150 Ω/sq. Next, a resist layer was formed on the ITO layer of the transparent conductive film, and thereafter, the resist layer was exposed to light while using a Cr photomask with a random pattern. The random pattern of the Cr photomask used at this time was composed of circular shapes. Then, the resist layer was developed to form the resist pattern, and the ITO layer was wet etched while using the resist pattern as a mask. The resist layer was thereafter removed by ashing process.

Figure 46:
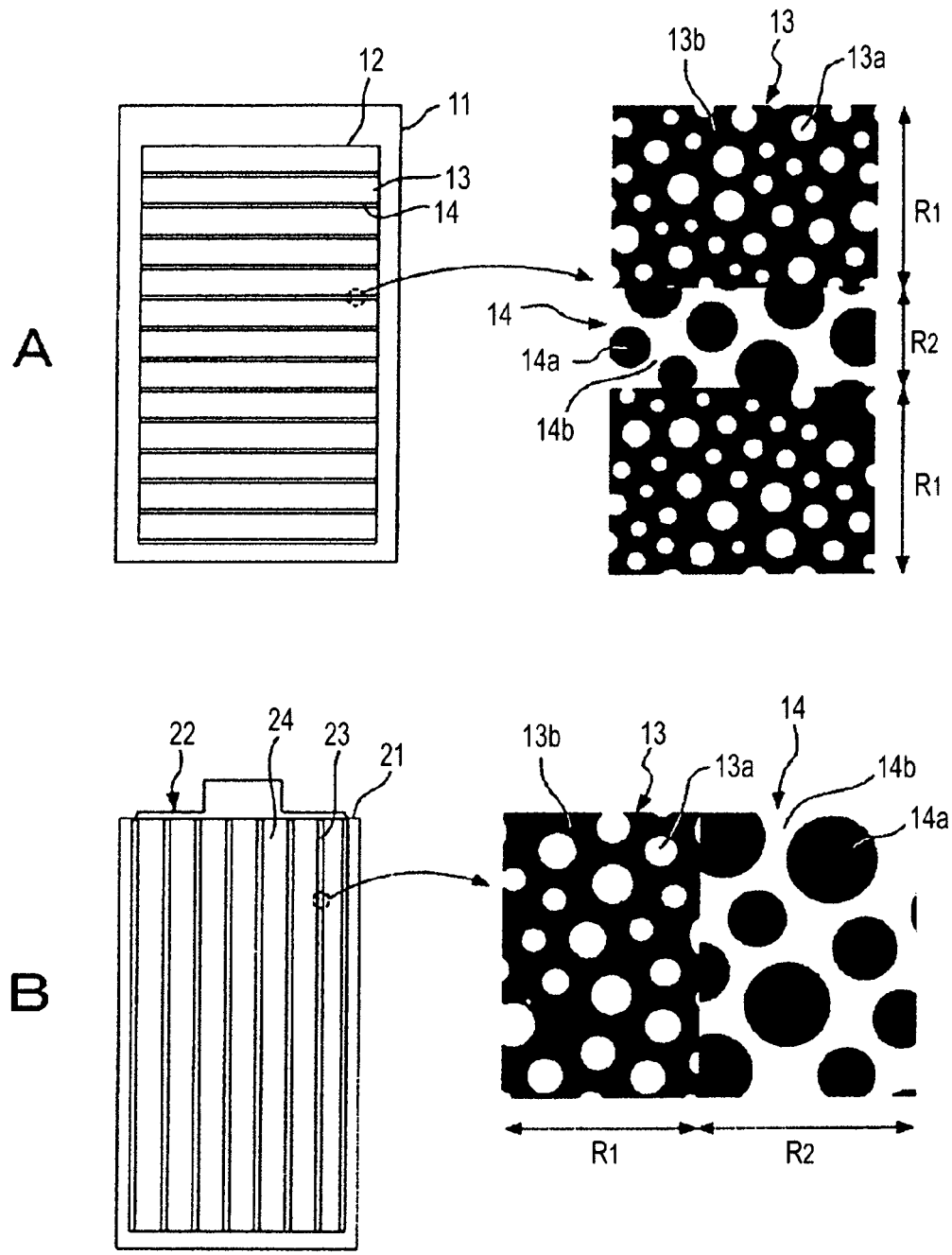
FIGS. 46A and 46B are plan views describing random patterns of Examples.

As a result, an X electrode (transparent conductive element 1) was obtained having parameters shown in Example 2-1 of Table 3, and including transparent electrode pattern parts 13 and transparent insulating pattern parts 14 where plural pore portions 13a and plural island portions 14a were randomly formed respectively as shown in FIG. 46A. As seen from the parameters of Table 3, the transparent electrode pattern parts 13 and the transparent insulating pattern parts 14 have different parameters for their size ranges of circles, so that they were determined based on random patterns different from each other. Numerical values of the size ranges of circles of Table 3 indicate the diameters of circles randomly generated finally (circles corresponding to the pore portions 13a and the island portions 14a), and do not indicate the radii of circles existing during pattern generation process (namely, they do not indicate $R_{min}$ or $R_{max}$ mentioned above). The coverage factor of a conductive material portion in the transparent electrode pattern parts 13 was 66.9%, and that of a conductive material portion in the transparent insulating pattern parts 14 was 49.8%.

Regarding the transparent conductive element 1 of Example 2-1 alone, considerably satisfactory evaluation result was obtained relating to moire, interfering light and glare, and substantially satisfactory evaluation result was obtained relating to invisibility.

As Example 2-2, a Y electrode (transparent conductive element 2) was formed in the same manner as in Example 2-1. The Y electrode has parameters shown in Table 3, and includes transparent electrode pattern parts 23 and transparent insulating pattern parts 24 where plural pore portions 13a and plural island portions 14a were randomly formed respectively as shown in FIG. 46B. In Example 2-2, the coverage factor of a conductive material portion in the transparent electrode pattern parts 23 was also 66.9%, and that of a conductive material portion in the transparent insulating pattern parts 24 was also 49.8%.

Regarding the transparent conductive element 2 of Example 2-2 alone, considerably satisfactory evaluation result was obtained relating to moire, interfering light and glare, and substantially satisfactory evaluation result was obtained relating to invisibility.

In Example 2-3, evaluation was made while the respective transparent conductive elements 1 and 2 of Examples 2-1 and 2-2 described above were placed one above the other. More specifically, evaluation was made in a condition corresponding to that of the information input device 10 having the structure of FIG. 1.

A difference in the sum of the coverage factors of the conductive material portions was 34.2 at a maximum.

To be specific, in terms of the regions AR1, AR2 and AR3 shown in FIGS. 22B and 27B, the sum of the coverage factors was as follows:

Region AR1: 66.9+66.9=133.8
Region AR2: 49.8+49.8=99.6
Region AR3: 66.9+49.8=116.7

Therefore, the maximum difference in the sum was 133.8−99.6=34.2.

Regarding Example 2-3, considerably satisfactory evaluation result was obtained relating to moire, interfering light and glare, and substantially satisfactory evaluation result was obtained relating to invisibility.

Examples 2-4 to 2-6

A silver nanowire layer was formed by a coating method on a surface of a PET film of a thickness of 125 μm, thereby obtaining a transparent conductive film. The sheet resistance of the transparent conductive film was 100 Ω/sq. Except for this, evaluation was made in the same manner as in Examples 2-1 to 2-3.

In this case, a difference in the sum of the coverage factors of conductive material portions determined in Example 2-6 was also 34.2 at a maximum. As seen from Table 3, considerably satisfactory result was obtained relating to moire, interfering light and glare, and substantially satisfactory result was obtained relating to invisibility in Example 2-4 (transparent conductive element 1 alone), Example 2-5 (transparent conductive element 2 alone), and Example 2-6 (information input device 10 of the structure of FIG. 1 using Examples 2-4 and 2-5).

Examples 2-7 to 2-9

The process of Examples 2-4 to 2-6 was followed to obtain an X electrode (transparent conductive element 1) of Example 2-7 and a Y electrode (transparent conductive element 2) of Example 2-8 each including a transparent electrode pattern part and a transparent insulating pattern part where plural pore portions 13a and plural island portions 14a having parameters shown in Table 3 were randomly formed respectively, and a combination of the X and Y electrodes (information input device 10) of Example 2-9. Note that a random pattern was not arranged in a conductive part of the Y electrode.

In the X electrode, a transparent electrode pattern part 13 and a transparent insulating pattern part 14 have different parameters for their size ranges of circles and for their distances between nearest circles, so that they were determined based on random patterns different from each other. In the Y electrode, a conductive material portion occupies 100% of a transparent electrode pattern part 23, and a transparent insulating pattern part 24 is formed of a random pattern generated based on parameters for a size range of circles and for a distance between nearest circles shown in the drawing. As a result, the transparent electrode pattern part 23 and the transparent insulating pattern part 24 were determined based on patterns different from each other. In this case, a difference in the sum of the coverage factors of conductive material portions determined in Example 2-9 was 52.6 at a maximum.

As seen from Table 3, considerably satisfactory result was obtained relating to moire, interfering light and glare, and substantially satisfactory result was obtained relating to invisibility in Example 2-7 (transparent conductive element 1 alone), Example 2-8 (transparent conductive element 2 alone), and Example 2-9 (information input device 10 of the structure of FIG. 1 using Examples 2-7 and 2-8).

Examples 2-10 to 2-12

The process of Examples 2-4 to 2-6 was followed to obtain an X electrode (transparent conductive element 1) of Example 2-10, a Y electrode (transparent conductive element 2) of Example 2-11, and a combination of the X and Y electrodes (information input device 10) of Example 2-12.

Figure 47:
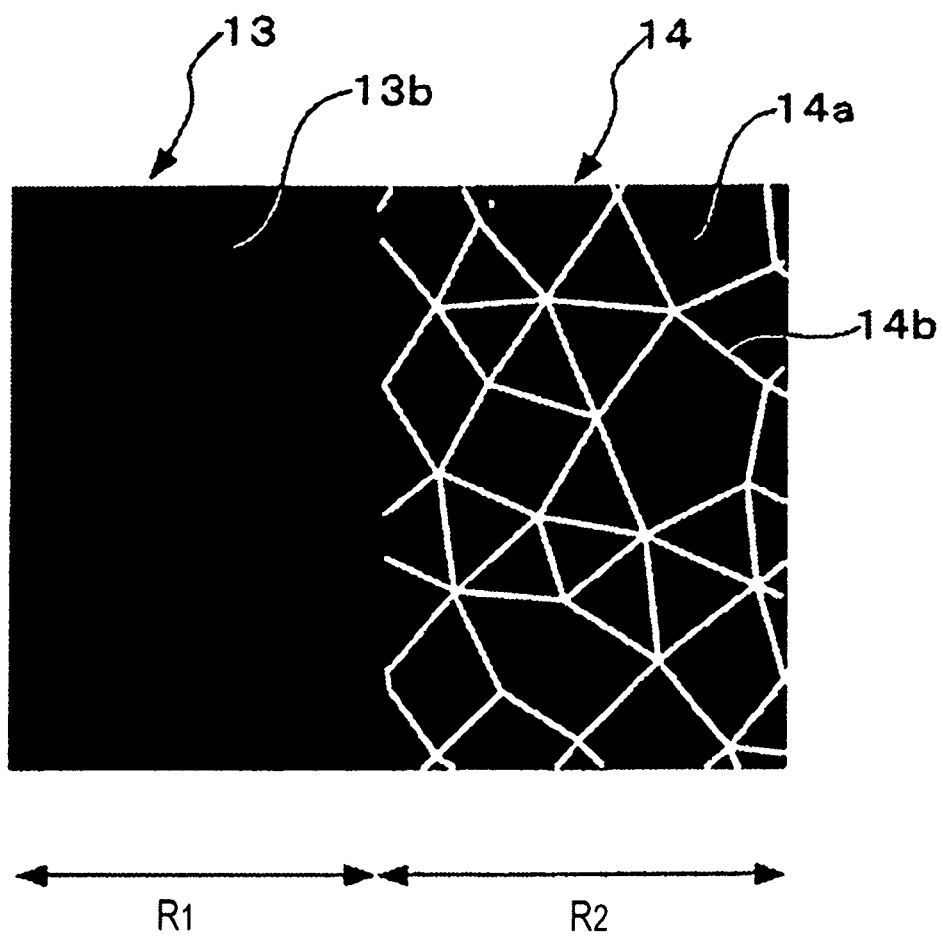
FIG. 47 is a plan view describing a random pattern of Examples.

In Examples 2-10 and 2-11, a random pattern was not arranged in transparent electrode pattern parts 13 and 23 (region RD, so that the coverage factor of a conductive material portion therein was 100% as shown in FIG. 47. Further, a random mesh pattern was arranged in insulating pattern parts 14 and 24 (region $R_2$). Such a random mesh pattern with island portions 14a was generated based on parameters for a The Ag nanowire films with random patterns were dipped in a solution in which a colored compound dissolved, thereby making the colored compound selectively adsorb on Ag nanowire surfaces. This treatment reduced the reflection L values of both the conductive and non-conductive parts. As a result, the display characteristics of the display were enhanced further.

TABLE 3

| | Electrode | Conductive Material | Region | Size Range of Circle (Diameter: μm) | Distance Between Nearest Circles (μm) | Coverage Factor of Conductive Portion (%) | Difference in Coverage Factor (%) | Invisibility | Glare | Moire And Interfering Light |
|---|---|---|---|---|---|---|---|---|---|---|
| Example 2-1 | X Electrode | ITO | Electrode Pattern Part | 20 to 50 | 20 | 66.9 | 17.1 | AA | AA | AA |
| | | | Insulating Pattern Part | 50 to 92 | 20 | 49.8 | | | | |
| Example 2-2 | Y Electrode | ITO | Electrode Pattern Part | 20 to 50 | 20 | 66.9 | 17.1 | AA | AA | AA |
| | | | Insulating Pattern Part | 50 to 92 | 20 | 49.8 | | | | |
| Example 2-3 | X + Y Electrode | | | | | | 34.2 at max | A | AA | AA |
| Example 2-4 | X Electrode | Ag Nanowire | Electrode Pattern Part | 20 to 50 | 20 | 66.9 | 17.1 | AA | AA | AA |
| | | | Insulating Pattern Part | 50 to 92 | 20 | 49.8 | | | | |
| Example 2-5 | Y Electrode | Ag Nanowire | Electrode Pattern Part | 20 to 50 | 20 | 66.9 | 17.1 | AA | AA | AA |
| | | | Insulating Pattern Part | 50 to 92 | 20 | 49.8 | | | | |
| Example 2-6 | X + Y Electrode | | | | | | 34.2 at max | A | AA | AA |
| Example 2-7 | X Electrode | Ag Nanowire | Electrode Pattern Part | 10 to 70 | 40 | 79.2 | 15.9 | AA | AA | AA |
| | | | Insulating Pattern Part | 40 to 100 | 10 | 63.3 | | | | |
| Example 2-8 | Y Electrode | Ag Nanowire | Electrode Pattern Part | — | — | 100 | 36.7 | A | AA | AA |
| | | | Insulating Pattern Part | 40 to 100 | 10 | 63.3 | | | | |
| Example 2-9 | X + Y Electrode | | | | | | 52.6 at max | A | AA | AA |
| Example 2-10 | X Electrode | Ag Nanowire | Electrode Pattern Part | — | — | 100 | 16.1 | AA | AA | AA |
| | | | Insulating Pattern Part | 50 to 90 | 5 | 83.9 | | | | |
| Example 2-11 | Y Electrode | Ag Nanowire | Electrode Pattern Part | — | — | 100 | 16.1 | AA | AA | AA |
| | | | Insulating Pattern Part | 50 to 90 | 5 | 83.9 | | | | |
| Example 2-12 | X + Y Electrode | | | | | | 32.2 at max | A | AA | AA | size range of circles and for a distance between nearest circles shown in Table 3. In this case, a difference in the sum of the coverage factors of conductive material portion determined in Example 2-12 was 32.2 at a maximum.

As seen from Table 3, considerably satisfactory result was obtained relating to moire, interfering light and glare, and substantially satisfactory result was obtained relating to invisibility in Example 2-10 (transparent conductive element 1 alone), Example 2-11 (transparent conductive element 2 alone), and Example 2-12 (information input device 10 of the structure of FIG. 1 using Examples 2-10 and 2-11).

In the case of Ag nanowire films, when the transparent electrode pattern parts 13 and 23 were subjected to random patterning treatment, the reflection L value of the conductive parts was reduced due to the reduced area covered with Ag nanowires. As a result, black representation on a screen corresponding to the conductive parts was made deeper to produce an effect in that the display characteristics of a display were enhanced compared to the use of a linear pattern or a diamond pattern.

Example 3-1

As shown in FIG. 48A, pattern exposure was performed such that a random pattern was not formed in an electrode region, and a groove pattern was formed as a random pattern in an insulating region. Parameters used for generation of the random pattern were as follows:

Electrode region . . . no parameters

Insulating region . . . a radius range of from 25 μm to 45 μm, and a line width of the groove pattern of 8 μm Example 3-2

As shown in FIG. 48B, pattern exposure was performed such that a porous pattern was formed as a random pattern in an electrode region, and a groove pattern was formed as a random pattern in an insulating region. Parameters used for generation of the random pattern were as follows:

Electrode region . . . a radius range of from 35 μm to 48 μm, and a radius reduction of 18.5 μm Insulating region . . . same parameters as those of Example 3-1

Example 3-3

As shown in FIG. 48C, pattern exposure was performed such that a strip pattern was formed as a random pattern in an electrode region, and a groove pattern was formed as a random pattern in an insulating region. Parameters used for generation of the random pattern were as follows:

Electrode region . . . a radius range of from 25 μm to 45 μm, and a line width of the strip pattern of 30 μm Insulating region . . . same parameters as those of Example 3-1

Comparative Example 3-1

A random pattern was not formed both in an electrode region and an insulating region.

Pattern exposure was performed to satisfy this condition, and then a resist layer was developed to form a resist pattern. Then, using the resist pattern as a mask, a silver nanowire layer was wet etched. After the etching, the resist layer was removed by ashing process.

As a result, a transparent electrode element was obtained including the electrode region and the insulating region having parameters for respective coverage factors determined by a transparent conductive layer.

<Evaluation>

The transparent electrode elements obtained in Examples 3-1 to 3-3 and Comparative Example were each evaluated by visual observation in terms of the invisibility of their patterns of the electrode regions and the insulating regions, moire and interfering light, and glare. Results obtained therefrom are shown in Table 4 together with parameters for their coverage factors determined by transparent conductive layers. Respective criteria for evaluation of items are given below.

[Invisibility]

Invisibility was evaluated in the same manner as in Examples 1-1 to 1-8, and Comparative Examples 1-1 and 1-2 described above.

[Moire and Interfering Light]

Moire and interfering light were evaluated in the same manner as in Examples 1-1 to 1-8, and Comparative Examples 1-1 and 1-2 described above.

[Glare]

Glare was evaluated in the same manner as in Examples 1-1 to 1-8, and Comparative Examples 1-1 and 1-2 described above.

electrode and insulating regions. In particular, it was also confirmed that, as a result of provision of a random pattern in the transparent conductive layer in the electrode region as in Examples 3-2 and 3-3, a difference in coverage factor of the transparent conductive layer between the electrode and insulating regions is kept low, thereby achieving more favorable invisibility of patterns than that achieved in Example 3-1.

Further, the coverage factor of the transparent conductive layer composed of a silver nanowire layer was kept low in the electrode regions of Examples 3-2 and 3-3, so that a reflection L value determined by diffused reflection of extraneous light occurring at silver nanowire surfaces was reduced. As a result, it was confirmed that, in a structure where a transparent electrode element was arranged on a display surface of a display panel, use of the transparent electrode elements of Examples 3-2 and 3-3 achieves the effect of making black representation on a display screen deeper than that observed in the use of a linear pattern or a diamond pattern in the electrode region. This also achieved the effect of enhancing display characteristics in a display device with a display surface on which a touch panel using the transparent electrode element is provided.

As an additional Example, treatment was also performed to dip the silver nanowire layers (transparent conductive layers) with random patterns obtained in Examples 3-1 to 3-3 in a solution in which a colored compound dissolved, and make the colored compound adsorb on silver nanowire surfaces. It was confirmed that this treatment reduces a reflection L value further both in an electrode region and an insulating region composed of each of the silver nanowire layers (transparent conductive layers) of Examples 3-1 to 3-3. As a result, it was confirmed that, by using a transparent conductive layer with metallic nanowires by which a colored component is allowed to be adsorbed, and using a transparent electrode element as a touch panel formed by providing a random pattern to the transparent conductive layer, the display characteristics of a display panel can be maintained while the touch panel is provided on a display surface.

(Method of Evaluating Average Boundary Length)

In Examples and Comparative Examples, an average boundary length La of a transparent electrode pattern part was determined as follows. First, the transparent electrode pattern part was observed with a digital microscope (trade name: VHX-900, available from KEYENCE CORPORATION) in a magnification range of from 100× to 500×, and an observed image was stored. Next, image analysis was performed on the stored observed image to measure a boundary, thereby

TABLE 4

| | Coverage Factor of Transparent Conductive Film [%] | | | | Moire and | |
|---|---|---|---|---|---|---|
| | Electrode Region | Insulating Region | Difference in Coverage Factor | Invisibility of Pattern | Interfering Light | Glare |
| Example 3-1 | 100.0 | 74.9 | 25.1 | AA | AA | AA |
| Example 3-2 | 74.9 | 74.9 | 0.0 | AA | AA | AA |
| Example 3-3 | 73.0 | 74.9 | 1.9 | AA | AA | AA |
| Comparative Example 3-1 | 100.0 | 0.0 | 100.0 | B | AA | AA |

As seen from the results shown in Table 4, it was confirmed that, as a result of provision of the transparent conductive layer in the insulating region as in Examples 3-1 to 3-3, favorable invisibility of a pattern can be achieved both in the obtaining a boundary length $L_1$ [mm/mm$^2$]. This measurement was performed on 10 fields of view selected at random from the transparent electrode pattern part, thereby obtaining boundary lengths $L_1, \ldots, L_{10}$. Then, the resultant boundary lengths $L_1, \ldots, L_{10}$ were simply averaged (arithmetically averaged) to determine the average boundary length La of the transparent electrode pattern part.

An average boundary length Lb of a transparent insulating pattern part was determined as follows. First, the transparent insulating pattern part was observed with a digital microscope (trade name: VHX-900, available from KEYENCE CORPORATION) in a magnification range of from 100× to 500×, and an observed image was stored. Next, image analysis was performed on the stored observed image to measure a boundary, thereby obtaining a boundary length $L_1$ [mm/mm$^2$]. This measurement was performed on 10 fields of view selected at random from the transparent insulating pattern part, thereby obtaining boundary lengths $L_1, \ldots, L_{10}$. Then, the resultant boundary lengths $L_1, \ldots, L_{10}$ were simply averaged (arithmetically averaged) to determine the average boundary length Lb of the transparent insulating pattern part.

(Ratio in Average Boundary Length)

In Examples and Comparative Examples, a ratio in average boundary length was obtained by substituting the average boundary lengths La and Lb described in "Method of Evaluating Average Boundary Length" above into the following formula:

Ratio in average boundary length=(average boundary length $La$)/(average boundary length $Lb$)

Examples 4-1 to 4-5

A transparent conductive film was obtained in the same manner as in Examples 1-1 to 1-8, and Comparative Examples 1-1 and 1-2 except that plural pore portions and plural island portions having parameters shown in Table 5 were formed randomly.

tern part of the transparent conductive film, thereby determining the average reflection L value of the transparent insulating pattern part.

(Absolute Value of Difference in Reflection L Value)

The absolute value of a difference in reflection L value was obtained by substituting the reflection L values described in "Evaluation of Reflection L Value" above into the following formula:

Absolute value of difference in reflection $L$ value=|(reflection $L$ value of transparent electrode pattern part)−(reflection $L$ value of transparent insulating pattern part)|

(Invisibility)

Invisibility was evaluated in the same manner as in Examples 1-1 to 1-8, and Comparative Examples 1-1 and 1-2 described above.

(Moire and Interfering Light)

Moire and interfering light were evaluated in the same manner as in Examples 1-1 to 1-8, and Comparative Examples 1-1 and 1-2 described above.

(Glare)

Glare was evaluated in the same manner as in Examples 1-1 to 1-8, and Comparative Examples 1-1 and 1-2 described above.

(Shape Except Circle)

Even if graphic objects created in the circles of the random pattern generated in each Example were changed from a circle to different shape, the same results of evaluation as that of the case of a circle were achieved as long as a difference in coverage factor between a transparent electrode pattern part and a transparent insulating pattern part and a ratio in average boundary length were set to be the same as those of the case of a circle.

TABLE 5

| | Electrode | Conductive Material | Region | Size Range of Circle [μm] | Distance Between Nearest Circles [μm] | Coverage Factor of Conductive Material (%) | Difference in Coverage Factor (%) | Average Boundary Length (Mm/Mm$^2$) | Ratio in Average Boundary Length |
|---|---|---|---|---|---|---|---|---|---|
| Example 4-1 | X Electrode | ITO | Conductive Part | 30 to 82 | 22 | 57.73 | 15.46 | 30.41 | 1 |
| | | | Non-Conductive Part | 30 to 82 | 22 | 42.27 | | 30.41 | |
| Example 4-2 | X Electrode | ITO | Conductive Part | 10 to 70 | 40 | 79.19 | 15.74 | 19.7 | 0.53085422 |
| | | | Non-Conductive Part | 40 to 100 | 10 | 63.45 | | 37.11 | |
| Example 4-3 | X Electrode | ITO | Conductive Part | 20 to 50 | 20 | 66.89 | 17.11 | 37.76 | 1.3428165 |
| | | | Non-Conductive Part | 50 to 92 | 20 | 49.78 | | 28.12 | |
| Example 4-4 | X Electrode | ITO | Conductive Part | 10 to 50 | 30 | 79.24 | 15.13 | 26.47 | 0.76547137 |
| | | | Non-Conductive Part | 50 to 100 | 10 | 64.11 | | 34.58 | |
| Example 4-5 | X Electrode | ITO | Conductive Part | 10 to 48 | 27 | 77.87 | 15.29 | 29.5 | 0.99966113 |
| | | | Non-Conductive Part | 70 to 100 | 12 | 62.58 | | 29.51 | |

(Evaluation of Reflection L Value)

While black tape was affixed to the transparent conductive film on a side on which a transparent electrode pattern part and a transparent insulating pattern part were formed, measurement was performed on a side opposite to the side to which the black tape was affixed in accordance with JIS Z8722 using Color i5, available from X-Rite, Inc. This measurement was performed at five places selected at random from the transparent electrode pattern part of the transparent conductive film, and measured values were simply averaged (arithmetically averaged) to determine the average reflection L value of the transparent electrode pattern part. The same measurement was performed on transparent insulating pat-

TABLE 6

| | Reflection L Value | Absolute Value of Difference in Reflection L Value | Invisibility | Moire and Interfering Light | Glare |
|---|---|---|---|---|---|
| Example 4-1 | 6.3 | 0 | AA | AA | AA |
| | 6.3 | | | | |
| Example 4-2 | 5.9 | 0.5 | B | AA | AA |
| | 6.4 | | | | |
| Example 4-3 | 6.5 | 0.3 | B | AA | AA |
| | 6.2 | | | | |

TABLE 6-continued

| | Reflection L Value | Absolute Value of Difference in Reflection L Value | Invisibility | Moire and Interfering Light | Glare |
|---|---|---|---|---|---|
| Example 4-4 | 6.1 6.3 | 0.2 | AA | AA | AA |
| Example 4-5 | 6.2 6.2 | 0 | AA | AA | AA |

The following is understood from Tables 5 and 6.

A pattern can be less visible by setting a ratio in average boundary length in a range of from 0.75 to 1.25. In contrast, the ratio in average boundary length going out of the range of from 0.75 to 1.25 makes visual recognition of a pattern unavoidable, even if a difference in coverage factor does not change. This is, for example, due to the fact that part with a conductive material and part without a conductive material have different indexes of refraction. If there is a large difference in index of refraction between the part with a conductive material and the part without a conductive material, light scattering occurs at a boundary between the part with a conductive material and the part without a conductive material. This makes a region with a longer average boundary length more whitish, so that the absolute value of a difference in reflection L value between a conductive part and a non-conductive part evaluated in accordance with JIS Z8722 becomes 0.3 or more. This makes visual recognition of a pattern unavoidable regardless of a difference in coverage factor.

As understood from the foregoing, it is preferable that the ratio in average boundary length be in a range of from 0.75 to 1.25 in order to make an electrode pattern less visible.

While the embodiments of the present technique are described in detail above, the present technique is not limited to these embodiments, but various modifications can be devised based on the technical idea of the present technique.

For example, the structures, methods, processes, shapes, materials, and numerical values in the embodiments are disclosed merely as examples, and can be replaced by a different structure, method, process, shape, material, and numerical value, if necessary.

Further, the structures, methods, processes, shapes, materials, and numerical values of the embodiments can be combined with each other without departing from the spirit of the present technique.

In the aforementioned embodiments, a base surface may be exposed, or an intermediate layer (such as a hard coat layer, an optical controlling layer, and an adhesion assisting layer) formed on the base surface may be exposed in a region where a conductive material formed by patterning does not exist. Further, if a transparent conductive layer is made of a conductive material and a binder material, the binder material may stay in the transparent conductive layer.

In the aforementioned embodiments, both X electrode pattern parts and Y electrode pattern parts may be formed on one of a first surface and a second surface of a single base. In this case, it is preferable that either the X electrode pattern part or the Y electrode pattern part be electrically connected through an intermediary electrode at intersections between the X and Y electrode pattern parts. A conventionally and publicly known structure such as that disclosed in Japanese Patent Application Laid-Open No. 2008-310550 is applicable as the structures of such X and Y electrode pattern parts using an intermediary electrode.

(1) The present technique can also be configured as follows:

(1-1) A transparent conductive element, comprising
a base having a surface, and
a transparent conductive part and a transparent insulating part alternately arranged on the above-described surface,
the above-described transparent conductive part being a transparent conductive layer with plural pore portions randomly arranged,
the above-described transparent insulating part being a transparent conductive layer composed of plural island portions randomly arranged,
a boundary between the transparent conductive part and the transparent insulating part having a random shape.

(1-2) The transparent conductive element according to (1-1), wherein a ratio in average boundary length (L1/L2) between an average boundary length L1 of the above-described transparent conductive part and an average boundary length L2 of the above-described transparent insulating part is in a range of from 0.75 to 1.25.

(1-3) The transparent conductive element according to (1-1) or (1-2), wherein the absolute value of a difference in reflection L value between the above-described transparent conductive part and the above-described transparent insulating part is less than 0.3.

(1-4) The transparent conductive element according to any one of (1-1) to (1-3), wherein the above-described pore portions and the above-described island portions have a dot shape.

(1-5) The transparent conductive element according to (1-4), wherein the above-described dot shape is of at least one type selected from the group consisting of a circular shape, an oval shape, a shape formed by partially cutting off a circular shape, a shape formed by partially cutting off an oval shape, a polygonal shape, a polygonal shape with rounded off corners, and an indefinite shape.

(1-6) The transparent conductive element according to any one of (1-1) to (1-3), wherein a conductive portion between the above-described pore portions and a void portion between the above-described island portions have a mesh shape.

(1-7) The transparent conductive element according to any one of (1-1) to (1-3), wherein the above-described pore portions have a dot shape, and a void portion between the above-described island portions has a mesh shape.

(1-8) The transparent conductive element according to any one of (1-1) to (1-3), wherein a conductive portion between the above-described pore portions has a mesh shape, and the above-described island portions have a dot shape.

(1-9) The transparent conductive element according to any one of (1-1) to (1-8), wherein the above-described transparent conductive part and the above-described transparent insulating part have random patterns different from each other.

(1-10) The transparent conductive element according to any one of (1-1) to (1-9), wherein plural inverting portions are randomly formed at a boundary between the above-described transparent conductive part and the above-described transparent insulating part, the inverting portions including the pore portions and the island portions taking the place of the pore portions at the boundary.

(1-11) The transparent conductive element according to any one of (1-1) to (1-10), wherein the coverage factor of the above-described transparent conductive layer in the above-described transparent conductive part and the above-described transparent insulating part is from 65% to 100%.

(1-12) The transparent conductive element according to any one of (1-1) to (1-11), further comprising a transparent conductive part and a transparent insulating part alternately arranged on a rear surface opposite to the above-described surface, wherein a difference in the sum of the coverage factor of the transparent conductive layer on the above-described surface and that of a transparent conductive layer on the above-described rear surface is in a range of from 0% to 60%.

(1-13) The transparent conductive element according to any one of (1-1) to (1-12), wherein the above-described transparent conductive part includes plural regions, and when the widths and the lengths of the above-described regions are W and L respectively, the coverage factor of the above-described transparent conductive layer is set to be larger in a region with a greater ratio (L/W).

(1-14) The transparent conductive element according to any one of (1-1) to (1-13), wherein the above-described transparent conductive part is a transparent electrode pattern part.

(1-15) A transparent conductive element, comprising
a base having a first surface and a second surface, and
a transparent electrode pattern part and a transparent insulating pattern part formed on at least one of the above-described first surface and the above-described second surface,
the above-described transparent electrode pattern part and the above-described transparent insulating pattern part being laid alternately on at least one of the above-described first surface and the above-described second surface,
the above-described transparent electrode pattern part being a transparent conductive layer with plural pore portions being randomly formed apart,
the above-described transparent insulating pattern part being a transparent conductive layer composed of plural island portions being randomly formed apart,
a boundary between the above-described transparent electrode pattern part and the above-described transparent insulating pattern part having a random shape.

(1-16) An input device, comprising
a first transparent conductive element, and
a second transparent conductive element provided on a surface of the above-described first transparent conductive element,
at least one of the above-described first transparent conductive element and the above-described transparent second transparent conductive element including
a base having a surface, and
a transparent conductive part and a transparent insulating part alternately arranged on the above-described surface,
the above-described transparent conductive part being a transparent conductive layer with plural pore portions randomly arranged,
the above-described transparent insulating part being a transparent conductive layer composed of plural island portions randomly arranged,
a boundary between the above-described transparent conductive part and the above-described transparent insulating part having a random shape.

(1-17) An electronic device, comprising a transparent conductive element,
the above-described transparent conductive element including
a base having a surface, and
a transparent conductive part and a transparent insulating part alternately arranged on the above-described surface,
the above-described transparent conductive part being a transparent conductive layer with plural pore portions randomly arranged,
the above-described transparent insulating part being a transparent conductive layer composed of plural island portions randomly arranged,
a boundary between the above-described transparent conductive part and the above-described transparent insulating part having a random shape.

(1-18) A master for fabrication of a transparent conductive element, the master comprising a surface in which a transparent conductive part forming region and a transparent insulating part forming region are alternately arranged,
plural pore portions in the shape of recesses being randomly arranged in the above-described transparent conductive part forming region,
plural island portions in the shape of projections being randomly arranged in the above-described transparent insulating part forming region,
a boundary between the above-described transparent conductive part forming region and the above-described transparent insulating part forming region having a random shape.

(2) The present technique can also be configured as follows:

(2-1) A transparent conductive element, comprising
a base having a first surface and a second surface, and
a transparent electrode pattern part and a transparent insulating pattern part formed on at least one of the above-described first surface and the above-described second surface,
the above-described transparent electrode pattern part and the above-described transparent insulating pattern part being laid alternately on at least one of the above-described first surface and the above-described second surface,
plural pore portions being randomly formed apart in the above-described transparent electrode pattern part,
plural island portions being randomly arranged apart in the above-described transparent insulating pattern part.

(2-2) The transparent conductive element according to (2-1), wherein
the above-described transparent electrode pattern part is a transparent conductive layer with plural pore portions randomly formed apart, and
the above-described transparent insulating pattern part is a transparent conductive layer composed of plural island portions randomly arranged.

(2-3) The transparent conductive element according to (2-1) or (2-2), wherein a boundary between the above-described transparent electrode pattern part and the above-described transparent insulating pattern part has a random shape.

(2-4) The transparent conductive element according to any one of (2-1) to (2-3), wherein plural inverting portions is randomly arranged to be isolated at a boundary between the above-described transparent electrode pattern part and the above-described transparent insulating pattern part, the inverting portions including the pore portions and the island portions taking the place of the pore portions at the boundary.

(2-5) The transparent conductive element according to any one of (2-1) to (2-4), wherein the above-described pore portions and the island portions have a shape of at least one type selected from the group consisting of a circular shape, an oval shape, a shape formed by partially cutting off a circular shape, a shape formed by partially cutting off an oval shape, a polygonal shape, a polygonal shape with rounded off corners, and an indefinite shape.

(2-6) An information input device, comprising
a first transparent conductive element, and
a second transparent conductive element provided on a surface of the above-described first transparent conductive element, at least one of the above-described first transparent conductive element and the above-described second transparent conductive element including a base having a surface, and a transparent electrode pattern part and a transparent insulating pattern part formed on the above-described surface, the above-described transparent electrode pattern part and the above-described transparent insulating pattern part being laid alternately on the surface of the above-described base, the above-described transparent electrode pattern part being with plural pore portions randomly formed apart and, the above-described transparent insulating pattern part being with plural island portions randomly, apart from each other, formed.

(2-7) An information input device, comprising a transparent conductive element, the above-described transparent conductive element including a base having a first surface and a second surface, and transparent electrode pattern parts and transparent insulating pattern parts formed on the above-described first surface and the above-described second surface, the above-described transparent electrode pattern parts and the above-described transparent insulating pattern parts being laid alternately on the above-described first surface and the above-described second surface, plural pore portions being randomly arranged apart in the above-described transparent electrode pattern parts, plural island portions being randomly formed apart in the transparent insulating pattern parts.

(2-8) A master for fabrication of a transparent conductive element, the master comprising a surface in which a transparent electrode pattern part forming region and a transparent insulating pattern part forming region are laid alternately, plural pore portions in the shape of recesses being randomly formed apart in the above-described transparent electrode pattern part forming regions, plural island portions in the shape of projections being randomly formed apart in the above-described transparent insulating pattern part forming regions.

(2-9) A method of manufacturing a transparent conductive element, comprising a step of printing a conductive coating material on a surface of a base, and a step of forming a transparent electrode pattern part and a transparent insulating pattern part on the surface of the above-described base by drying and/or heating the above-described conductive coating material, the above-described transparent electrode pattern part and the above-described transparent insulating pattern part being laid alternately on the surface of the above-described base, plural pore portions being randomly formed apart in the above-described transparent electrode pattern parts, plural island portions being randomly formed apart in the transparent insulating pattern parts.

(2-10) The method of manufacturing a transparent conductive element according to (2-9), wherein in the above-described printing step, a conductive coating material is applied on a surface of a master for fabrication of a transparent conductive element, and the applied transparent conductive coating material is printed on the surface of the base, the above-described master for fabrication of a transparent conductive element has a surface in which a transparent electrode pattern part forming region and a transparent insulating pattern part forming region are laid alternately, plural pore portions in the shape of recesses is randomly formed apart in the above-described transparent electrode pattern part, and plural island portions in the shape of projections is randomly formed apart in the above-described transparent insulating pattern part.

(2-11) A method of manufacturing a transparent conductive element, comprising a step of forming a resist pattern on a surface of a transparent conductive layer provided on a surface of a base, and a step of forming a transparent electrode pattern part and a transparent insulating pattern part on the surface of the above-described base by etching the above-described transparent conductive layer using the above-described resist pattern as a mask, the above-described transparent electrode pattern part and the above-described transparent insulating pattern part being laid alternately on the surface of the above-described base, plural pore portions being randomly formed apart in the above-described transparent electrode pattern parts, plural island portions being randomly formed apart in the above-described transparent insulating pattern parts.

(3) The present technique can also be configured as follows:

(3-1) A transparent conductive element, comprising a base, and a transparent electrode pattern part and a transparent insulating pattern part formed on a surface of the above-described base so as to be laid alternately toward a predetermined direction, the above-described transparent electrode pattern part and the transparent insulating pattern part including at least respective conductive material portions, the above-described conductive portions being formed of different patterns.

(3-2) The transparent conductive element according to (3-1), wherein a random pattern of the above-described conductive material portion and a non-conductive portion differs between the above-described transparent electrode pattern part and the above-described transparent insulating pattern part.

(3-3) The transparent conductive element according to (3-1) or (3-2), wherein in the above-described transparent electrode pattern part, the plural above-described non-conductive portions are randomly formed to be isolated within a forming surface of the above-described conductive material portion, in the above-described transparent insulating pattern part, the above-described conductive material portions are randomly formed to be isolated within a forming surface of the above-described non-conductive portion, and a pattern formed at a boundary between the above-described conductive material portion and the above-described non-conductive portion is a random pattern differing between the above-described transparent electrode pattern part and the above-described transparent insulating pattern part.

(3-4) The transparent conductive element according to (3-2) or (3-3), wherein the different random patterns of the above-described transparent electrode pattern part and the above-described transparent insulating pattern part are formed by arranging the above-described conductive material portion and the above-described non-conductive portion based on random patterns generated under different conditions of generation.

(3-5) The transparent conductive element according to any one of (3-1) or (3-4), wherein the coverage factor of the above-described conductive material portion in the above-described transparent electrode pattern part and the transparent insulating pattern part is from 65% to 100%.

(3-6) The transparent conductive element according to any one of (3-1) or (3-5), wherein the above-described transparent electrode pattern part is composed of plural regions having different coverage factors of the above-described conductive material portion.

(3-7) An input device, comprising
a first transparent conductive element including a transparent electrode pattern part and a transparent insulating pattern part formed on a base surface so as to be laid alternately toward a predetermined direction, and
a second transparent conductive element including a transparent electrode pattern part and a transparent insulating pattern part formed on a base surface so as to be laid alternately toward a direction perpendicular to the above-described predetermined direction, the second transparent conductive element being arranged in such a position relative to the above-described first transparent conductive element that the second transparent conductive element overlaps the first transparent conductive element as seen from the direction of an input surface,
described transparent insulating pattern part in each of the above-described first and second transparent conductive elements including at least respective conductive material portions, the above-described conductive material portions being formed of different patterns.

(3-8) The input device according to (3-7), wherein in each of the above-described first and second transparent conductive elements, a random pattern of the above-described conductive material portion and a non-conductive portion differs between the above-described transparent electrode pattern part and the above-described transparent insulating pattern part.

(3-9) The input device according to (3-7) or (3-8), wherein, while the above-described first transparent conductive element and the above-described second transparent conductive element overlap with each other, a difference in the sum of the coverage factor of the above-described conductive material portion in the above-described first transparent conductive element and that of the conductive material portion in the above-described second transparent conductive element is in a range of from 0 to 60 among all regions as seen from the direction of the input surface.

(4) The present technique can also be configured as follows:

(4-1) A transparent electrode element, comprising:
a base;
a transparent conductive film provided on the aforementioned base;
an electrode region formed by using the aforementioned transparent conductive film; and
an insulating region adjacent to the aforementioned electrode region, the insulating region being a region where the aforementioned transparent conductive film is divided into independent island shapes by groove patterns extending in random directions.

(4-2) The transparent electrode element according to (4-1), wherein the aforementioned transparent conductive film extending over the aforementioned electrode region and the aforementioned insulating region is randomly arranged at a boundary between the aforementioned electrode and insulating regions.

(4-3) The transparent electrode element according to (4-1) or (4-2), wherein all the aforementioned groove patterns provided in the aforementioned insulating region have the same line width.

(4-4) The transparent electrode element according to any one of (4-1) to (4-3), wherein the aforementioned transparent conductive film forming the aforementioned electrode region is provided with plural pore patterns randomly arranged.

(4-5) The transparent electrode element according to (4-4), wherein plural strip patterns composed of the aforementioned transparent conductive film is arranged in the aforementioned electrode region so as to extend in random directions, and the aforementioned pore patterns are divided by the aforementioned strip patterns.

(4-6) The transparent electrode element according to any one of (4-1) to (4-5), wherein the aforementioned base is made of a conductive material.

(4-7) An information input device, comprising:
a base;
a transparent conductive film provided on the aforementioned base;
plural electrode regions formed by using the aforementioned transparent conductive film; and
an insulating region adjacent to the aforementioned plural electrode regions, the insulating region being a region where the aforementioned transparent conductive film is divided into independent island shapes by groove patterns extending in random directions.

(4-8) An electronic device, comprising:
a display panel;
a transparent conductive film provided on a display surface of the aforementioned display panel;
plural electrode regions formed by using the aforementioned transparent conductive film; and
an insulating region adjacent to the aforementioned plural electrode regions, the insulating region being a region where the aforementioned transparent conductive film is divided into independent island shapes by groove patterns extending in random directions.

(5) The present technique can also be configured as follows:

(5-1) A transparent conductive element, comprising
a base having a surface, and
a transparent conductive part and a transparent insulating part alternately arranged on the above-described surface,
the above-described transparent insulating part being a transparent conductive layer composed of plural island portions randomly arranged,
a boundary between the above-described transparent conductive part and the above-described transparent insulating part having a random shape.

(5-2) The transparent conductive element according to (5-1), wherein the absolute value of a difference in reflection L value between the above-described transparent conductive part and the above-described transparent insulating part is less than 0.3.

(5-3) The transparent conductive element according to (5-1) or (5-2), wherein the above-described island portions have a dot shape.

(5-4) The transparent conductive element according to (5-3), wherein the above-described dot shape is of at least one type selected from the group consisting of a circular shape, an oval shape, a shape formed by partially cutting off a circular shape, a shape formed by partially cutting off an oval shape, a polygonal shape, a polygonal shape with rounded off corners, and an indefinite shape.

(5-5) The transparent conductive element according to (5-1) or (5-2), wherein a void portion between the above-described island portions has a mesh shape.

(5-6) The transparent conductive element according to any one of (5-1) to (5-5), wherein the above-described transparent conductive part is a transparent conductive layer of a uniform thickness extending continuously.

(5-7) The transparent conductive element according to (5-6), wherein the coverage factor of the above-described transparent conductive layer in the above-described transparent conductive part and the transparent insulating part is from 65% to 100%.

(5-8) The transparent conductive element according to any one of (5-1) to (5-7), further comprising a transparent conductive part and a transparent insulating part alternately arranged on a rear surface opposite to the above-described surface, wherein a difference in the sum of the coverage factor of the transparent conductive layer on the above-described surface and that of a transparent conductive layer on the above-described rear surface is in a range of from 0% to 60%.

(5-9) The transparent conductive element according to any one of (5-1) to (5-9), wherein the above-described transparent conductive part is a transparent electrode pattern part.

(5-10) A transparent conductive element, comprising
a base having a first surface and a second surface, and
a transparent electrode pattern part and a transparent insulating pattern part formed on at least one of the above-described first surface and the above-described second surface,
the above-described transparent electrode pattern part and the above-described transparent insulating pattern part being laid alternately on at least one of the above-described first surface and the above-described second surface,
the above-described transparent insulating pattern part being a transparent conductive layer composed of plural island portions randomly formed apart and,
a boundary between the above-described transparent electrode pattern part and the above-described transparent insulating pattern part having a random shape.

(5-11) An input device, comprising
a first transparent conductive element, and
a second transparent conductive element provided on a surface of the above-described first transparent conductive element,
at least one of the above-described first transparent conductive element and the above-described second transparent conductive element including
a base having a surface, and
a transparent conductive part and a transparent insulating part alternately arranged on the above-described surface,
the above-described transparent insulating part being a transparent conductive layer composed of a plural island portions randomly arranged,
a boundary between the above-described transparent conductive part and the above-described transparent insulating part having a random shape.

(5-12) An electronic device, comprising a transparent conductive element,
the above-described transparent conductive element including
a base having a surface, and
a transparent conductive part and a transparent insulating part alternately arranged on the above-described surface,
the above-described transparent insulating part being a transparent conductive
the above-described transparent insulating part being a transparent conductive layer composed of plural island portions randomly arranged,
a boundary between the above-described transparent conductive part and the above-described transparent insulating part having a random shape.

(5-13) A master for fabrication of a transparent conductive element, the master comprising a surface in which a transparent conductive part forming region and a transparent insulating part forming region are alternately arranged,
plural island portions in the shape of projections being randomly arranged in the above-described transparent insulating part forming region,
a boundary between the above-described transparent conductive part forming region and the above-described transparent insulating part forming region having a random shape.

(5-14) The master for fabrication of a transparent conductive element according to (5-13), wherein a projecting flat surface of a uniform height is provided in the transparent conductive part forming region.

REFERENCE SIGNS LIST 1 first transparent conductive element
2 second transparent conductive element
3 optical layer
4 display device
5, 32 bonding layer
11, 21, 31 base
12, 22 transparent conductive layer
13, 23 transparent electrode pattern part
14, 24 transparent insulating pattern part
13a, 23a pore portion
13b, 23b conductive portion
14a, 24a island portion
14b, 24b void portion
15 inverting portion
41 resist layer
33 opening portion
$L_1$, $L_2$ boundary
$R_1$ first region
$R_2$ second region

The invention claimed is:
1. A transparent conductive element, comprising:
a base having a surface; and
a transparent conductive part and a transparent insulating part alternately arranged on the surface,
the transparent conductive part being a transparent conductive layer having the shape of a solidly coated film,
the transparent insulating part being a transparent conductive layer composed of plural island portions randomly arranged,
a boundary between the transparent conductive part and the transparent insulating part having a random shape.

2. The transparent conductive element according to claim 1, wherein a ratio in average boundary length (L1/L2) between an average boundary length L1 of the transparent conductive part and an average boundary length L2 of the transparent insulating part is in a range of from 0.75 to 1.25.

3. The transparent conductive element according to claim 1, wherein an absolute value of a difference in reflection L value between the transparent conductive part and the transparent insulating part is less than 0.3.

4. The transparent conductive element according to claim 1, wherein the island portions have a dot shape.

5. The transparent conductive element according to claim 1, wherein the dot shape is of at least one type selected from the group consisting of a circular shape, an oval shape, a shape formed by partially cutting off a circular shape, a shape formed by partially cutting off an oval shape, a polygonal shape, a polygonal shape with rounded off corners, and an indefinite shape.

6. The transparent conductive element according to claim 1, wherein a void portion between the island portions have a mesh shape.

7. The transparent conductive element according to claim 1, wherein a coverage factor of the transparent insulating part is 65% or more and 100% or less.

8. The transparent conductive element according to claim 1, wherein the transparent conductive layer of each of the transparent conductive part and the transparent insulating part contains metallic nanowires.

9. An input device, comprising:
a first transparent conductive element; and
a second transparent conductive element provided on a surface of the first transparent conductive element,
at least one of the first transparent conductive element and the second transparent conductive element including
a base having a surface, and
a transparent conductive part and a transparent insulating part alternately arranged on the surface,
the transparent conductive part being a transparent conductive layer having the shape of a solidly coated film,
the transparent insulating part being a transparent conductive layer composed of plural island portions randomly formed,
a boundary between the transparent conductive part and the transparent insulating part having a random shape.

10. An electronic device, comprising a transparent conductive element,
the transparent conductive element including
a base having a surface, and
a transparent conductive part and a transparent insulating part alternately arranged on the surface,
the transparent conductive part being a transparent conductive layer having the shape of a solidly coated film,
the transparent insulating part being a transparent conductive layer composed of plural island portions randomly formed,
a boundary between the transparent conductive part and the transparent insulating part having a random shape.

11. A master of fabrication for a transparent conductive element, the master comprising a surface in which a transparent conductive part forming region and a transparent insulating part forming region are alternately arranged,
a concavity for forming the transparent conductive layer having the shape of a solidly coated film being provided in the transparent conductive part forming region,
plural island portions in the shape of projections being randomly arranged in the transparent insulating part forming region,
a boundary between the transparent conductive part forming region and the transparent insulating part forming region having a random shape.

12. A transparent conductive element, comprising:
a base having a surface; and
a transparent conductive part and a transparent insulating part alternately arranged on the surface,
the transparent conductive part being a transparent conductive layer which contains metallic nanowires and has plural pore portions randomly arranged,
the transparent insulating part being a transparent conductive layer which contains metallic nanowires and is composed of plural island portions randomly arranged,
a boundary between the transparent conductive part and the transparent insulating part having a random shape.

13. The transparent conductive element according to claim 12, wherein a ratio in average boundary length (L1/L2) between an average boundary length L1 of the transparent conductive part and an average boundary length L2 of the transparent insulating part is in a range of from 0.75 to 1.25.

14. The transparent conductive element according to claim 12, wherein an absolute value of a difference in reflection L value between the transparent conductive part and the transparent insulating part is less than 0.3.

15. A transparent conductive element according to claim 12, wherein the pore portions and the island portions have a dot shape.

16. The transparent conductive element according to claim 12, wherein the dot shape is of at least one type selected from the group consisting of a circular shape, an oval shape, a shape formed by partially cutting off a circular shape, a shape formed by partially cutting off an oval shape, a polygonal shape, a polygonal shape with rounded off corners, and an indefinite shape.

17. The transparent conductive element according to claim 12, wherein a conductive portion between the pore portions and a void portion between the island portions have a mesh shape.

18. The transparent conductive element according to claim 12, wherein the pore portions have a dot shape, and a void portion between the island portions has a mesh shape.

19. The transparent conductive element according to claim 12, wherein a conductive portion between the pore portions has a mesh shape, and the island portions have a dot shape.

20. The transparent conductive element according to claim 12, wherein the transparent conductive part and the transparent insulating part have respective random patterns different from each other.

21. The transparent conductive element according to claim 12, wherein a plurality of inverting portions is randomly formed at a boundary between the transparent conductive part and the transparent insulating part, the inverting portions including the pore portions and the island portions taking the place of the pore portions at the boundary.

22. The transparent conductive element according to claim 12, wherein a coverage factor of the transparent conductive layer in the transparent conductive part and the transparent insulating part is 65% or more and 100% or less.

23. The transparent conductive element according to claim 12, further comprising a transparent conductive part and a transparent insulating part alternately arranged on a rear surface opposite to the surface, and wherein
a difference in the sum of a coverage factor of the transparent conductive layer in the surface and that of the transparent conductive layer in the rear surface is in a range of from 0% to 60%.

24. The transparent conductive element according to claim 12, wherein the transparent conductive part include a plurality of regions, and
when widths and lengths of the regions are W and L, respectively, a coverage factor of the transparent conductive layer is set to be larger in a region with a greater ratio of (L/W).

25. The transparent conductive element according to claim 12, wherein the transparent conductive part is a transparent electrode pattern part.

26. A transparent conductive element, comprising:
a base having a first surface and a second surface; and
a transparent electrode pattern part and a transparent insulating pattern part formed on at least one of the first surface and the second surface,
the transparent electrode pattern part and the transparent insulating pattern part being laid alternately on at least one of the first surface and the second surface, the transparent electrode pattern part being a transparent conductive later that contains metallic nanowires and has plural pore portions randomly formed apart, the transparent insulating pattern part being a transparent conductive layer that contains metallic nanowires and is composed of plural island portions randomly formed apart, and a boundary between the transparent electrode pattern part and the transparent insulating pattern part having a random shape.

27. An input device, comprising:

a first transparent conductive element; and a second transparent conductive element provided on a surface of the first transparent conductive element, at least one of the first transparent conductive element and the second transparent conductive element including a base having a surface, and a transparent conductive part and a transparent insulating part alternately arranged on the surface, the transparent conductive part being a transparent conductive later that contains metallic nanowires and has plural pore portions randomly formed, the transparent insulating part being a transparent conductive layer that contains metallic nanowires and is composed of plural island portions randomly formed, and a boundary between the transparent conductive part and the transparent insulating part having a random shape.

28. An electronic device, comprising a transparent conductive element, the transparent conductive element including a base having a surface, and a transparent conductive part and a transparent insulating part alternately arranged on the surface, the transparent conductive part being a transparent conductive layer that contains metallic nanowires and has plural pore portions randomly formed, the transparent insulating part being a transparent conductive layer that contains metallic nanowires and is composed of plural island portions randomly formed, and a boundary between the transparent conductive part and the transparent insulating part having a random shape.

* * * * *